(12) United States Patent
Komori

(10) Patent No.: US 8,049,221 B2
(45) Date of Patent: Nov. 1, 2011

(54) LIQUID CRYSTAL DISPLAY DEVICE

(75) Inventor: Shigeki Komori, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 287 days.

(21) Appl. No.: 12/390,911

(22) Filed: Feb. 23, 2009

(65) Prior Publication Data

US 2009/0212300 A1 Aug. 27, 2009

(30) Foreign Application Priority Data

Feb. 27, 2008 (JP) ................................. 2008-046601

(51) Int. Cl.
*H01L 29/04* (2006.01)
*H01L 31/036* (2006.01)

(52) U.S. Cl. .................... 257/72; 257/79; 257/E21.532; 349/42; 349/46

(58) Field of Classification Search .................... 257/72, 257/79, E21.532, E33.053; 349/42, 43, 46, 349/84, 106, 139
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,132,800 A | 10/2000 | Shimada et al. | |
| 6,485,997 B2 | 11/2002 | Lee et al. | |
| 6,493,048 B1 | 12/2002 | Baek et al. | |
| 6,635,581 B2 | 10/2003 | Wong | |
| 7,223,643 B2 | 5/2007 | Ohnuma et al. | |
| 7,522,226 B2 * | 4/2009 | Park et al. ........................ 349/43 |
| 2001/0049064 A1 | 12/2001 | Lee et al. | |
| 2006/0290867 A1 | 12/2006 | Ahn et al. | |
| 2007/0002249 A1 | 1/2007 | Yoo et al. | |
| 2007/0126969 A1 | 6/2007 | Kimura et al. | |
| 2007/0139571 A1 | 6/2007 | Kimura | |
| 2007/0146591 A1 | 6/2007 | Kimura et al. | |

(Continued)

FOREIGN PATENT DOCUMENTS

JP 64-84669 3/1989

(Continued)

OTHER PUBLICATIONS

Kim, et al., "42.1: A Novel Four-Mask-Count Process Architecture for TFT-LCDs", SID 00 Digest: SID, International Symposium Digest of Technical Papers, 2000, pp. 1006-1009.

(Continued)

*Primary Examiner* — Phuc Dang
(74) *Attorney, Agent, or Firm* — Nixon Peabody LLP; Jeffrey L. Costellia

(57) ABSTRACT

An objective is simplification of a manufacturing method of a liquid crystal display device or the like. In a manufacturing method of a thin film transistor, a stack in which a first conductive film, an insulating film, a semiconductor film, an impurity semiconductor film, and a second conductive film are stacked in this order is formed, and the first conductive film is exposed by first etching and a pattern of the second conductive film is formed by second etching. Further, after thin film transistors are formed, a color filter layer is formed so that unevenness caused by the thin film transistors or the like is relieved; thus, the level difference of the surface where the pixel electrode layer is formed is reduced. Alternatively, a color filter layer is selectively formed utilizing the unevenness caused by thin film transistors or the like.

13 Claims, 41 Drawing Sheets

U.S. PATENT DOCUMENTS

| | | | |
|---|---|---|---|
| 2007/0222936 A1 | 9/2007 | Shih | |
| 2009/0091677 A1* | 4/2009 | Cho et al. | 349/46 |
| 2010/0073612 A1* | 3/2010 | Kim et al. | 349/106 |

FOREIGN PATENT DOCUMENTS

| | | |
|---|---|---|
| JP | 03-011744 | 1/1991 |
| JP | 03-161938 | 7/1991 |
| JP | 04-188770 | 7/1992 |
| JP | 2003-179069 | 6/2003 |
| JP | 2007-133371 | 5/2007 |
| WO | WO 2008-099528 | 8/2008 |

OTHER PUBLICATIONS

International Search Report (Application No. PCT/JP2009/053465; PCT11278) Dated May 26, 2009.

Written Opinion (Application No. PCT/JP2009/053465; PCT11278) Dated May 26, 2009.

* cited by examiner

B — 126 — B'

B — B'

B — B'

108 110 112
100 102 104 106

114

116C 100 102 104 106

FIG. 41A
FIG. 41B
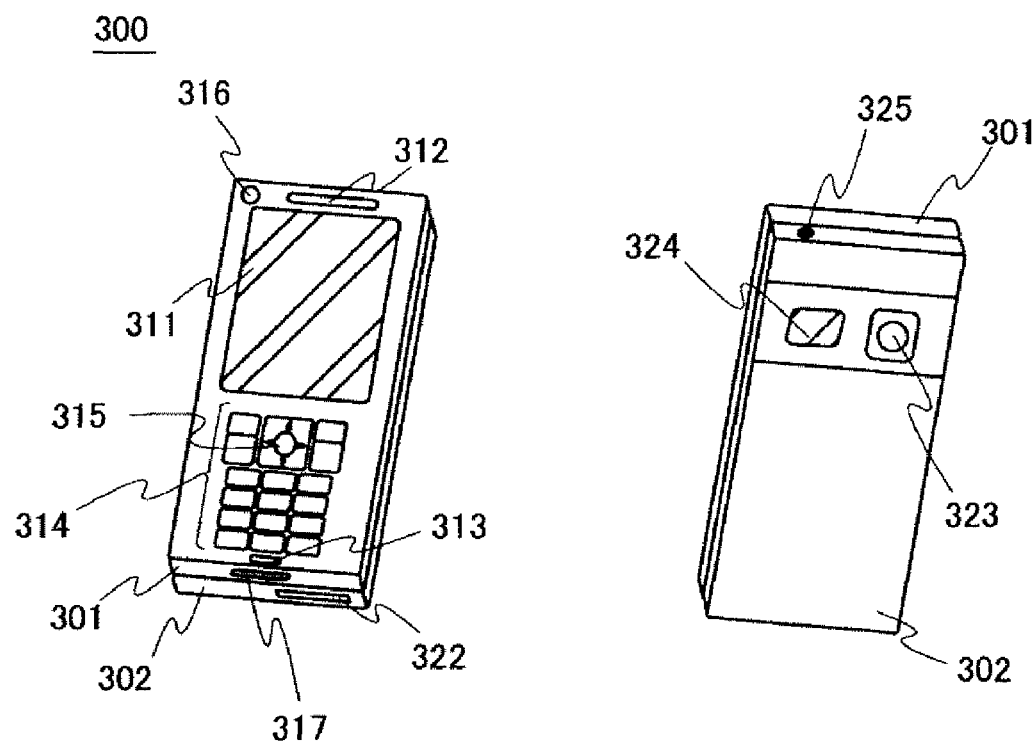
FIG. 41C
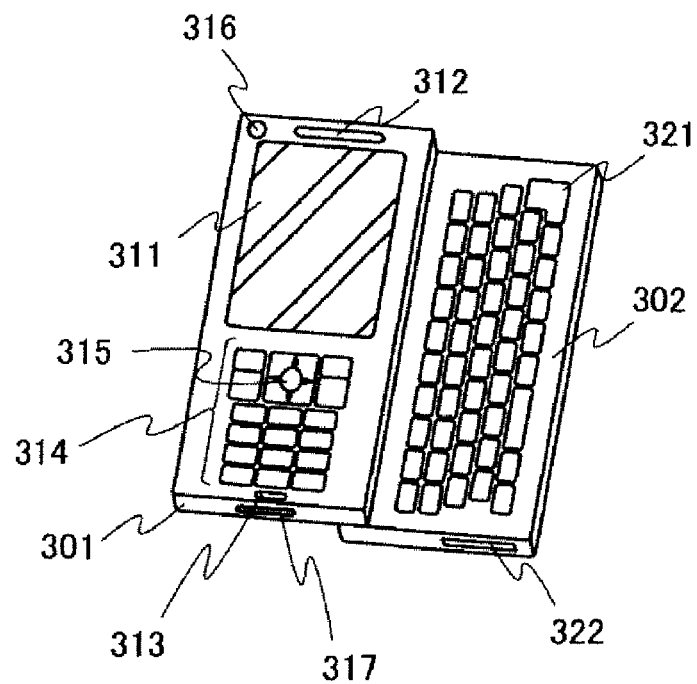

LIQUID CRYSTAL DISPLAY DEVICE

TECHNICAL FIELD

The present invention relates to a liquid crystal display device, a manufacturing method of the liquid crystal display device, and an electronic device using the liquid crystal display device.

BACKGROUND ART

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as integrated circuits (IC) and electro-optical devices. In particular, thin film transistors are urgently developed as switching elements of image display devices typified by liquid crystal display devices, EL (electro luminescence) display devices, and the like. In an active matrix liquid crystal display device, specifically, a voltage is applied between a pixel electrode connected to a switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The application range of the active matrix liquid crystal display devices is expanding, and demands for larger screen size, higher definition, and higher aperture ratio, and the like of such a liquid crystal display device are increasing. In addition, a need exits for low manufacturing cost and high yield with respect to such an active matrix liquid crystal display device as well as high reliability. As a method for increasing productivity and reducing manufacturing cost, simplification of the process can be given.

In an active matrix liquid crystal display device, thin film transistors are mainly used as switching elements. In order to simplify a manufacturing process of thin film transistors, reduction in the number of photomasks used in photolithography is effective. If one photomask is added, for example, the following steps are required: resist application, prebaking, light exposure, development, postbaking, and the like, and moreover other steps before and after the aforementioned steps, such as film formation and etching and further resist removal, cleaning, drying, and the like. The number of steps is significantly increased only by adding one photomask in the manufacturing process. Thus, a process is simplified or complicated depending on the number of photomasks; therefore, many technical developments are made so as to reduce the number of photomasks used in a manufacturing process.

Many conventional techniques for reducing the number of photomasks use a complicated technique such as backside light exposure, resist reflow, or a lift-off method, which requires a special apparatus. There has been a concern that yield is reduced due to various problems caused by usage of such a complicated technique. Moreover, there has often been no option but to sacrifice electrical characteristics of thin film transistors.

As typical means for reducing the number of photomasks in a manufacturing process of a thin film transistor, a technique using a multi-tone mask (called a halftone mask or a gray-tone mask) is widely known. As a technique for reducing the number of manufacturing steps by using a multi-tone mask, Patent Document 1 (Japanese Published Patent Application No. 2003-179069) is, for example, disclosed.

DISCLOSURE OF INVENTION

It is an object to simplify the manufacturing process of a thin film transistor, and thereby simplifying the manufacturing process of a liquid crystal display device. It is another object to provide a manufacturing method of a liquid crystal display device, in which problems caused in the above manufacturing method are solved. It is still another object to provide a manufacturing method of a liquid crystal display device, in which a feature of the above manufacturing method is effectively used.

To accomplish the above objects, in the invention to be disclosed, a stack in which a first conductive film, an insulating film, a semiconductor film, an impurity semiconductor film, and a second conductive film are stacked in this order is formed, and the first conductive film is exposed by first etching and a pattern of the first conductive film is formed by second etching. The first conductive film is side-etched at the time of second etching, which makes it possible to differentiate a pattern (a pattern of the first conductive film) formed by the second etching from a pattern (patterns of the insulating film, the semiconductor film, the impurity semiconductor film, and the second conductive film) formed by first etching. Thus, the number of photomasks is reduced and the process is simplified. Further, after thin film transistors are formed, a color filter layer is formed so that unevenness caused by the thin film transistors or the like is relieved; thus, the level difference of the surface where the pixel electrode layer is formed is reduced. Alternatively, a color filter layer is selectively formed utilizing the unevenness caused by thin film transistors or the like. More specific solutions will be described below.

A manufacturing method of a liquid crystal display device of the invention to be disclosed includes sequentially forming and stacking a first conductive film, a first insulating film, a semiconductor film, an impurity semiconductor film, and a second conductive film; forming a resist mask having a recessed portion over the second conductive film; performing first etching on the first insulating film, the semiconductor film, the impurity semiconductor film, and the second conductive film using the resist mask, thereby exposing at least the first conductive film; performing second etching involving side etching on part of the first conductive film, thereby forming a gate electrode layer; etching the recessed portion of the first resist mask thereby exposing a region of the second conductive film, which overlaps with the recessed portion of the first resist mask; performing third etching on part of the second conductive film, the impurity semiconductor film, and the semiconductor film using the resist mask which has been etched, thereby forming a source electrode layer, a drain electrode layer, a source region layer, a drain region layer, and a semiconductor layer; after removing the resist mask, forming a second insulating film so as to cover a thin film transistor including the source electrode layer, the drain electrode layer, the source region layer, the drain region layer, and the semiconductor layer; forming a color filter over the second insulating film; and forming a pixel electrode layer over the color filter layer. Further, unevenness of a surface on which the pixel electrode layer is formed is reduced using the color filter layer.

Another manufacturing method of a liquid crystal display device of the invention to be disclosed includes sequentially forming and stacking a first conductive film, a first insulating film, a semiconductor film, an impurity semiconductor film, and a second conductive film; forming a first resist mask over the second conductive film; performing first etching on the first conductive film, the first insulating film, the semiconductor film, the impurity semiconductor film, and the second conductive film using the first resist mask, thereby exposing at least the first conductive film; performing second etching involving side etching on part of the first conductive film, thereby forming a gate electrode layer; after removing the first resist mask, forming a second resist mask; performing third etching on part of the second conductive film, the impurity semiconductor film, and the semiconductor film using the second resist mask, thereby forming a source electrode layer, a drain electrode layer, a source region layer, a drain region layer, and a semiconductor layer; after removing the second resist mask, forming a second insulating film so as to cover a thin film transistor including the source electrode layer, the drain electrode layer, the source region layer, the drain region layer, and the semiconductor layer; forming a color filter over the second insulating film; and forming a pixel electrode layer over the color filter layer. Further, unevenness of a surface on which the pixel electrode layer is formed is reduced using the color filter layer.

Another manufacturing method of a liquid crystal display device of the invention to be disclosed includes sequentially forming and stacking a first conductive film, a first insulating film, a semiconductor film, an impurity semiconductor film, and a second conductive film; forming a resist mask having a recessed portion over the second conductive film; performing first etching on the first insulating film, the semiconductor film, the impurity semiconductor film, and the second conductive film using the resist mask, thereby exposing at least the first conductive film; performing second etching involving side etching on part of the first conductive film, thereby forming a gate electrode layer; making the first resist mask recede, thereby exposing a region of the second conductive film, which overlaps with a recessed portion of the first resist mask; performing third etching on part of the second conductive film, the impurity semiconductor film, and the semiconductor film using the resist mask which has been etched, thereby forming a source electrode layer, a drain electrode layer, a source region layer, a drain region layer, and a semiconductor layer; after removing the resist mask, forming a second insulating film so as to cover a thin film transistor including the source electrode layer, the drain electrode layer, the source region layer, the drain region layer, and the semiconductor layer; selectively forming a color filter over the second insulating film; and forming a pixel electrode layer over the color filter.

Another manufacturing method of a liquid crystal display device of the invention to be disclosed includes forming a first conductive film, and forming an insulating film over the first conductive film, and forming a semiconductor film over the insulating film, and forming an impurity semiconductor film over the semiconductor film, and forming a second conductive film over the impurity semiconductor film, and forming a first resist mask including a recessed portion, over the second conductive film, and first etching the insulating film, the semiconductor film, the impurity semiconductor film, and the second conductive film using the first resist mask to expose at least a surface of the first conductive film, and second etching a portion of the first conductive film to form a gate electrode layer in such manner that a width of the gate electrode layer is narrower than a width of the insulating film, and forming a second resist mask by etching the recessed portion of the first resist mask to expose a part of the second conductive film overlapping with the recessed portion of the first resist mask, and third etching the second conductive film, the impurity semiconductor film, and a part of the semiconductor film using the second resist mask to form a source and drain electrode layer, source and drain region layers, and a semiconductor layer, and after removing the second resist mask, forming a second insulating film over the source electrode layer, the drain electrode layer, the source region layer, the drain region layer, and the semiconductor layer, and forming a color filter over the second insulating film, and forming a pixel electrode layer over the color filter.

Note that the resist mask whose upper surface has a recessed portion is preferably formed using a multi-tone mask. Further, the color filter layer may be selectively formed by a printing method, an ink-jet method, or the like.

Note that, by side etching, a gate electrode layer whose side surface is formed inner than a side surface of the first insulating layer by a predetermined distance can be formed. Further, it is preferable that first etching is performed by dry etching and second etching is performed by wet etching. This is because the processing by the first etching is preferably performed with high precision, and side etching needs to be performed in the processing by the second etching.

Liquid crystal display devices and electronic devices having the liquid crystal display devices can be provided by using the manufacturing method of a liquid crystal display device.

Note that the "pattern of the first conductive film" means, for example, a top view layout of a metal wiring which forms a gate electrode, a gate wiring, a capacitor electrode, and a capacitor wiring.

Note that in this specification, "corrosion" refers to unintentional etching in the processing by an etching. Therefore, etching is preferably performed under conditions where corrosion is reduced to a minimum.

Note that in this specification, a "gate wiring" means a wiring connected to a gate electrode of a thin film transistor. The gate wiring is formed using a gate electrode layer. Further, the gate wiring is sometimes referred to as a scan line.

Note that in this specification, a "source wiring" is a wiring connected to a source/drain electrode of a thin film transistor. The source wiring is formed using a source/drain electrode layer. Further, the source wiring is sometimes referred to as a signal line.

With the use of the present invention to be disclosed, the number of steps for manufacturing thin film transistors can be significantly reduced. In other words, a manufacturing process of a liquid crystal display device can be simplified. Note that in the conventional technique which is aimed at reducing the number of photomasks, electrical characteristics of thin film transistors have often been sacrificed; however, in the present invention to be disclosed, the number of steps for manufacturing a thin film transistor can be significantly reduced while electrical characteristics of the thin film transistor are maintained.

Further, a color filter layer is formed so that unevenness caused by the thin film transistors or the like is relieved; thus, the level difference of the surface where the pixel electrode layer is formed can be reduced. Thus, uniform voltage can be applied to liquid crystal, so that orientation disorder is suppressed and favorable display is realized. In the case of selectively forming a color filter layer using a printing method, an ink-jet method, or the like, the color filters can be formed separately by utilizing unevenness caused by thin film transistors or the like (for example, unevenness due to a source wiring); accordingly, accuracy of separate formation of the color filters is improved. Thus, the color filters can be favorably formed without employing a special structure.

Note that a thin film transistor manufactured by a manufacturing method of the present invention has a cavity in contact with an end portion of a gate electrode layer, so that leakage current between a gate electrode and a drain electrode can be made low. Further, since the cavity is formed, the dielectric constant of the vicinity of the end portion of the gate electrode can be made low (low-k).

BRIEF DESCRIPTION OF DRAWINGS

In the accompanying drawings:

FIGS. 41A to 41C illustrate an electronic device using a display device according to the present invention.

BEST MODE FOR CARRYING OUT THE INVENTION

Embodiment Mode

Figure 1A:
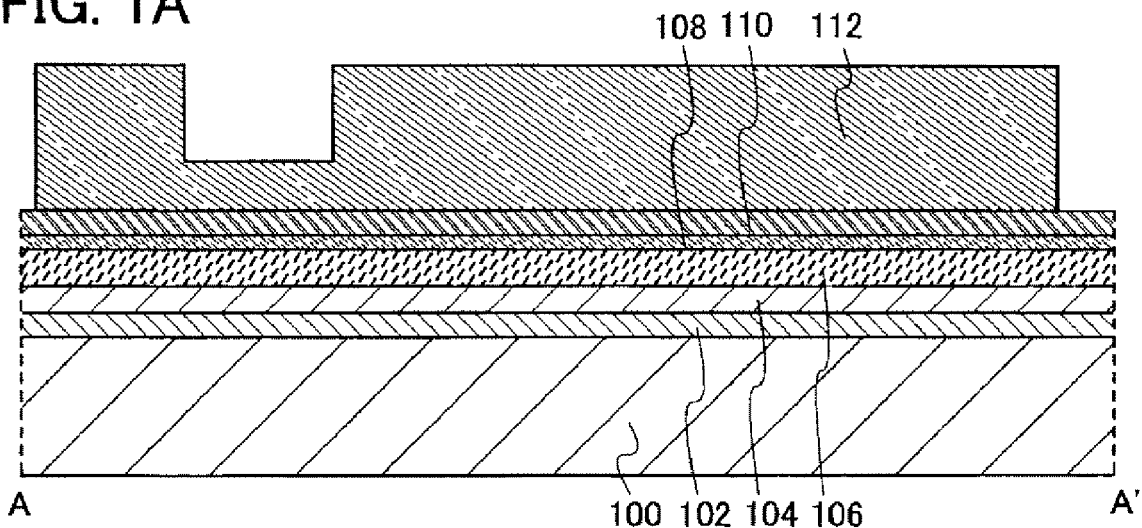
FIGS. 1A to 1C illustrate an example of a manufacturing method of a thin film transistor and a display device according to the present invention.

Embodiment modes will be described in detail with reference to the drawings. However, the present invention is not limited to the following description, and it is readily appreciated by those skilled in the art that modes and details of the present invention can be modified in various ways without departing from the spirit and the scope of the invention. Further, structures of different embodiment modes can be implemented in combination as appropriate. Note that in a structure of the invention described below, like portions or portions having similar functions are denoted by the same reference numerals, and description thereof will not be repeated. The same hatching pattern is applied to similar parts, and the similar parts are not especially denoted by reference numerals in some cases.

Embodiment Mode 1

In this embodiment mode, an example of a method for manufacturing a semiconductor device will be described with reference to FIGS. 1A to 25B-2.

Figure 20:
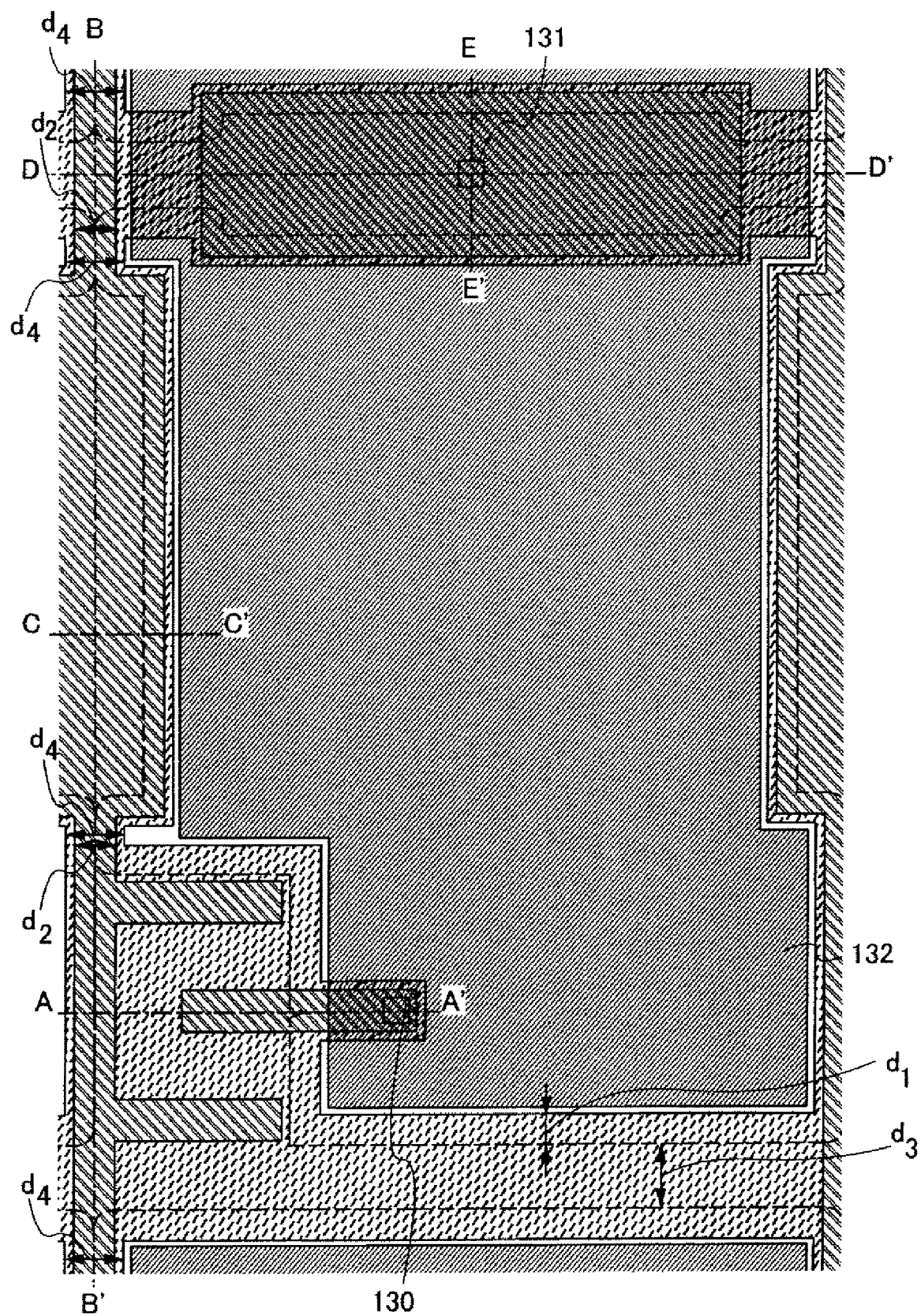
FIG. 20 illustrates an example of a manufacturing method of a thin film transistor and a display device according to the present invention.

FIG. 16 to FIG. 20 are plan views of thin film transistors according to this embodiment mode. FIG. 20 is a drawing of the situation in which steps up to and including the step of forming a pixel electrode have been finished. FIG. 1A to FIG. 3C are cross-sectional views taken along line A-A' in FIG. 16 to FIG. 20. FIG. 4A to FIG. 6C are cross-sectional views taken along line B-B' in FIG. 16 to FIG. 20. FIG. 7A to FIG. 9C are cross-sectional views taken along line C-C' in FIG. 16 to FIG. 20. FIG. 10A to FIG. 12C are cross-sectional views taken along line D-D' in FIG. 16 to FIG. 20. FIG. 13A to FIG. 15C are cross-sectional views taken along line E-E' in FIG. 16 to FIG. 20.

First, a first conductive film 102, a first insulating film 104, a semiconductor film 106, an impurity semiconductor film 108, and a second conductive film 110 are formed over a substrate 100. These films may be in a single layer or may be a film stack in which a plurality of films is stacked.

An insulating substrate can be used for the substrate 100. Insulating substrates includes, for example, a glass substrate or a quartz substrate. In this embodiment mode, a glass substrate is used as the substrate 100.

The first conductive film 102 is formed of a conductive material. The first conductive film 102 is formed using a conductive material such as a metal material, for example, titanium, molybdenum, chromium, tantalum, tungsten, aluminum, copper, neodymium, niobium, or scandium, or an alloy material including any of these metal materials as a main component. Note that the material of the first conductive film 102 needs to be selected from materials which have such heat resistance as to withstand a later step (such as formation of the first insulating film 104) and are not easily corroded or eaten in a later step (such as etching of the second conductive film 110). Only under these conditions, the material of the first conductive film 102 is not limited to a particular material.

In addition, the first conductive film 102 can be formed by, for example, sputtering, a CVD method (including thermal CVD, plasma CVD, and the like), or the like. However, the formation method of the first conductive film 102 is not limited to a particular method.

The first insulating film 104 serves as a gate insulating film, which is formed of an insulating material. The first insulating film 104 can be formed using, for example, a silicon oxide film, a silicon nitride film, a silicon oxynitride film, a silicon nitride oxide film, or the like. Note that similar to the first conductive film 102, the material of the first insulating film 104 needs to be selected from materials which resist a certain level of heat and are not easily corroded or eaten in a later step. Only under these conditions, the material of the first insulating film 104 is not limited to a particular material.

In addition, the first insulating film 104 can be formed by, for example, a CVD method (including thermal CVD, plasma CVD, and the like), sputtering, or the like; however, the formation method of the first insulating film 104 is not limited to a particular method.

The semiconductor film 106 is formed of a semiconductor material. The semiconductor film 106 can be formed using, for example, amorphous silicon formed using a silane gas or the like. Note that similarly to the first conductive film 102 and the like, the material of the semiconductor film 106 needs to be selected from materials which resist a certain level of heat and are not easily corroded or eaten in a later step. Only under these conditions, the material of the semiconductor film 106 is not limited to a particular material. Therefore, germanium or the like may be used. Note that the crystallinity of the semiconductor film 106 is not particularly limited either.

In addition, the semiconductor film 106 can be formed by, for example, a CVD method (including thermal CVD, plasma CVD, and the like), sputtering, or the like. However, the formation method of the semiconductor film 106 is not limited to a particular method.

The impurity semiconductor film 108 is a semiconductor film containing an impurity element imparting one conductivity type, and is formed using a semiconductor material gas to which the impurity element imparting one conductivity type is added or the like. For example, the impurity semiconductor film 108 is a silicon film containing phosphorus or boron, which is formed using a silane gas containing phosphine (chemical formula: $PH_3$) or diborane (chemical formula: $B_2H_6$). Note that similarly to the first conductive film 102 and the like, a material of the impurity semiconductor film 108 needs to be selected from materials which resist a certain level of heat and are not easily corroded or eaten in a later step. Only under these conditions, the material of the impurity semiconductor film 108 is not limited to a particular material. Note that the crystallinity of the impurity semiconductor film 108 is not particularly limited either.

In the case of manufacturing an n-channel thin film transistor, phosphorus, arsenic, or the like may be used as the impurity element imparting one conductivity type, which is to be added. That is, a silane gas used for the formation of the impurity semiconductor film 108 may contain phosphine, arsine (chemical formula: $AsH_3$), or the like at a predetermined concentration. Alternatively, in the case of manufacturing a p-channel thin film transistor, boron or the like may be used as the impurity element, which is to be added. That is, a silane gas used for the formation of the impurity semiconductor film 108 may contain diborane or the like at a predetermined concentration.

In addition, the impurity semiconductor film 108 can be formed by, for example, a CVD method (including thermal CVD, plasma CVD, and the like), or the like. However, the formation method of the impurity semiconductor film 108 is not limited to a particular method.

The second conductive film 110 is formed of a material which is a conductive material (a material given as the material of the first conductive film 102) but is different from the material used for the first conductive film 102. Here, the "different material" means a material having a different main component. Specifically, a material which is not easily etched by second etching which is described later is preferably selected. Further, similarly to the first conductive film 102 and the like, the material of the second conductive film 110 needs to be selected from materials which resist a certain level of heat and are not easily corroded or eaten in a later step. Accordingly, only under these conditions, the material of the second conductive film 110 is not limited to a particular material.

In addition, the second conductive film 110 can be formed by, for example, sputtering, a CVD method (including thermal CVD, plasma CVD, and the like), or the like. However, the formation method of the second conductive film 110 is not limited to a particular method.

Next, a first resist mask 112 is formed over the second conductive film 110 (see FIG. 1A, FIG. 4A, FIG. 7A, FIG. 10A, and FIG. 13A). The first resist mask 112 is a resist mask whose upper surface has a recessed portion or a projecting portion. In other words, the first resist mask 112 can also be referred to as a resist mask including a plurality of regions having different thicknesses (here, two thicknesses). Hereinafter, with respect to the first resist mask 112, the thicker region is called a projecting portion of the first resist mask 112 and the thinner region is called a recessed portion of the first resist mask 112.

The first resist mask 112 has a projecting portion in a region where a source/drain electrode layer is formed, and a recessed portion in a region where the source/drain electrode layer is not formed and a semiconductor layer is exposed.

The first resist mask 112 can be formed using a multi-tone mask. Here, multi-tone masks will be described with reference to FIGS. 25A-1 to 25B-2.

A multi-tone mask is a mask which makes it possible to perform light exposure with multi-level light intensity, and typically, light exposure is performed with three levels of light intensity which provides an exposed region, a half-exposed region, and an unexposed region. Using a multi-tone mask, a resist mask with a plurality of thicknesses (typically, two thicknesses) can be formed through one-time process of light exposure and development. Accordingly, using a multi-tone mask, the number of photomasks can be reduced.

Figures 1, 25A:
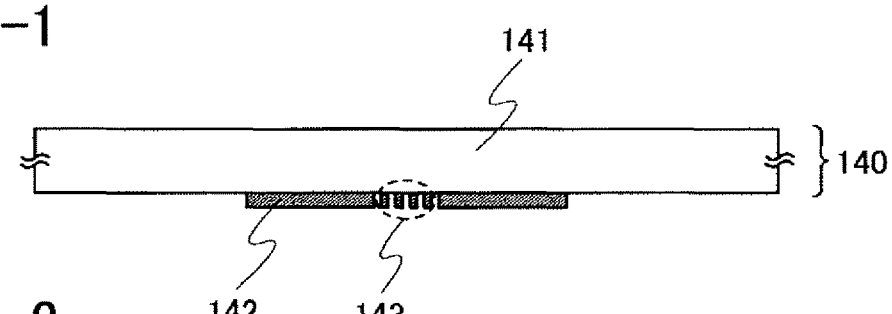
FIGS. 25A-1 and 25A-2 and FIGS. 25B-1 and 25B-2 each illustrate a multi-tone mask used for a manufacturing method of the present invention.
Figures 2, 25A:
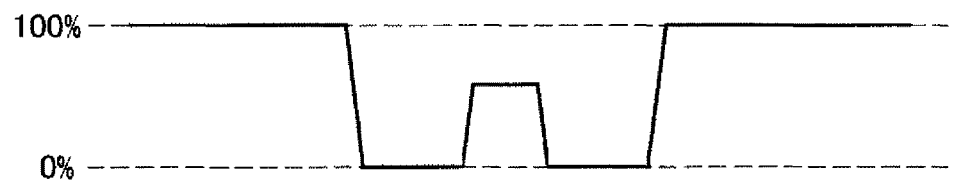
Figures 1, 25B:
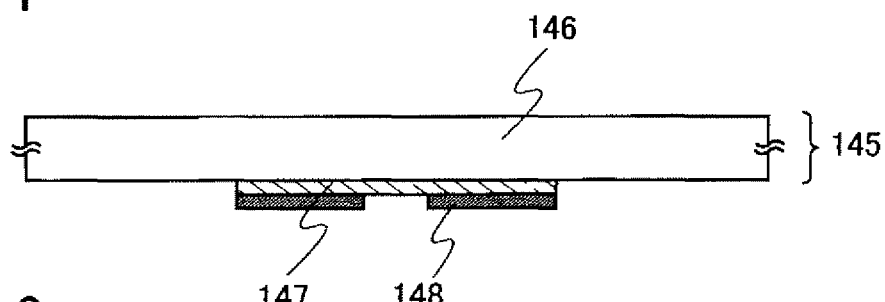
Figures 2, 25B:
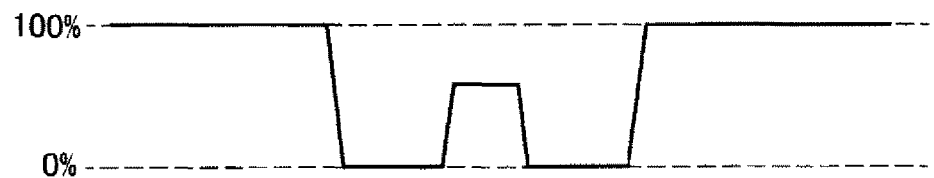

FIG. 25A-1 and FIG. 25B-1 are cross-sectional views of typical multi-tone masks. FIG. 25A-1 illustrates a gray-tone mask 140 and FIG. 25B-1 illustrates a half-tone mask 145.

The gray-tone mask 140 illustrated in FIG. 25A-1 includes a light-blocking portion 142 formed of a light-blocking film on a substrate 141 which transmits light, and a slit portion 143 provided with a pattern of the light-blocking film.

The slit portion 143 has slits (including dots, mesh, or the like) provided at intervals of equal to or less than the resolution limit of light used for light exposure; thus, transmittance of light is controlled. Note that the slits provided at the slit portion 143 may be provided periodically or aperiodically.

As the substrate 141 which transmits light, a substrate formed of a material of quartz or the like can be used. The light-blocking film for forming the light-blocking portion 142 and the slit portion 143 may be formed using a metal material and preferably formed using chromium, chromium oxide, or the like.

In the case where the gray-tone mask 140 is irradiated with light for light exposure, as illustrated in FIG. 25A-2, the transmittance in the region overlapping with the light-blocking portion 142 is 0%, and the transmittance in the region where both the light-blocking portion 142 and the slit portion 143 are not provided is 100%. Further, the transmittance at the slit portion 143 is basically in the range of 10% to 70%, which can be adjusted with the interval of slits, or the like.

The half-tone mask 145 illustrated in FIG. 25B-1 includes a semi-light-transmitting portion 147 formed using a semi-light-transmitting film on a substrate 146 which transmits light, and a light-blocking portion 148 formed using a light-blocking film.

The semi-light-transmitting portion 147 can be formed using a material of MoSiN, MoSi, MoSiO, MoSiON, CrSi, or the like. The light-blocking portion 148 may be formed using a metal material in a similar manner to the light-blocking film of the gray-tone mask and preferably formed using chromium, chromium oxide, or the like.

In the case where the half-tone mask 145 is irradiated with light for light exposure, as illustrated in FIG. 25B-2, the transmittance in the region overlapping with the light-blocking portion 148 is 0%, and the transmittance in the region where both the light-blocking portion 148 and the semi-light-transmitting portion 147 are not provided is 100%. Further, the transmittance in the semi-light-transmitting portion 147 is basically in the range of 10% to 70%, which can be adjusted with the material to be used, its thickness, or the like.

When light exposure is performed using the multi-tone mask and development is performed, a first resist mask 112 having regions with different thicknesses can be formed.

Next, first etching is performed using the first resist mask 112. That is, the first insulating film 104, the semiconductor film 106, the impurity semiconductor film 108, and the second conductive film 110 are etched to form a thin film stack 114 (see FIG. 1B, FIG. 4B, FIG. 7B, FIG. 10B, FIG. 13B, and FIG. 16). At this time, at least the first conductive film 102 is preferably exposed. In this specification, this etching step is referred to as "first etching". As the first etching, either dry etching or wet etching may be employed and a highly anisotropic etching method is preferably performed. A highly anisotropic etching method is employed for the first etching; thus, the pattern processing accuracy can be improved. Note that the first etching can be performed by one step when dry etching is employed for the first etching; meanwhile, the first etching is performed by a plurality of steps when wet etching is employed for the first etching. Thus, dry etching is preferably employed for the first etching.

Next, second etching is performed using the first resist mask 112. That is, the first conductive film 102 is etched to form a gate electrode layer 116 (see FIG. 1C, FIG. 4C, FIG. 7C, FIG. 10C, FIG. 13C, and FIG. 17). In this specification, such an etching step is referred to as "second etching."

Note that the gate electrode layer 116 forms a gate wiring, a capacitor wiring, and a supporting portion. When a gate electrode layer is referred to as a gate electrode layer 116A, the gate electrode layer forms a gate wiring; when a gate electrode layer is referred to as a gate electrode layer 116B or a gate electrode layer 116D, the gate electrode layer forms a supporting portion; and when a gate electrode layer is referred to as a gate electrode layer 116C, the gate electrode layer forms a capacitor wiring. Then, these gate electrode layers are collectively referred to as the gate electrode layer 116.

The second etching is performed under such etching conditions that a side surface of the gate electrode layer 116 formed from the first conductive film 102 is inner than a side surface of the thin film stack 114. In other words, the second etching is performed so that the side surface of the gate electrode layer 116 is in contact with the bottom surface of the thin film stack 114 (etching is performed so that the width of the gate electrode layer 116 is smaller than that of the thin film stack 114 in the cross section A-A'). It can be said that the gate electrode layer 116 is provided so that its side surface is inner than a side surface of the first insulating film 104 (namely, a gate insulating layer) or the like. Further, the second etching is performed under such conditions that the etching rate with respect to the second conductive film 110 is low and the etching rate with respect to the first conductive film 102 is high. In other words, the second etching is performed under the conditions that the etch selectivity of the first conductive film 102 with respect to the second conductive film 110 is high. By performing the second etching under such conditions, the gate electrode layer 116 can be formed.

As the second etching, either dry etching or wet etching may be employed and a highly isotropic etching method (chemical etching) is preferably performed. By employing a highly isotropic etching (chemical etching) method for the second etching, the first conductive film can be side-etched. Therefore, wet etching is preferably employed for the second etching.

Note that the shape of the side surface of the gate electrode layer 116 is not particularly limited. For example, the shape may be a tapered shape. The shape of the side surface of the gate electrode layer 116 is determined depending on the conditions such as a liquid chemical used in the second etching.

Here, the phrase "the conditions that the etching rate with respect to the second conductive film 110 is low and the etching rate with respect to the first conductive film 102 is high" or "the conditions that the etch selectivity of the first conductive film 102 with respect to the second conductive film 110 is high" means conditions satisfying the following first and second requirements.

The first requirement is that the gate electrode layer 116 is left in a place where needed. The place necessarily provided with the gate electrode layer 116 corresponds to regions indicated by dotted lines in FIG. 17 to FIG. 20. That is, it is necessary that the gate electrode layer 116 is left so as to form a gate wiring, a capacitor wiring, and a supporting portion after the second etching. In order that the gate electrode layer forms the gate wiring and the capacitor wiring, the second etching needs to be performed so as not to disconnect these wirings. As illustrated in FIGS. 1A to 1C and FIG. 20, the gate electrode layer 116 is provided so that its side surface is preferably inner than the side surface of the thin film stack 114 by a distance $d_1$, and the distance $d_1$ may be set as appropriate by a practitioner in accordance with the layout.

The second requirement is that a width $d_3$ of the gate wiring or the capacitor wiring, which is formed by the gate electrode layer 116 and a minimum width $d_2$ of a source wiring formed by a source/drain electrode layer 120A are appropriate (see FIG. 20). As the source/drain electrode layer 120A is etched by the second etching, the minimum width $d_2$ of the source wiring is reduced; accordingly, the current density of the source wiring becomes excessive and electrical characteristics are degraded. Therefore, the second etching is performed under the conditions that the etching rate of the first conductive film 102 is not too high and the etching rate of the second conductive film 110 is as low as possible. In addition, the second etching is performed under the conditions that the etching rate of the first conductive film 102 in third etching that will be described subsequently is as low as possible.

It is difficult to make the minimum width $d_2$ of the source wiring large. This is because since the minimum width $d_2$ of the source wiring is determined depending on a minimum width $d_4$ of the semiconductor layer overlapping with the source wiring, the minimum width $d_4$ of the semiconductor layer has to be increased in order to make the minimum width $d_2$ of the source wiring larger, which makes it difficult to insulate the gate wiring from the capacitor wiring, which are adjacent to each other. In the invention to be disclosed, the minimum width $d_4$ of the semiconductor layer is set smaller than about twice the distance $d_1$. In other words, the distance $d_1$ is set larger than about half the minimum width $d_4$ of the semiconductor layer.

It is accepted that there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring and a region adjacent to the capacitor wiring be the minimum width $d_4$ as illustrated in FIG. 20.

In addition, the width of the electrode in a portion connected to a pixel electrode layer, which is formed of the source/drain electrode layer, be equal to the minimum width $d_2$ of the source wiring.

As described above, the second etching under the condition where side etching can be performed is very important in the invention to be disclosed. This is because when the second etching involves side etching of the first conductive film 102, the gate wiring and the capacitor wiring, which are adjacent to each other and are formed of the gate electrode layer 116, can be insulated from each other (see FIG. 17).

Here, "side etching" means etching in which a film to be etched is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film). An end portion of the film which has been side-etched can have a variety of shapes depending on the etching rate of an etching gas or a liquid chemical used for the etching with respect to the film. The film is formed so that, in many cases, its end portion has a curved surface.

Figure 17:
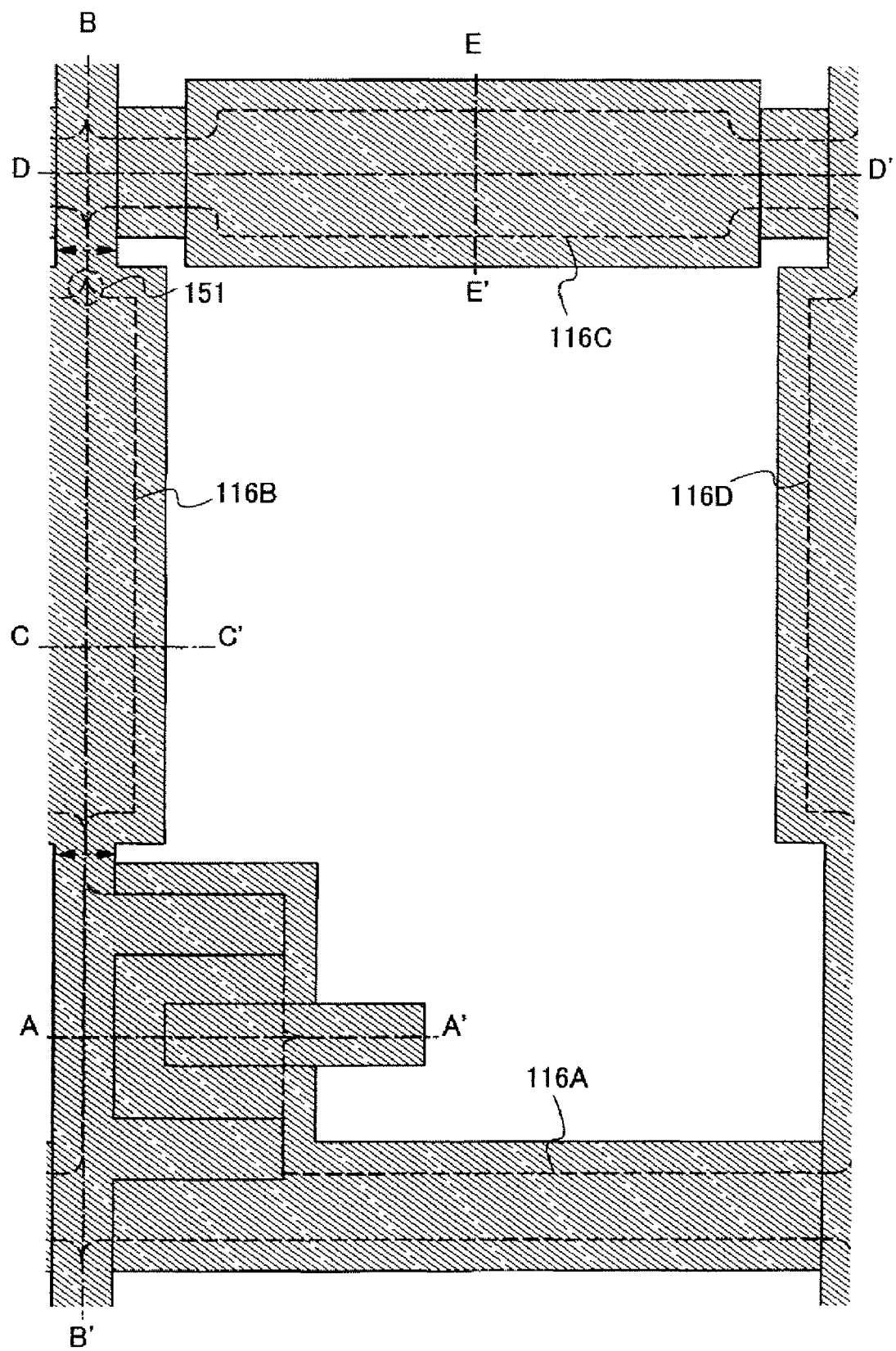
FIG. 17 illustrates an example of a manufacturing method of a thin film transistor and a display device according to the present invention.
Figure 18:
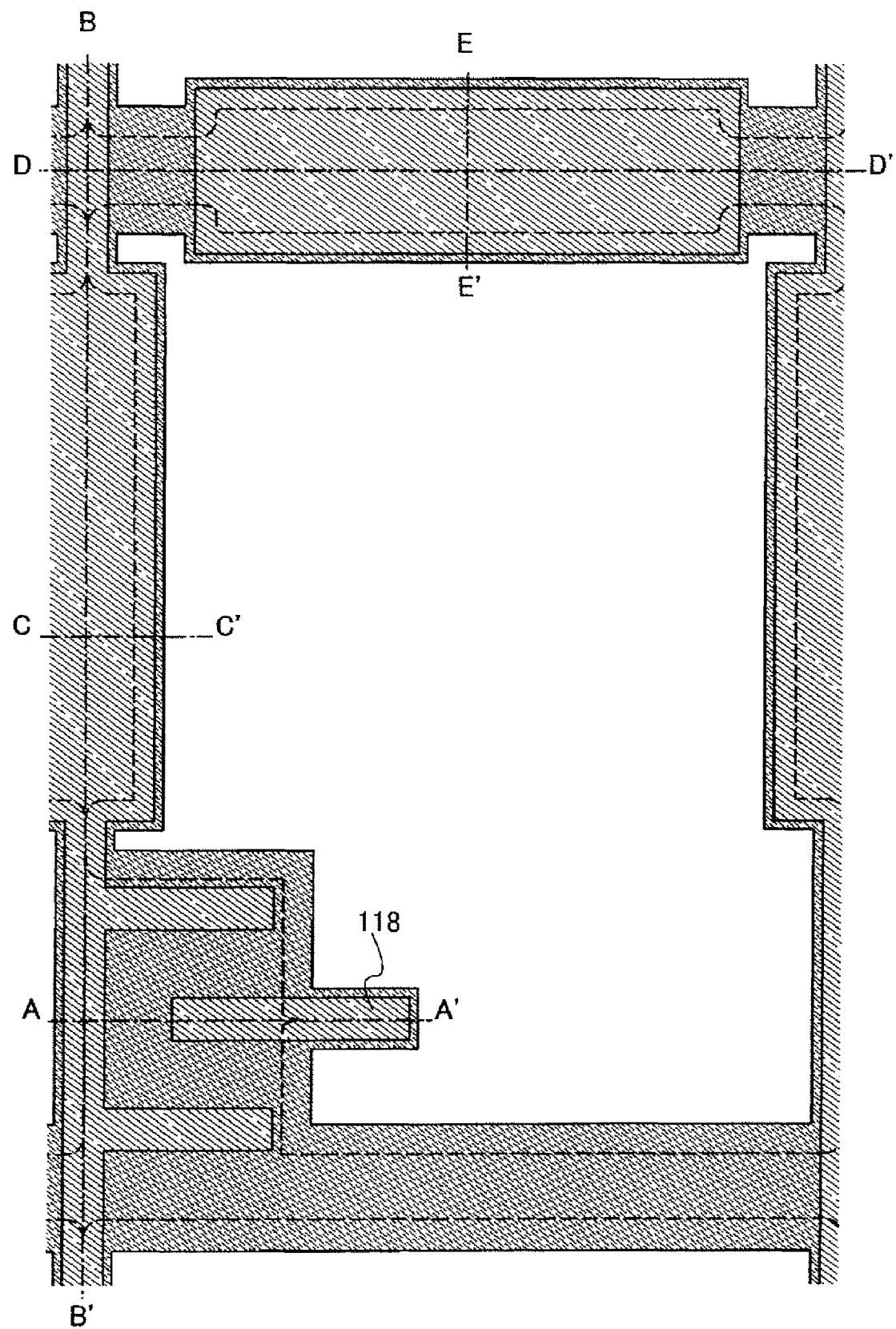
FIG. 18 illustrates an example of a manufacturing method of a thin film transistor and a display device according to the present invention.
Figure 19:
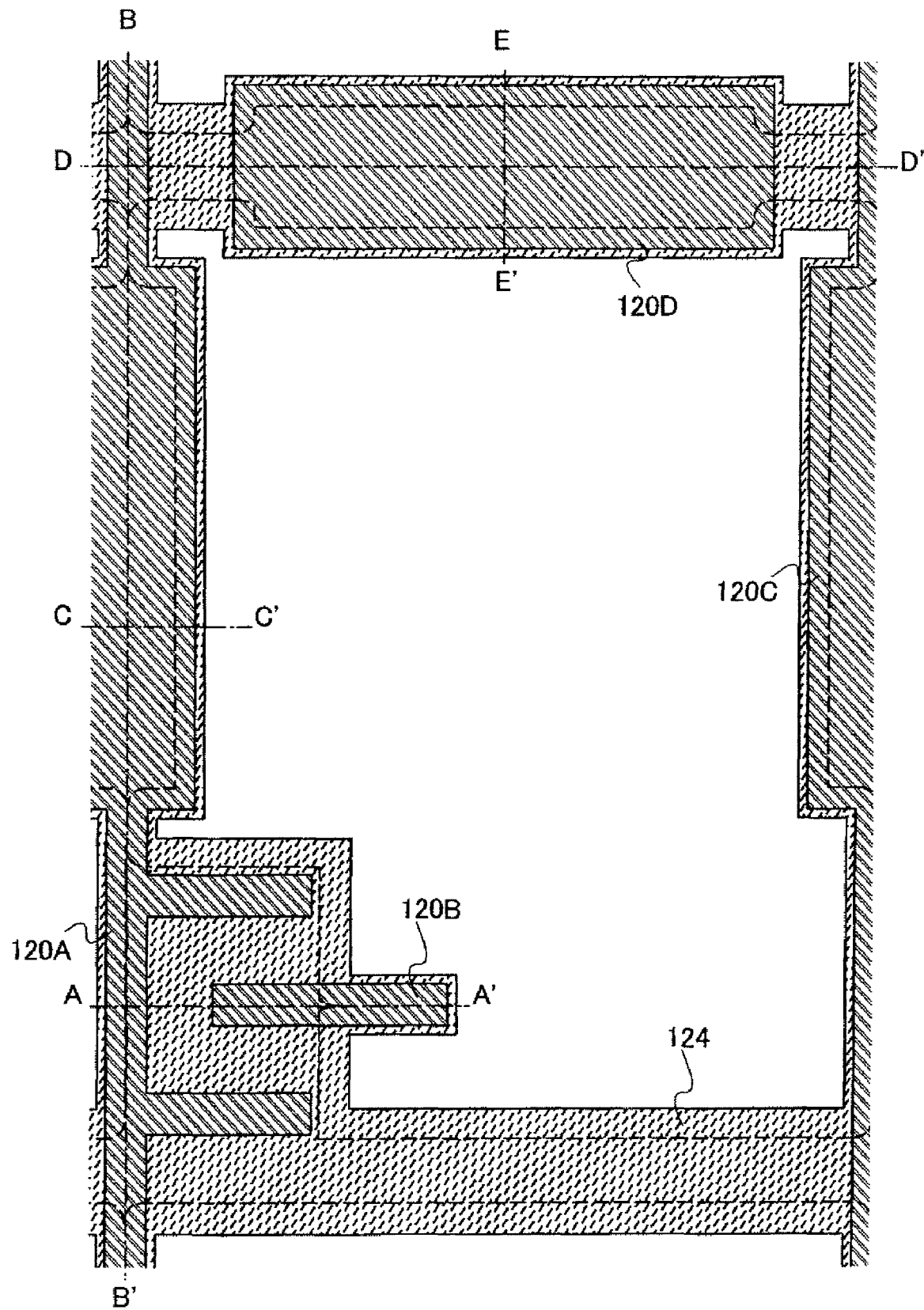
FIG. 19 illustrates an example of a manufacturing method of a thin film transistor and a display device according to the present invention.

As illustrated in FIG. 17, the thin film stack 114 formed by the first etching is designed to be thin in a portion adjacent to a supporting portion which is formed by the gate electrode layer 116B or the gate electrode layer 116D (see the portions indicated by the arrows in FIG. 17). With this structure, the gate electrode layer 116A can be disconnected to be insulated from the gate electrode layer 116B or the gate electrode layer 116D by the second etching.

Figure 21:
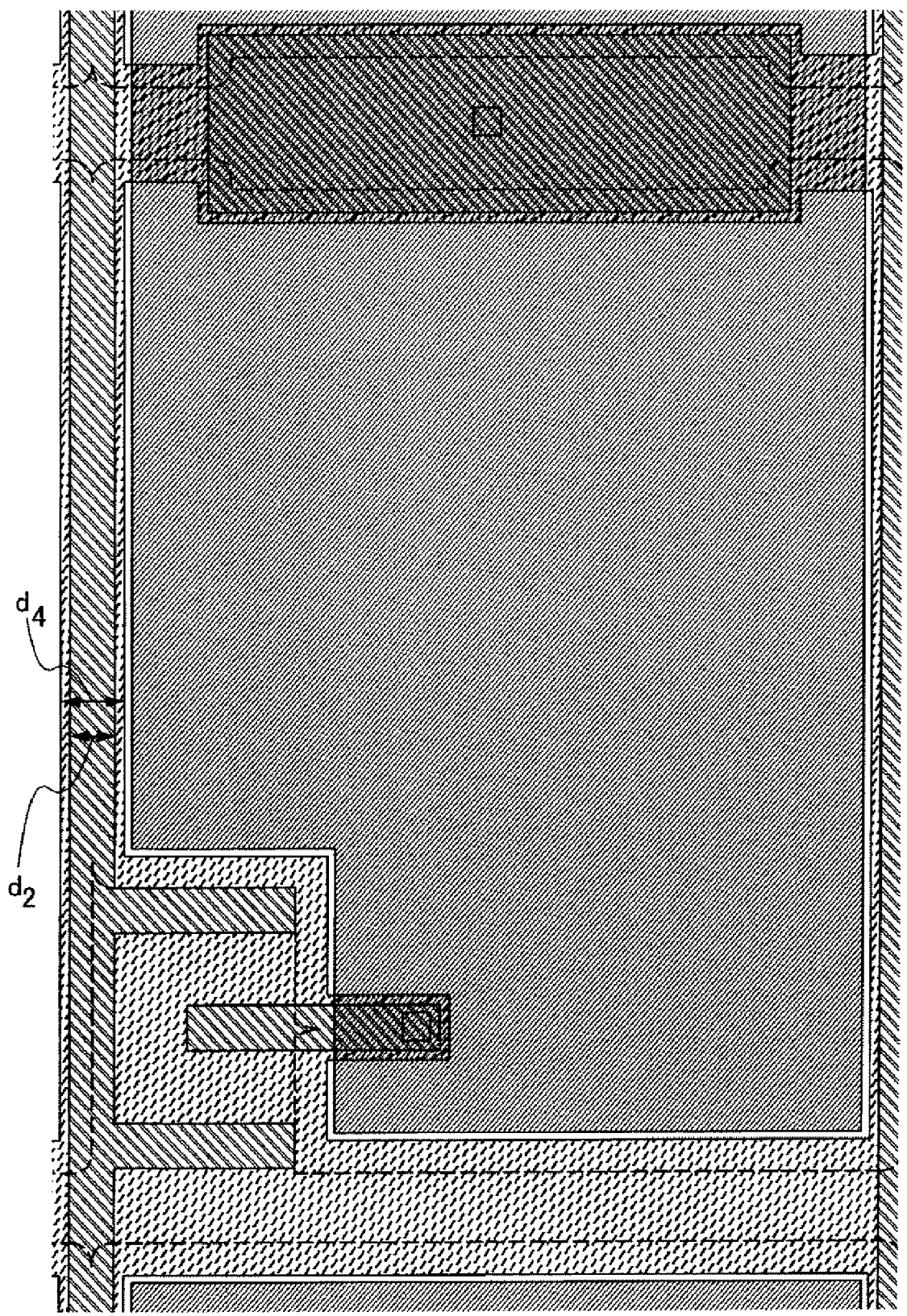
FIG. 21 illustrates an example of a manufacturing method of a thin film transistor and a display device according to the present invention.

The gate electrode layer 116B and the gate electrode layer 116D which are illustrated in FIG. 17 each serve as a supporting portion which supports the thin film stack 114. With the supporting portion, peeling of a film such as a gate insulating film formed over the gate electrode layer can be prevented. Further, with the supporting portion, a cavity region formed adjacent to the gate electrode layer 116 by the second etching can be prevented from being larger than necessary. Furthermore, it is preferable to provide the supporting portion because the thin film stack 114 can be prevented from being broken or damaged due to its own weight, and accordingly yield is increased. However, the present invention is not limited to the mode with the supporting portion, and a structure without the supporting portion can also be employed. An example of a plan view of the mode without the supporting portion (corresponding to FIG. 20) is illustrated in FIG. 21.

As described above, the second etching is preferably performed by wet etching.

In the case where the second etching is performed by wet etching, aluminum or molybdenum may be deposited as the first conductive film 102, titanium or tungsten may be deposited as the second conductive film 110, and a liquid chemical containing nitric acid, acetic acid, and phosphoric acid may be used for etching. Alternatively, molybdenum may be deposited as the first conductive film 102, titanium, aluminum, or tungsten may be deposited as the second conductive film 110, and a liquid chemical containing hydrogen peroxide solution may be used for etching.

In the case where the second etching is performed by wet etching, it is most preferable that a film stack in which molybdenum is deposited over aluminum to which neodymium is added be formed as the first conductive film 102, tungsten be deposited as the second conductive film 110, and a liquid chemical containing nitric acid at 2%, acetic acid at 10%, and phosphoric acid at 72% be used for etching. Using a liquid chemical having such a composition ratio, the first conductive film 102 can be etched without the second conductive film 110 being etched. Note that neodymium is added to the first conductive film 102 for the purpose of reducing resistance of aluminum and preventing hillocks.

As illustrated in FIG. 17, the gate electrode layer 116 has a horny portion (for example, a horny portion 151) in a plan view. This is because since the second etching for forming the gate electrode layer 116 is almost isotropic, etching is performed in such a manner that the distance $d_1$ between the side surface of the gate electrode layer 116 and the side surface of the thin film stack 114 is almost uniform.

Next, the first resist mask 112 is etched; accordingly, the second conductive film 110 is exposed and a second resist mask 118 is formed. As a means for forming the second resist mask 118 by recession of edge of the first resist mask 112, for example, ashing using oxygen plasma can be given. However, the means for forming the second resist mask 118 by recession of edge of the first resist mask 112 is not limited to this. Note that the case where the second resist mask 118 is formed after the second etching has been described here; however, the present invention is not limited to this and the second etching may be performed after formation of the second resist mask 118.

Next, the second conductive film 110 in the thin film stack 114 is etched using the second resist mask 118, so that the source/drain electrode layer 120 is formed (see FIG. 2A, FIG. 5A, FIG. 5A, FIG. 11A, FIG. 14A, and FIG. 18). Here, as the etching conditions, the conditions by which films other than the second conductive film 110 are not corroded or eaten or are not easily corroded or eaten are selected. In particular, it is important that etching is performed under the conditions that the gate electrode layer 116 is not easily corroded or eaten or is not easily corroded or eaten.

Note that the source/drain electrode layer 120 forms the source wiring, the electrode which connects the thin film transistor and the pixel electrode to each other, and one electrode of a capacitor functioning as a storage capacitor. When a source/drain electrode layer is referred to as the source/drain electrode layer 120A or a source/drain electrode layer 120C, the source/drain electrode layer forms an electrode layer forming a source wiring; when a source/drain electrode layer is referred to as a source/drain electrode layer 120B, the source/drain electrode layer forms an electrode layer which connects a drain electrode of the thin film transistor and the pixel electrode to each other; and when a source/drain electrode layer is referred to as a source/drain electrode layer 120D, the source/drain electrode layer forms one electrode layer which forms the capacitor with the capacitor wiring. Then, these source/drain electrode layers are collectively referred to as the source/drain electrode layer 120.

Note that for etching the second conductive film 110 in the thin film stack 114, either wet etching or dry etching may be used.

Then, the impurity semiconductor film 108 and an upper portion of the semiconductor film 106 (back channel portion) in the thin film stack 114 are etched to form a source/drain region 122 and a semiconductor layer 124 (see FIG. 2B, FIG. 5B, FIG. 8B, FIG. 11B, FIG. 14B, and FIG. 19). Here, as the etching conditions, the conditions by which films other than the impurity semiconductor film 108 and the semiconductor film 106 are not corroded or eaten or are not easily corroded or eaten are selected. In particular, it is important that etching is performed under the conditions that the gate electrode layer 116 is not easily corroded or eaten or is not easily corroded or eaten.

Note that the etching of the impurity semiconductor film 108 and the upper portion of the semiconductor film 106 (back channel portion) in the thin film stack 114 can be performed by dry etching or wet etching.

Figure 2A:
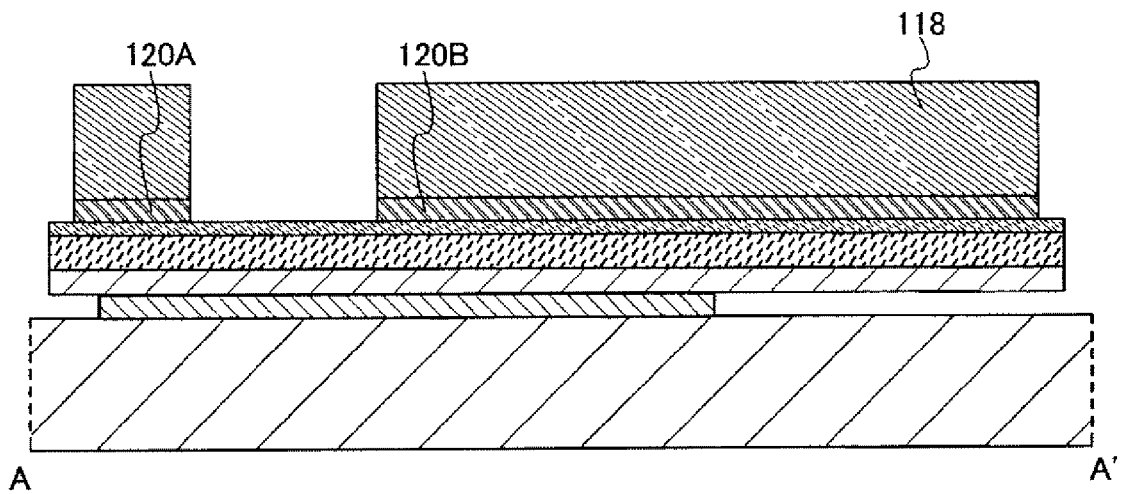
FIGS. 2A to 2C illustrate an example of a manufacturing method of a thin film transistor and a display device according to the present invention.
Figure 2B:
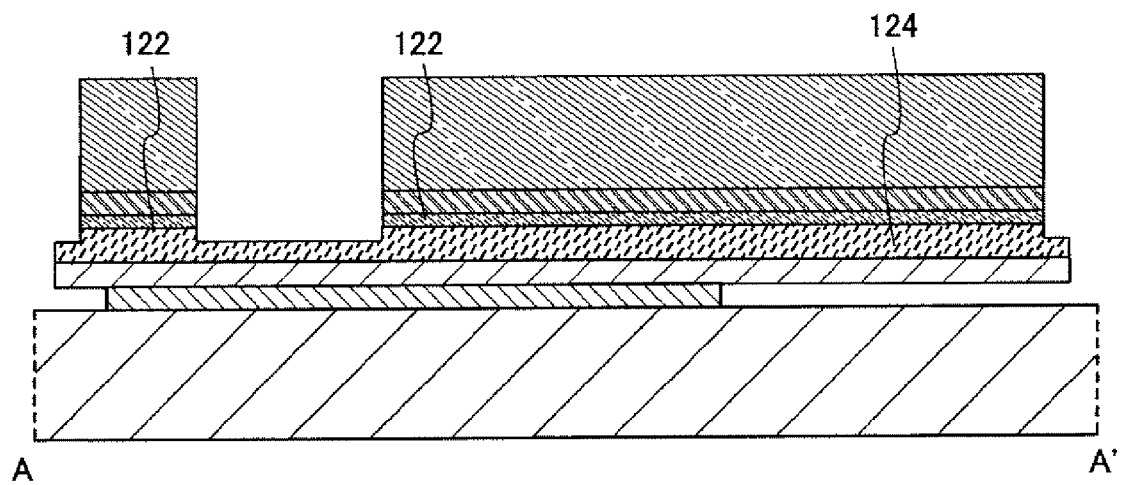
Figure 2C:
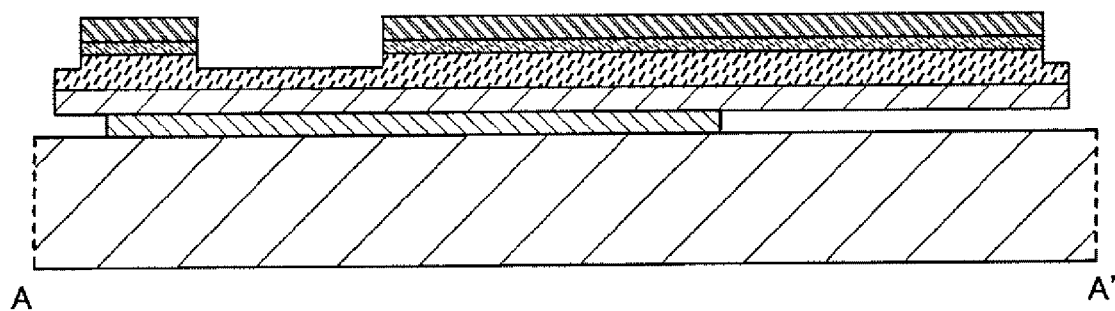

Then, the second resist mask 118 is removed (see FIG. 2C, FIG. 5C, FIG. 8C, FIG. 11C, and FIG. 14C); accordingly, a thin film transistor is completed (see FIG. 2C). As described above, the thin film transistor can be formed using one photomask.

In this specification, the steps described with reference to FIG. 2A and FIG. 2B are collectively referred to as "third etching" The third etching may be performed in a plurality of separate steps as described above or may be performed in a single step.

A second insulating film is formed to cover the thin film transistor which is formed in the above-described manner. Here, an example of using the protective film 126 as the second insulating film is described; however, a layered structure having two or more layers may be employed without limitation to a single layer structure. The first protective film 126 can be formed in a similar manner to the first insulating film 104. After that, color filter layers 128 is formed over the second insulating film (see FIG. 3A, FIG. 6A, FIG. 9A, FIG. 12A, and FIG. 15A).

The color filter layers 128 are formed so that surface unevenness caused by the thin film stack 114 is reduced. More specifically, the color filter layers are formed so that planarity of the surface over which the pixel electrode layer is later formed is improved. In this embodiment mode, the color filter layers 128 are formed so as to be embedded in regions where the thin film stack 114 and the like is not formed; however, the present invention should not construed as being limited thereto as long as unevenness caused by the thin film stack 114 or the like can be reduced.

As described above, unevenness of the surface over which the pixel electrode is formed is reduced using the color filter layers; accordingly, the color filter layers are formed and planarity can be improved by one step. Thus, planarity of the pixel electrode is improved, which prevents orientation disorder of liquid crystal and improves display image quality. Further, since formation of a layer for improving planarity separately from the color filter layer is rendered unnecessary, which leads to more simplified process steps.

Note that the color filter layers 128 may be formed as appropriate by, for example, a printing method, an ink-jet method, photolithography, or the like. For example, after resins each having a pigment corresponding to R (red), G (green), or B (blue), respectively are formed by spin coating or the like, patterning is performed by photolithography; thus, the color filter layers 128 can be formed. The stripe pattern, the delta pattern, the square pattern, or the like can be used as the pattern of the color filter.

Note that in the case of forming the color filter by photolithography, one photomask is used. Naturally, the color filter may be formed using a method in which a photomask is not used.

Next, a first opening portion 130 and a second opening portion 131 are formed in the second insulating film (see FIG.

3B, FIG. 6B, FIG. 9B, FIG. 12B, and FIG. 15B). The first opening portion 130 and the second opening portion 131 are formed so as to reach at least the surface of a source/drain electrode layer. The method for forming the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using a photolithography method.

Note that in the ease of forming the opening portions by photolithography, one photomask is used.

Next, the pixel electrode layer 132 is formed over the second insulating film (see FIG. 3C, FIG. 6C, FIG. 9C, FIG. 12C, FIG. 15C, and FIG. 20). The pixel electrode layer 132 is formed so as to be connected to the source/drain electrode layer 120 through the opening portions. Specifically, the pixel electrode layer 132 is formed so as to be connected to the source/drain electrode layer 120B through the first opening portion 130 and connected to the source/drain electrode layer 120D through the second opening portion 131. The pixel electrode layer 132 is preferably formed using a light-transmitting conductive material. Here, as the light-transmitting conductive material, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like can be given. The film of the light-transmitting conductive material may be formed by sputtering, CVD, or the like; however, the method for forming the film of the light-transmitting conductive material is not limited to a particular method. In addition, the pixel electrode layer 132 may have a single-layer structure or a layered structure in which a plurality of films are stacked.

Note that in this embodiment mode, the light-transmitting conductive material is used for only the pixel electrode layer 132; however, the present invention is not limited to this. As materials of the first conductive film 102 and the second conductive film 110, light-transmitting conductive materials may be used.

Note that in the case of forming the pixel electrode layer 132 by photolithography, one photomask is used.

Through the above steps, an active matrix substrate used for a liquid crystal display device is completed. As described in this embodiment mode, the thin film transistor can be manufactured using one photomask in such a manner that the gate electrode layer is formed utilizing side etching, and further, the source/drain electrode layer is formed using a multi-tone mask. Further, unevenness of the surface over which the pixel electrode is formed is reduced using color filter layers; accordingly, the color filter layers are formed and planarity can be improved by one step. Accordingly, more simplified process steps are realized.

Note that although not shown in this embodiment mode, after formation of the color filter layers and before formation of the pixel electrode layer, an overcoat layer may be formed. The formation of the overcoat layer can further improve planarity of a surface over which the pixel electrode is formed. In addition, part of a material included in the color filter layers can be prevented from entering a liquid crystal material. For the overcoat layer, a thermosetting material which mainly contains acrylic resin or epoxy resin is used.

Figure 3A:
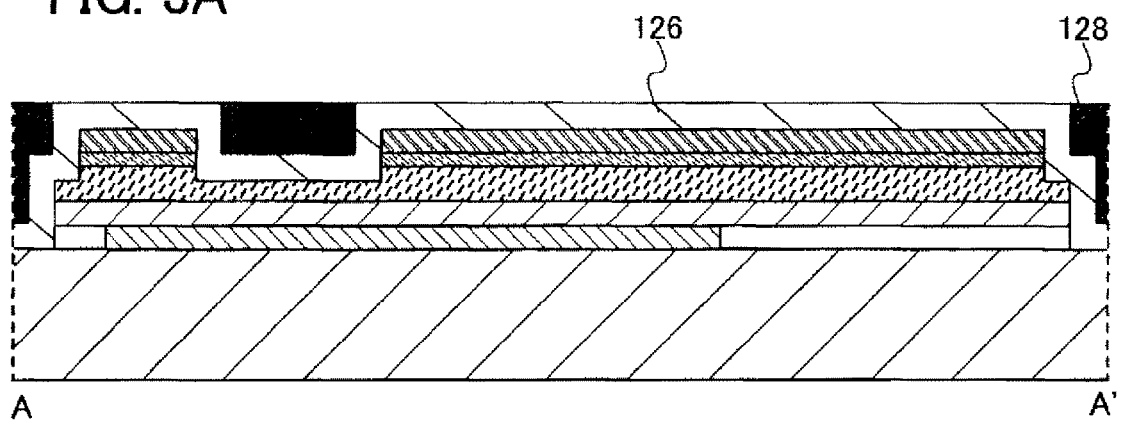
FIGS. 3A to 3C illustrate an example of a manufacturing method of a thin film transistor and a display device according to the present invention.
Figure 3B:
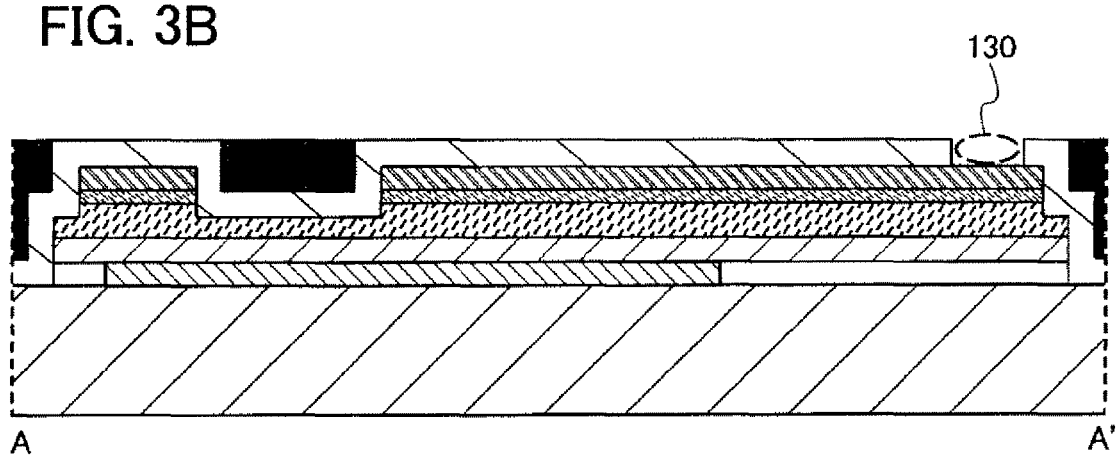
Figure 3C:
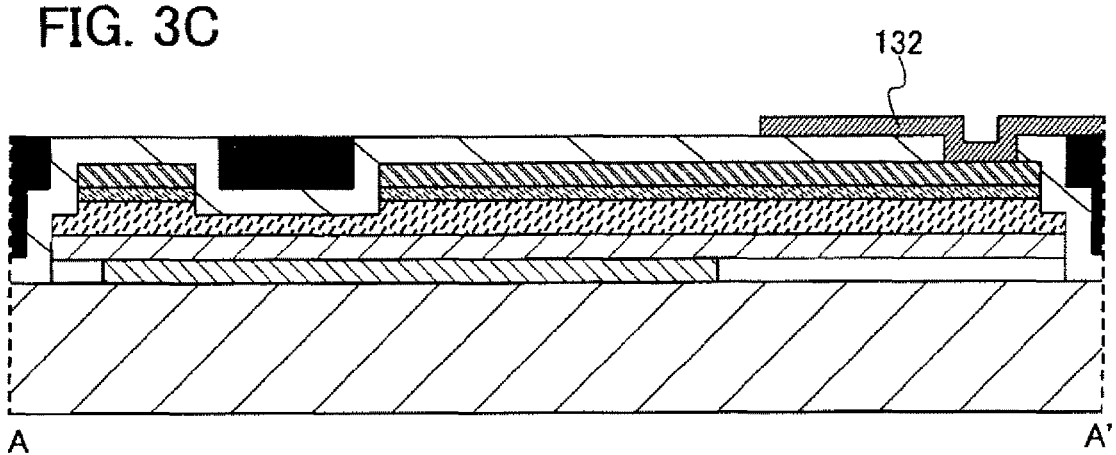
Figure 4A:
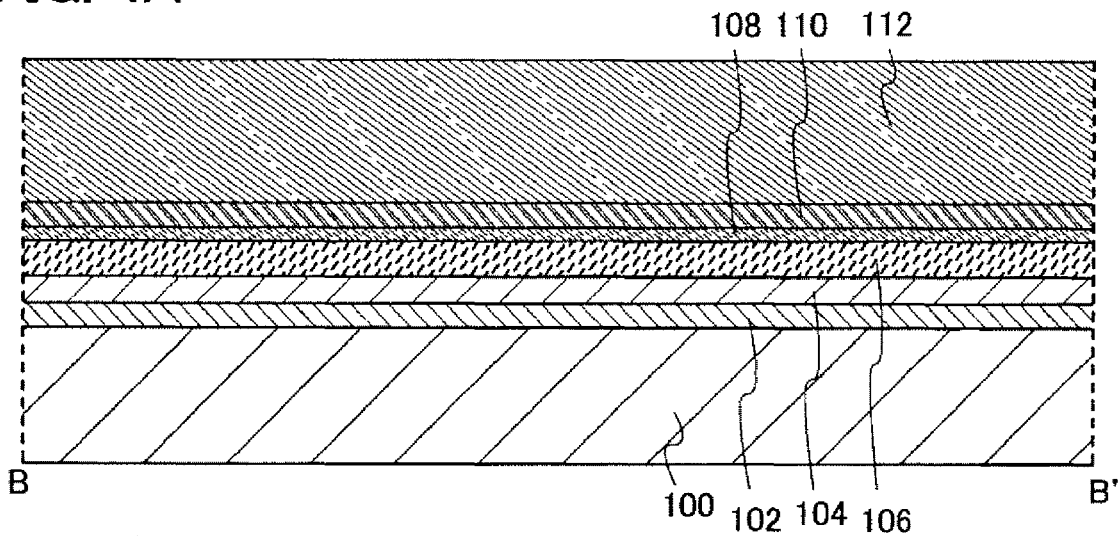
FIGS. 4A to 4C illustrate an example of a manufacturing method of a thin film transistor and a display device according to the present invention.
Figure 4B:
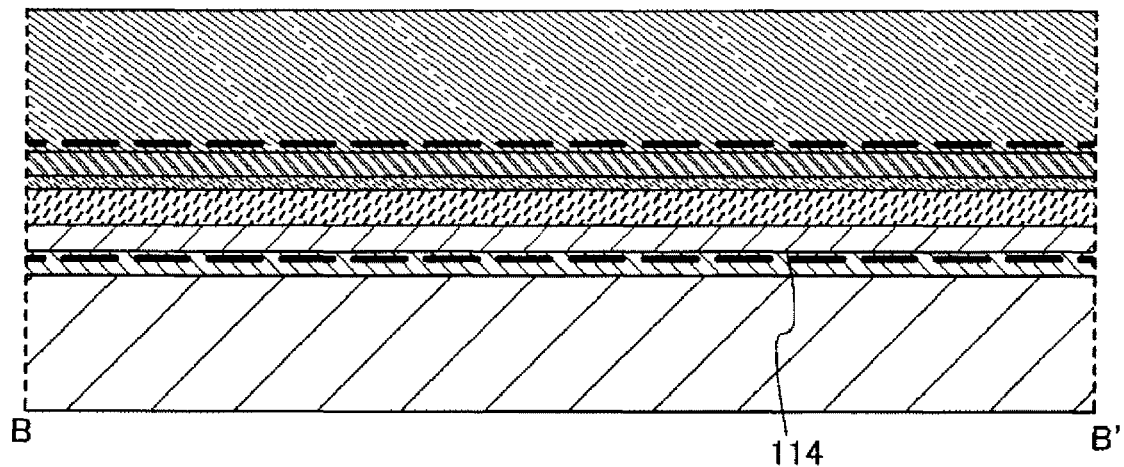
Figure 4C:
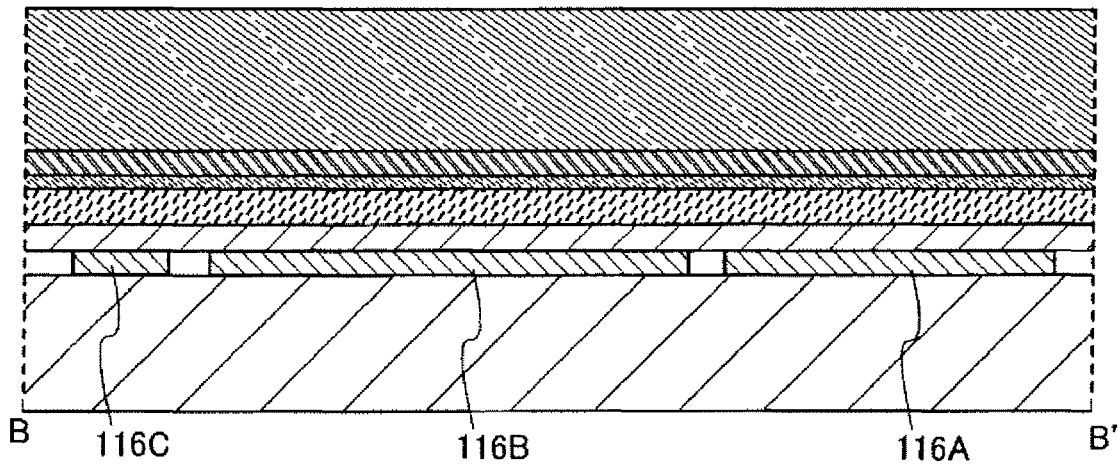
Figure 5A:
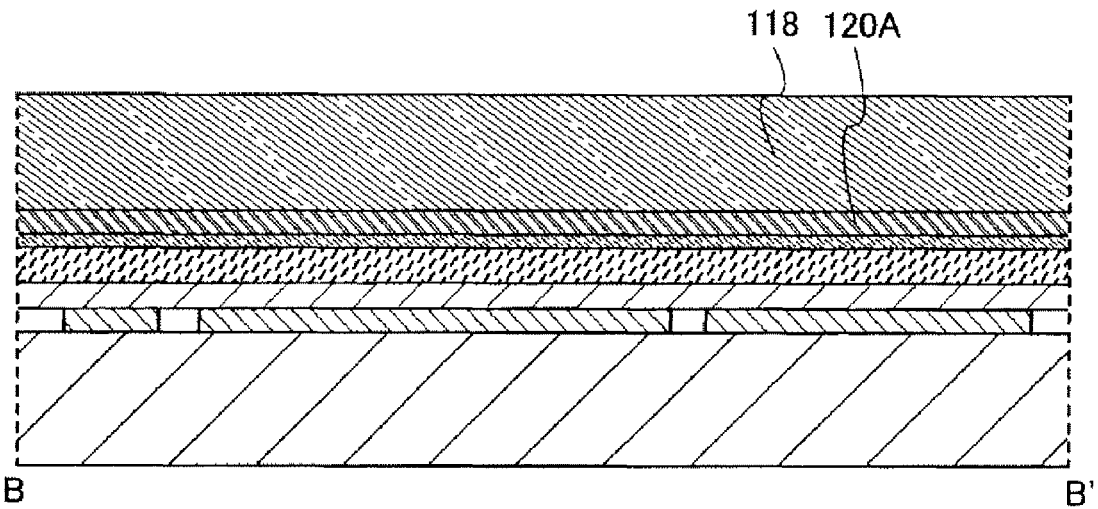
FIGS. 5A to 5C illustrate an example of a manufacturing method of a thin film transistor and a display device according to the present invention.
Figure 5B:
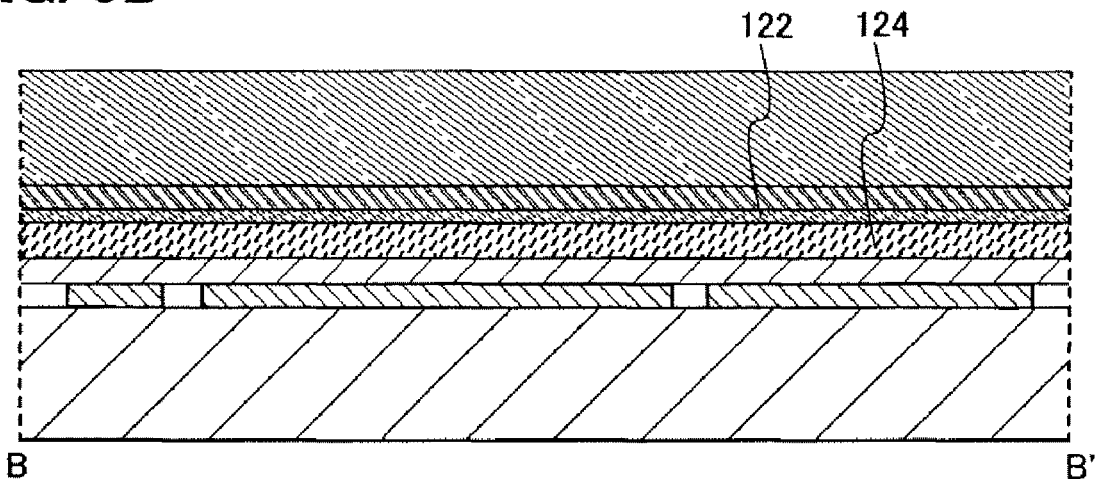
Figure 5C:
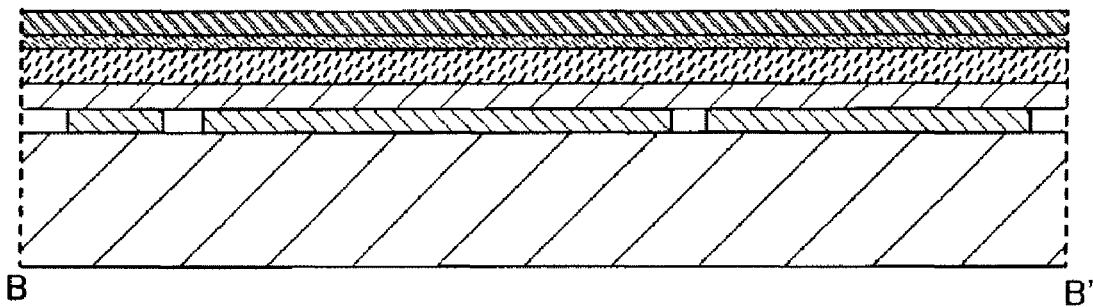

The thin film transistor manufactured using the manufacturing method of the present invention has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer (see FIG. 3C). With the cavity formed adjacent to the side surface of the gate electrode layer, a thin film transistor with low leakage current at an end portion of the gate electrode layer can be manufactured.

Here, a terminal connection portion of the active matrix substrate manufactured in the above-described steps will be described with reference to FIG. 22, FIG. 23, and FIGS. 24A to 24C.

Figure 22:
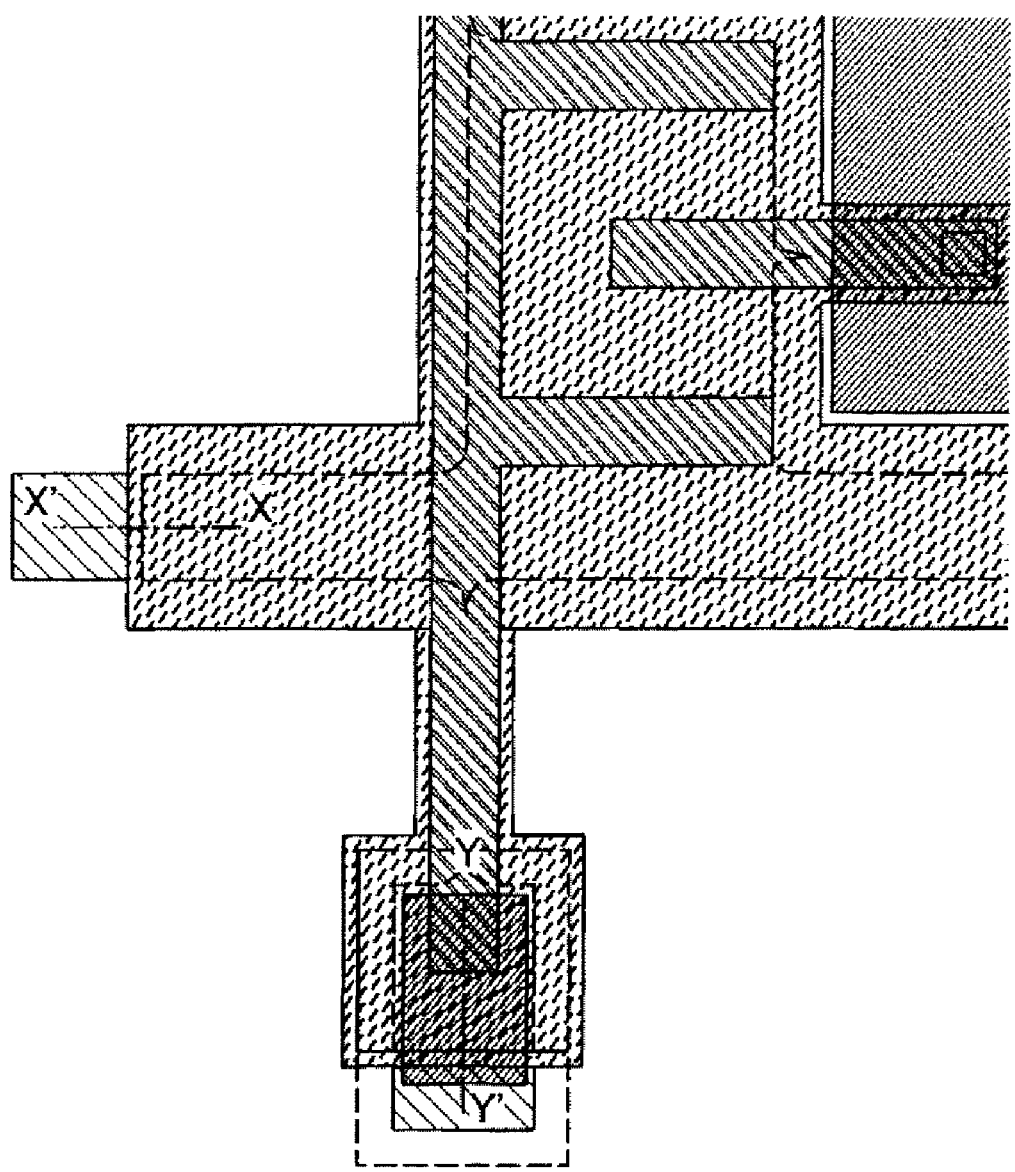
FIG. 22 illustrates a connection portion of an active matrix substrate obtained by applying a manufacturing method of the present invention is applied.

FIG. 22 is a plan view and FIG. 23 and FIGS. 24A to 24C are cross-sectional views of a terminal connection portion on the gate wiring side and a terminal connection portion on the source wiring side of the active matrix substrate manufactured in the above-described steps.

FIG. 22 is a plan view of the gate wiring and the source wiring which are extended from the pixel portion, in the terminal connection portion on the gate wiring side and the terminal connection portion on the source wiring side.

Figure 23:
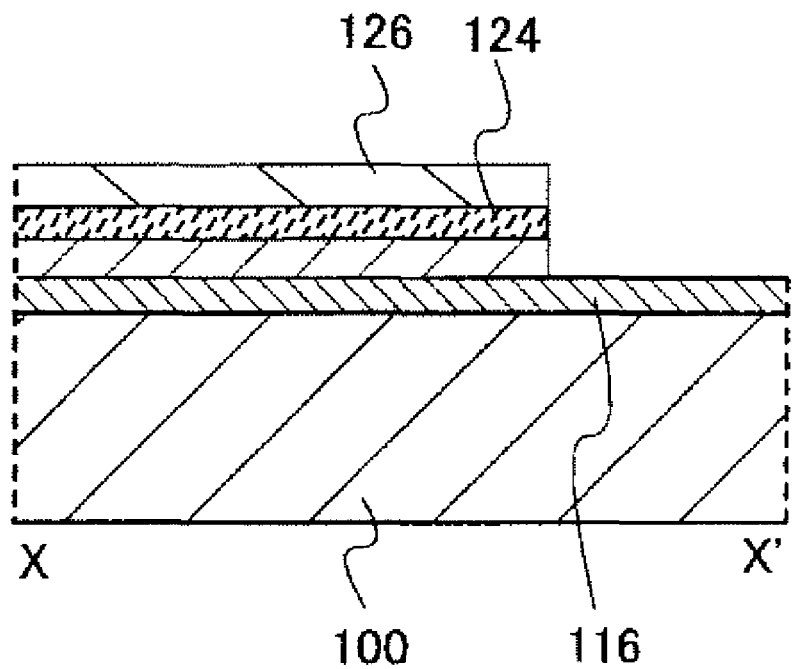
FIG. 23 illustrates a connection portion of an active matrix substrate obtained by applying a manufacturing method of the present invention is applied.

FIG. 23 is a cross-sectional view taken along line X-X' in FIG. 22. That is, FIG. 23 is a cross-sectional view of the terminal connection portion on the gate wiring side. In FIG. 23, only the gate electrode layer 116 is exposed. A terminal portion is connected to the region in which the gate electrode layer 116 is exposed.

Figure 24A:
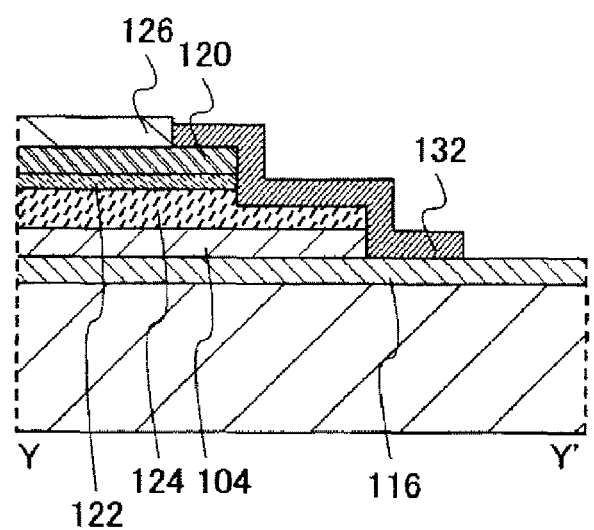
FIGS. 24A to 24C illustrate connection portions of active matrix substrates obtained by applying a manufacturing method of the present invention.
Figure 24B:
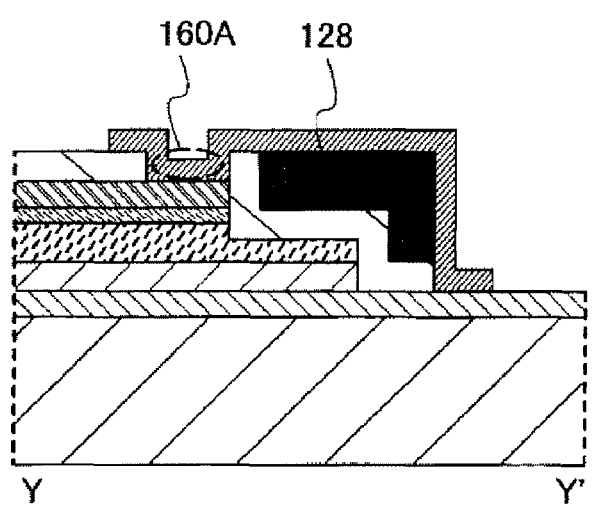
Figure 24C:
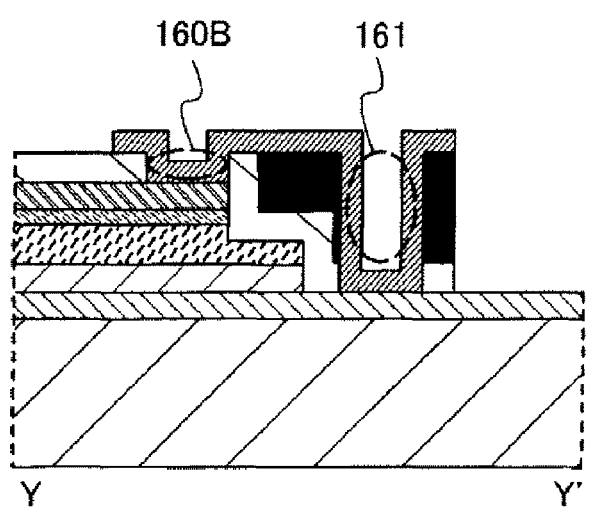

FIGS. 24A to 24C are cross-sectional views taken along line Y-Y' in FIG. 22. That is, FIGS. 24A to 24C are cross-sectional views of the terminal connection portion on the source wiring side. In the cross section along line Y-Y' illustrated in FIGS. 24A to 24C, the gate electrode layer 116 and the source/drain electrode layer 120 are connected to each other through the pixel electrode layer 132. FIGS. 24A to 24C illustrate various modes of connection between the gate electrode layer 116 and the source/drain electrode layer 120. Any of these modes or modes other than those illustrated in FIGS. 24A to 24C may be used for the terminal connection portion in a display device according to the present invention. With the structure in which the source/drain electrode layer 120 is connected to the gate electrode layer 116, the height of the terminal connection portion can be made almost uniform.

Note that the number of opening portions is not limited to that of opening portions in FIGS. 24A to 24C. Not only one opening portion but also a plurality of opening portions may be provided for one terminal. In the case where a plurality of opening portions are provided for one terminal, even when any of the opening portions is not formed favorably due to insufficient etching for forming the opening portion, electrical connection can be realized at the other opening portion. Further, even in the case where all the opening portions are formed without any problems, the contact area can be made larger and contact resistance can be reduced, which is preferable.

In FIG. 24A, electrical connection is realized in such a manner that an end portion of the protective film 126 is removed by etching or the like to expose the gate electrode layer 116 and the source/drain electrode layer 120, and the pixel electrode layer 132 is formed over the exposed region. The plan view illustrated in FIG. 22 corresponds to the plan view of FIG. 24A.

Note that the formation of the region in which the gate electrode layer 116 and the source/drain electrode layer 120 are exposed can be performed at the same time as the formation of the first opening portion 130 and the second opening portion 131.

In FIG. 24B, electrical connection is realized in such a manner that a third opening portion 160A is provided in the protective film 126, end portions of the first protective film 126 and the color filter layers 128 are removed by etching or the like to expose the gate electrode layer 116 and the source/drain electrode layer 120, and the pixel electrode layer 132 is formed over the exposed region.

Note that the formation of the third opening portion 160A and the formation of the region in which the gate electrode layer 116 is exposed can be performed at the same time as the formation of the first opening portion 130 and the second opening portion 131.

In FIG. 24C, electrical connection is realized in such a manner that a third opening portion 160B and a fourth opening portion 161 are provided in the protective film 126 and the color filter layers 128 to expose the gate electrode layer 116 and the source/drain electrode layer 120, and the pixel electrode layer 132 is formed over the exposed region. Here, end portions of the protective film 126 and the color filter layers 128 are removed by etching or the like similarly to FIGS. 24A and 24B, and this etched region is used as a terminal connection portion.

Note that the formation of the third opening portion 160B and the fourth opening portion 161 and the formation of the region in which the gate electrode layer 116 is exposed can be performed at the same time as the formation of the first opening portion 130 and the second opening portion 131.

Next, a method of manufacturing a liquid crystal display device using the above active matrix substrate will be described. That is, a cell process and a module process will be described. Note that the cell process and the module process are not particularly limited in the method of manufacturing a liquid crystal display device of the present invention.

In the cell process, the active matrix substrate manufactured in the above-described steps and a substrate opposite to the active matrix substrate (hereinafter referred to as a counter substrate) are attached to each other and liquid crystal is injected. First, a manufacturing method of the counter substrate will be briefly described below. Note that, although not mentioned, a film formed on the counter substrate may be in a single layer structure or a layered structure.

First, a light-blocking layer is formed over a substrate, and then, a rib is formed over the pixel electrode layer. Note that after the light-blocking layer is formed, an insulating film for improving planarity is formed before the electrode layer is formed. The formation of an insulating film for improving planarity improves planarity of a surface on which the electrode layer is formed; thus, orientation disorder of liquid crystal can be suppressed.

As the light-blocking layer, a film of a material having a light-blocking property is selectively formed. As the material having a light-blocking property, for example, an organic resin containing a black resin (carbon black) can be used. Alternatively, a film stack which includes a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, photolithography or the like is employed.

In the case where an insulating film for improving planarity is formed, it may be formed, for example, by spin coating or the like using a material of photosensitive polyimide, photosensitive acrylic, a photosensitive epoxy resin, or the like. Note that the present invention is not limited to these materials and the formation method.

The electrode layer can be formed in a similar manner to the pixel electrode layer 132 included in the active matrix substrate. Note that since selective formation is not necessary, the pixel electrode layer may be formed over the entire surface.

The rib formed over the electrode is an organic resin film formed with a pattern for the purpose of widening the viewing angle. Note that the rib does not need to be formed if not particularly necessary.

Further, before or after formation of the rib, a post spacer (columnar spacer) may be formed as a spacer. The post spacer means a structural object formed at a constant interval on the counter substrate in order to keep the gap between the active matrix substrate and the counter substrate uniform. In the case of using a bead spacer (spherical spacer), the post spacer need not be formed.

Next, an alignment film is formed on the active matrix substrate and the counter substrate. Formation of the alignment film is performed, for example, in such a manner that polyimide resin or the like is melted in an organic solvent; this solution is applied by a coating method, a spin coating method, or the like; and then the solution is dried and baked. The thickness of the formed alignment film is generally approximately equal to or greater than about 50 nm and equal to or less than about 100 μm. Rubbing treatment is performed on the alignment film to align liquid crystal molecules with a certain pretilt angle. The rubbing treatment is performed, for example, by rubbing an alignment film with a shaggy cloth such as a velvet.

Then, the active matrix substrate and the counter substrate are attached with a sealant. In the case where a post spacer is not provided on the counter substrate, a bead spacer may be dispersed in a desired region and attachment may be performed.

Next, a liquid crystal material is injected in a space between the active matrix substrate and the counter substrate, which are attached to each other. After injection of the liquid crystal material, an inlet for injection is sealed with an ultraviolet curing resin or the like. Alternatively, after dropping a liquid crystal material, the active matrix substrate and the counter substrate may be attached to each other.

Next, a polarizing plate is attached to both surfaces of a liquid crystal cell, which is formed by attachment of the active matrix substrate and the counter substrate. Thus, the cell process is finished.

Next, as the module process, a flexible printed circuit (FPC) is connected to an input terminal (in FIGS. 24A to 24C, the exposed region of the gate electrode layer 116) of the terminal portion. The FPC has a wiring formed of a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal connected to the wiring formed in the FPC, electrical connection therebetween is realized. Alternatively, after connection of the FPC, a polarizing plate may be attached to the active matrix substrate and the counter substrate. Through the above steps, a liquid crystal display device can be manufactured.

In accordance with the present invention, the number of steps for manufacturing a liquid crystal display device can be significantly reduced. This is because thin film transistors can be manufactured using one photomask (multi-tone mask).

Further, a color filter is used to improve planarity; thus, an insulating film or the like is not necessarily formed separately, which leads to reduction in the number of steps. Still further, unevenness caused by thin film transistors is reduced, so that planarity of the pixel electrode is improved and orientation disorder of liquid crystal can be suppressed.

In the present invention, the number of steps for manufacturing a thin film transistor can be significantly reduced without using a complicated method such as backside exposure, resist reflow, a lift-off method, or the like. Therefore, the number of steps for manufacturing a liquid crystal display device can be significantly reduced without using a complicated process.

Moreover, the number of steps for manufacturing a liquid crystal display device can be significantly reduced while electrical characteristics of the thin film transistor are maintained. Furthermore, manufacturing cost can be significantly reduced.

Embodiment Mode 2

In this embodiment mode, a manufacturing method of a thin film transistor and a manufacturing method of a display device according to the present invention, which are different from those of Embodiment Mode 1, will be described. Specifically, a manufacturing method of a thin film transistor which is similar to that in Embodiment Mode 1, without using a multi-tone mask will be described with reference to FIGS. 26A, 26B, and 26C, FIGS. 27A, 27B, and 27C, FIG. 28, FIG. 29, and FIG. 30.

Figure 1B:
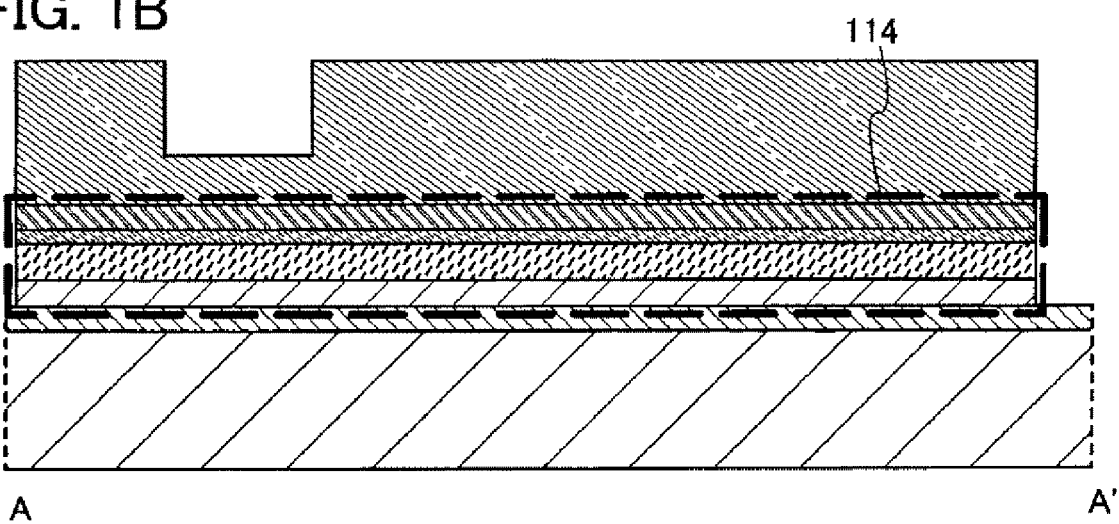
Figure 1C:
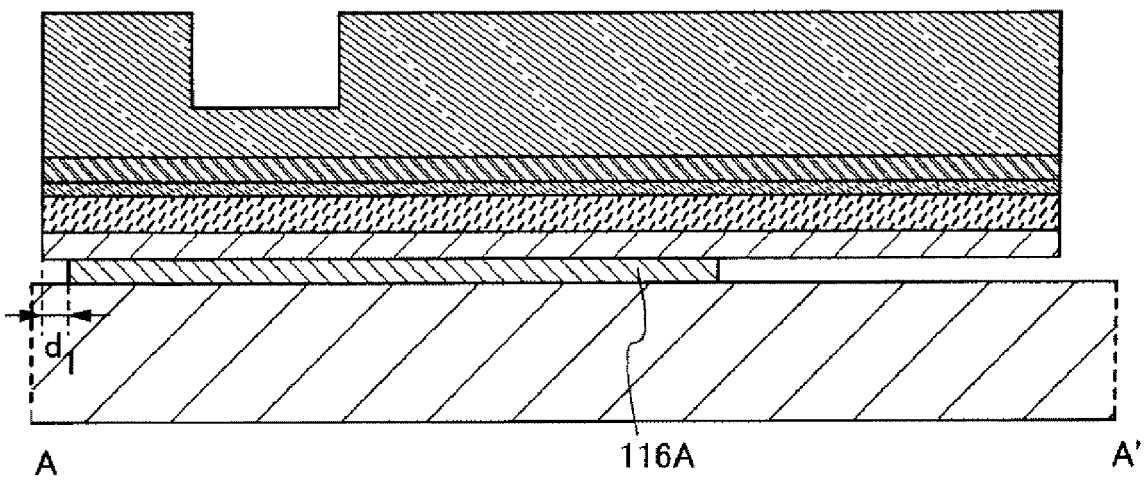
Figure 26A:
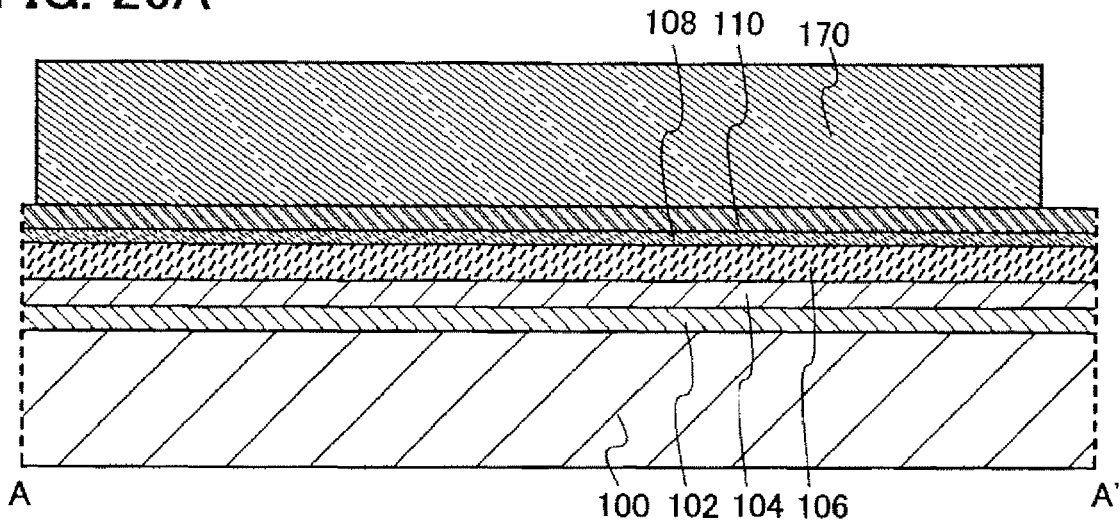
FIGS. 26A to 26C illustrate an example of a manufacturing method of a thin film transistor and a display device according to the present invention.
Figure 26B:
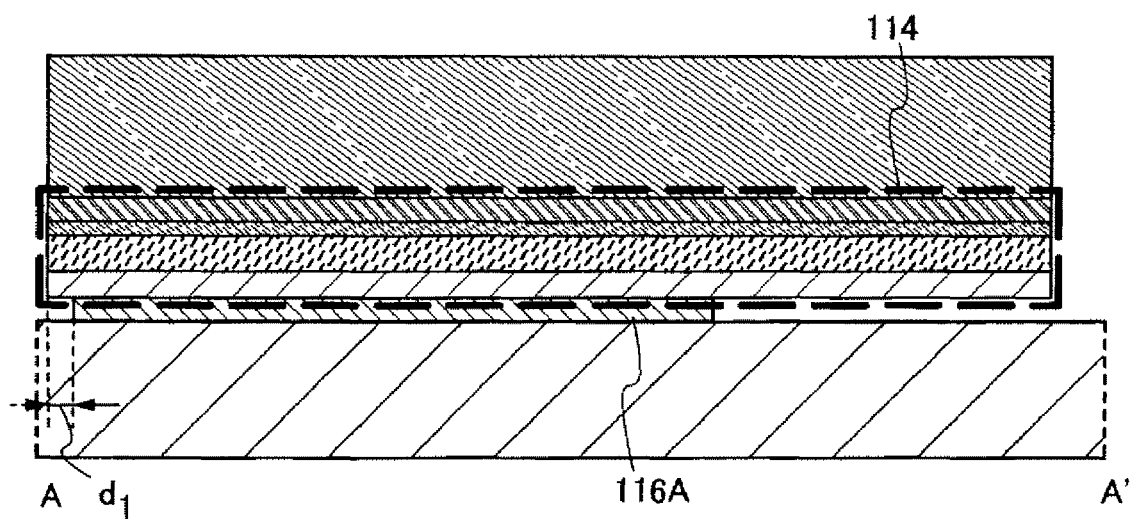
Figure 26C:
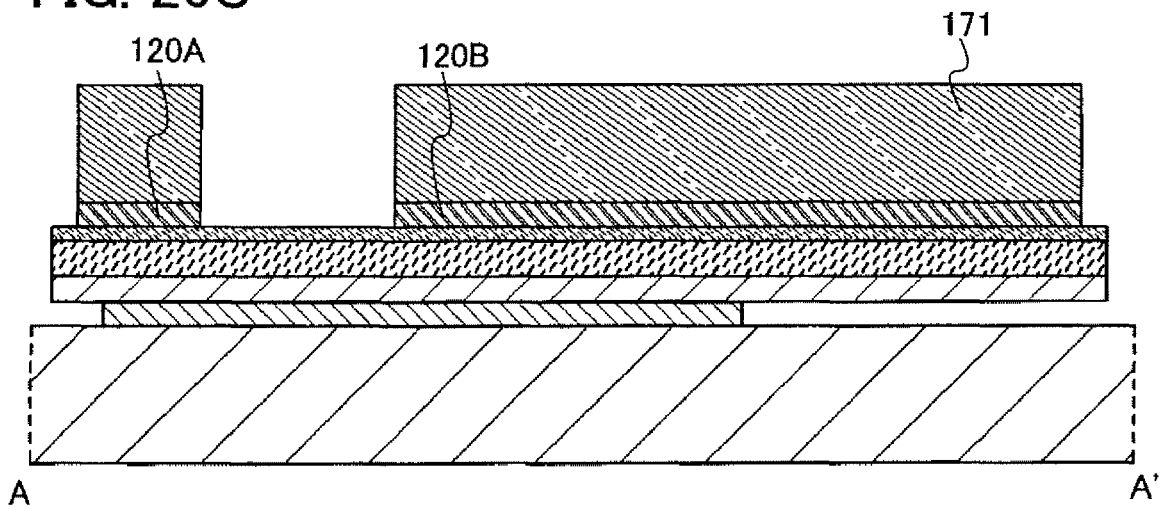
Figure 27A:
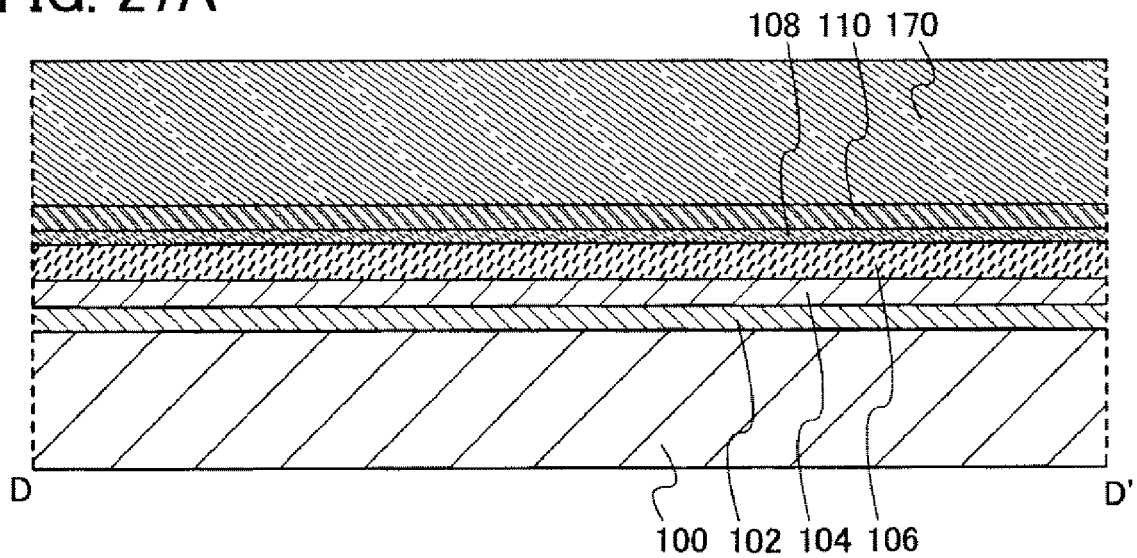
FIGS. 27A to 27C illustrate an example of a manufacturing method of a thin film transistor and a display device according to the present invention.
Figure 27B:
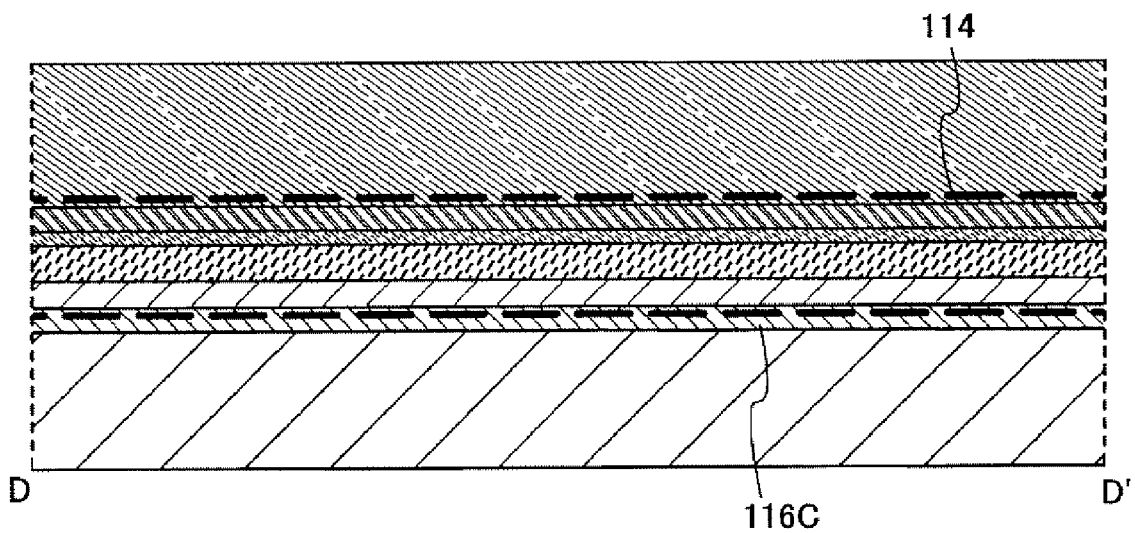
Figure 27C:
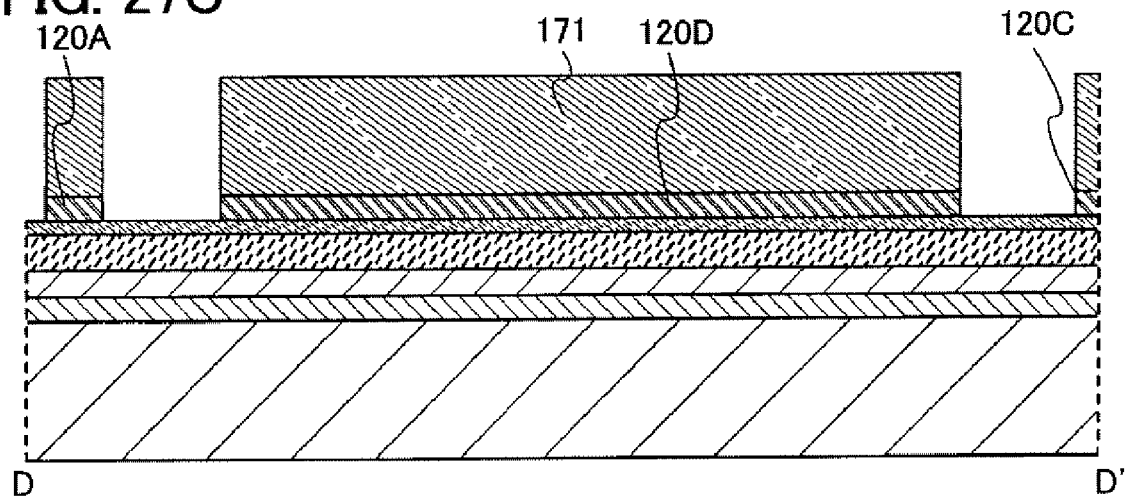
Figure 28:
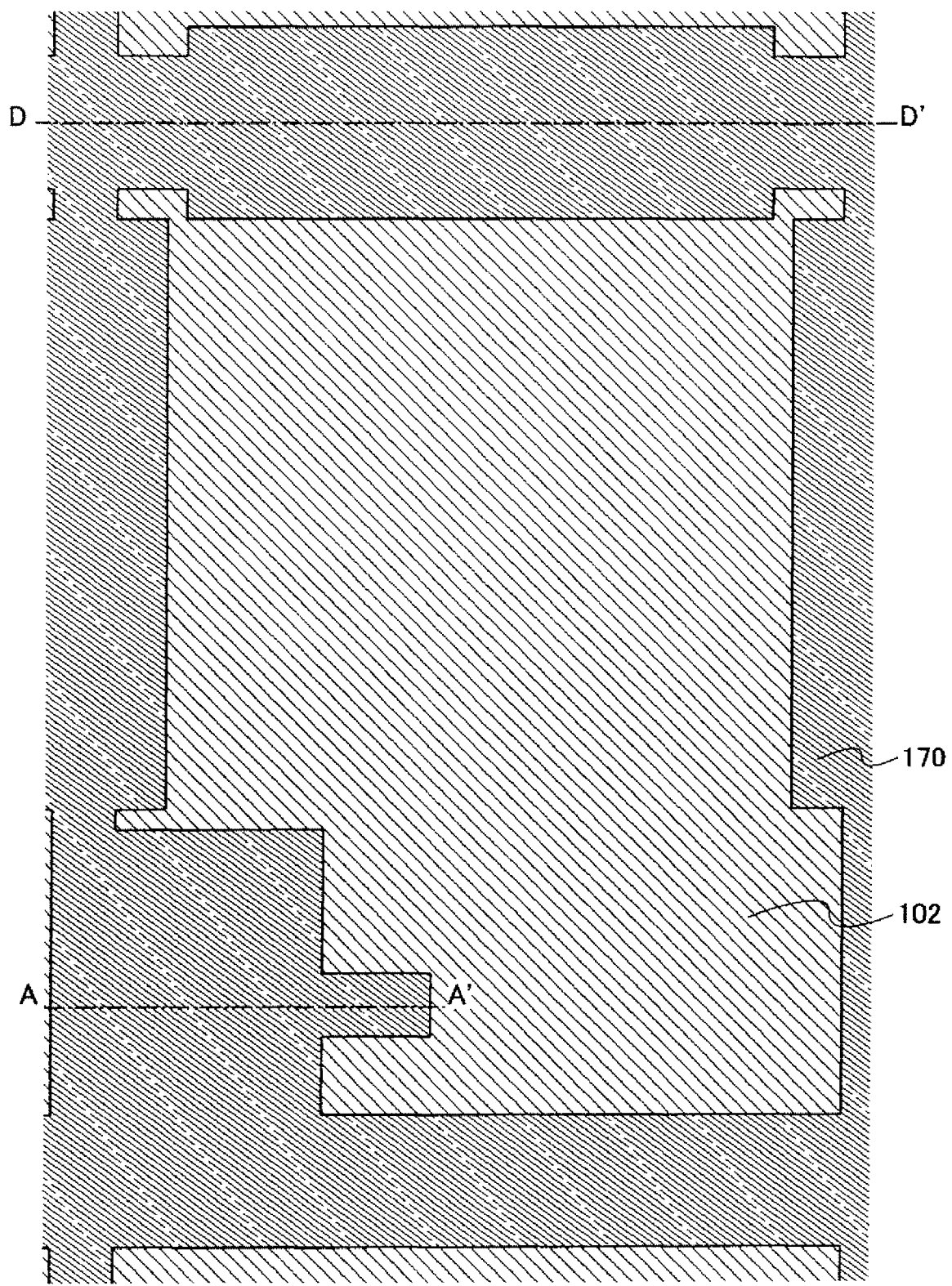
FIG. 28 illustrates an example of a manufacturing method of a thin film transistor and a display device according to the present invention.
Figure 29:
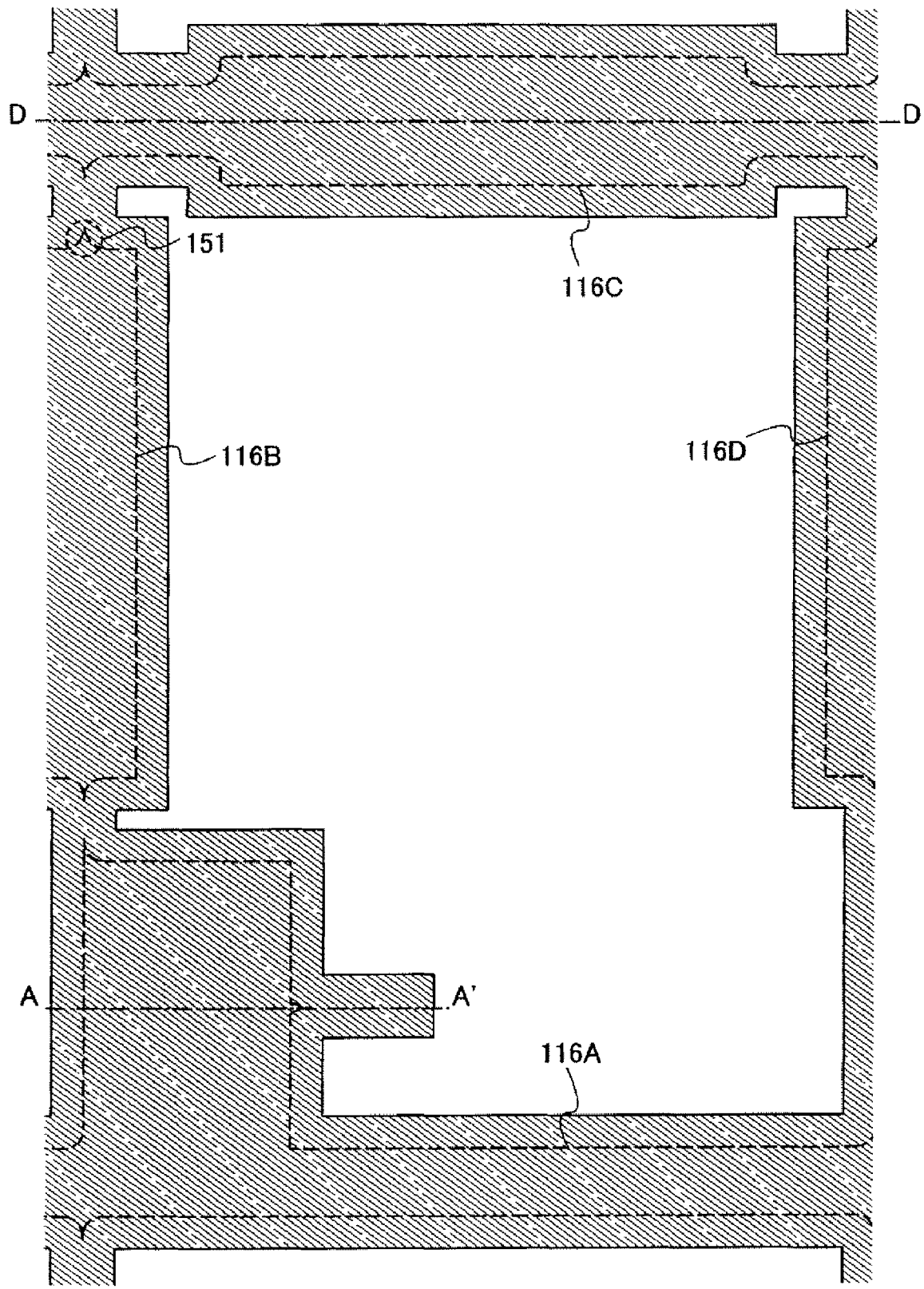
FIG. 29 illustrates an example of a manufacturing method of a thin film transistor and a display device according to the present invention.
Figure 30:
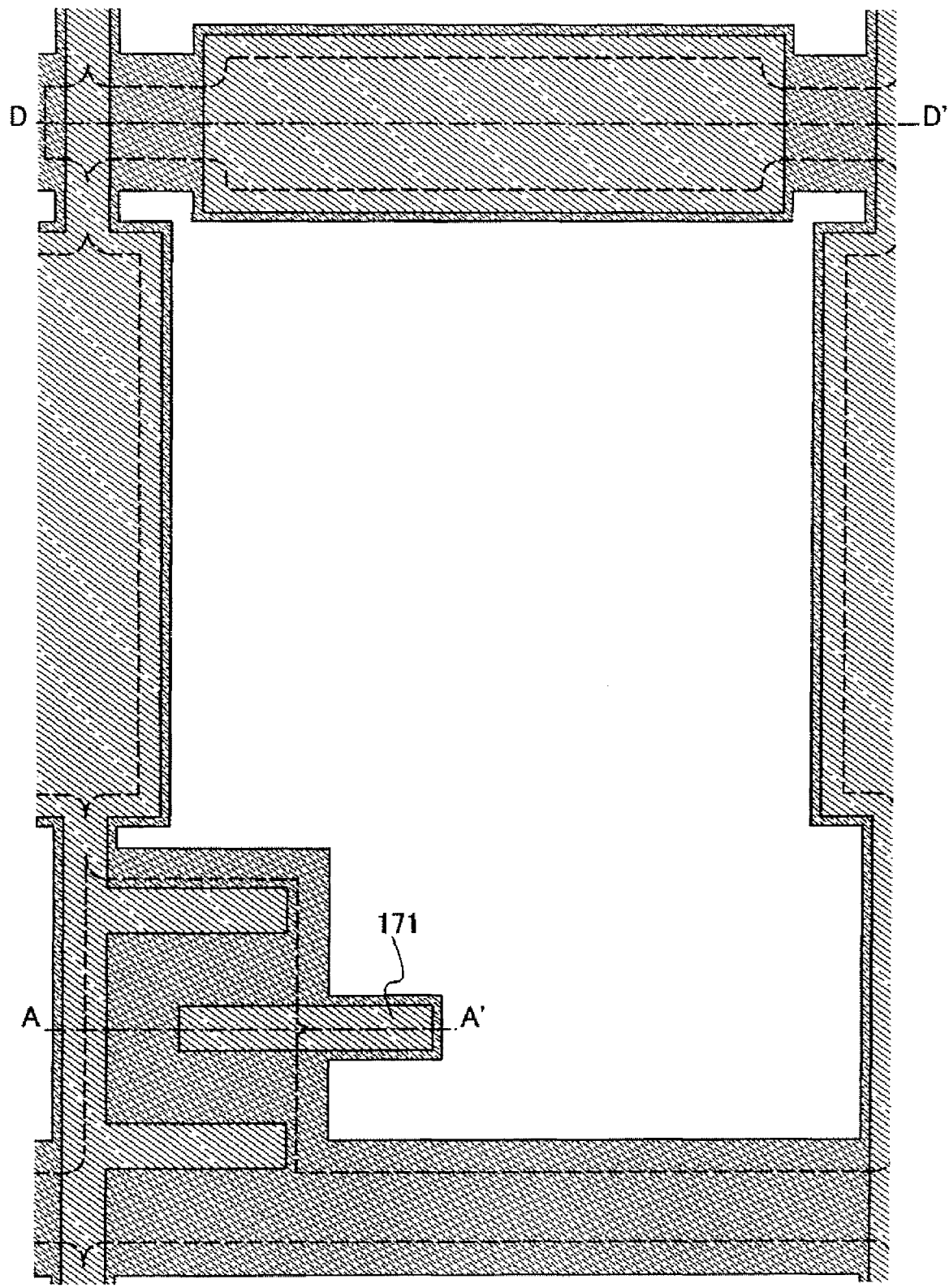
FIG. 30 illustrates an example of a manufacturing method of a thin film transistor and a display device according to the present invention.

FIGS. 26A, 26B, and 26C correspond to FIG. 1A, FIG. 1C, and FIG. 2A of Embodiment Mode 1. FIGS. 27A, 27B, and 27C correspond to FIG. 10A, FIG. 10C, and FIG. 11A of Embodiment Mode 1. FIG. 28, FIG. 29, and FIG. 30 correspond to FIG. 16, FIG. 17, and FIG. 18 of Embodiment Mode 1. The cross-sectional views taken along line A-A' illustrated in FIG. 28, FIG. 29, and FIG. 30 correspond to FIGS. 26A, 26B, and 26C, and the cross-sectional views taken along line D-D' illustrated in FIG. 28, FIG. 29, and FIG. 30 correspond to FIGS. 27A, 27B, and 27C.

First, similar to Embodiment Mode 1, a first conductive film 102, a first insulating film 104, a semiconductor film 106, an impurity semiconductor film 108, and a second conductive film 110 are formed over a substrate 100. Materials thereof and formation methods thereof are similar to those in Embodiment Mode 1.

Then, a first resist mask 170 is formed over the second conductive film 110 (see FIG. 26A and FIG. 27A). The first resist mask 170 is different from the first resist mask 112 of Embodiment Mode 1 and is formed so as to have an almost uniform thickness without a recessed portion being provided. That is, the first resist mask 170 is formed without using a multi-tone mask.

Next, first etching is performed using the first resist mask 170. That is, the first conductive film 102, the first insulating film 104, the semiconductor film 106, the impurity semiconductor film 108, and the second conductive film 110 are patterned by etching to form a thin film stack 114 over the first conductive film 102 (see FIG. 28).

Next, second etching is performed in a similar manner to Embodiment Mode 1 to form a gate electrode layer 116 (see FIG. 26C, FIG. 27C, and FIG. 29).

Here, the conditions of the second etching are similar to those of the second etching of Embodiment Mode 1. Then, after the second etching, the first resist mask 170 is removed.

Next, a second resist mask 171 is formed over the thin film stack 114, and a source/drain electrode layer 120 is formed using the second resist mask 171. The etching conditions or the like are similar to those of Embodiment Mode 1. Further, steps following this are similar to those of Embodiment Mode 1.

As described in this embodiment mode above, a thin film transistor can be manufactured without using a multi-tone mask. Accordingly, a liquid crystal display device can be manufactured. Note that the number of masks to be used is increased by one, as compared to that of Embodiment Mode 1.

Note that the manufacturing method of a thin film transistor and a manufacturing method of a display device according to this embodiment mode are similar to those of Embodiment Mode 1 except for the point described above. Therefore, effects similar to those offered by the manufacturing method of a thin film transistor and the manufacturing method of a display device of Embodiment Mode 1 can be naturally obtained; however, the number of masks used is increased by one. In other words, according to this embodiment mode, a thin film transistor can be manufactured using two photomasks. Accordingly, the number of photomasks to be used is reduced as compared to conventional methods, and the number of steps for manufacturing thin film transistors can be reduced. Further, the number of steps for manufacturing a liquid crystal display device can be reduced. Furthermore, thin film transistors and a liquid crystal display device can be manufactured with high yield at low cost.

Note that the thin film transistor manufactured using the manufacturing method of this embodiment mode has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer. With the cavity formed adjacent to the side surface of the gate electrode layer, a thin film transistor with low leakage current at an end portion of the gate electrode layer can be manufactured.

Embodiment Mode 3

In this embodiment mode, a manufacturing method of a thin film transistor and a manufacturing method of a liquid crystal display device according to the present invention, which are different from those of Embodiment Modes 1 and 2, will be described. Specifically, a mode in which a first conductive film 102 is etched by the first etching which is described in Embodiment Modes 1 and 2 will be described with reference to FIGS. 31A to 31C, FIGS. 32A to 32C, FIGS. 33A to 33C, FIGS. 34A to 34C, FIGS. 35A to 35C, and FIG. 36.

Figure 31A:
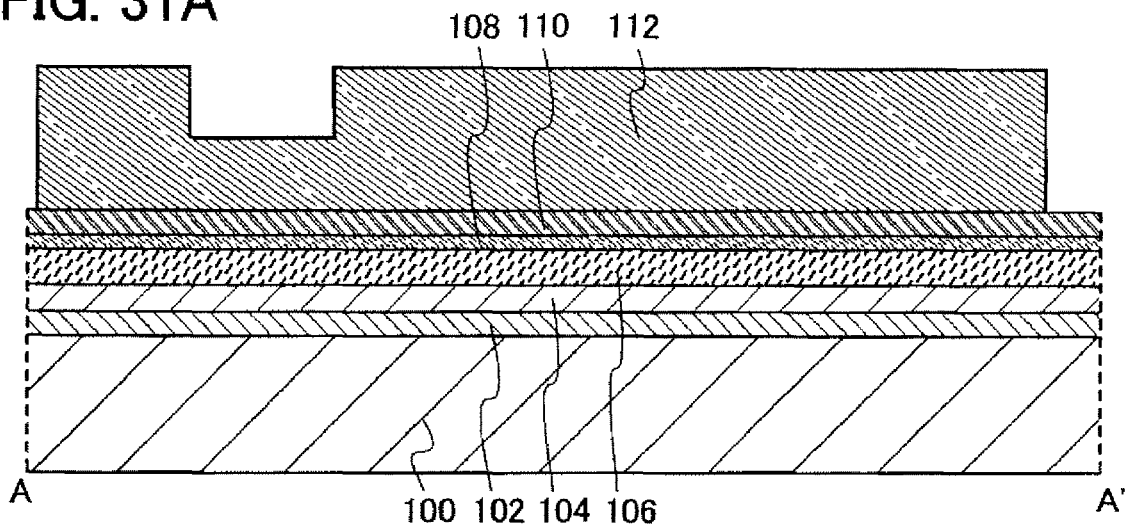
FIGS. 31A to 31C illustrate an example of a manufacturing method of a thin film transistor and a display device according to the present invention.
Figure 31B:
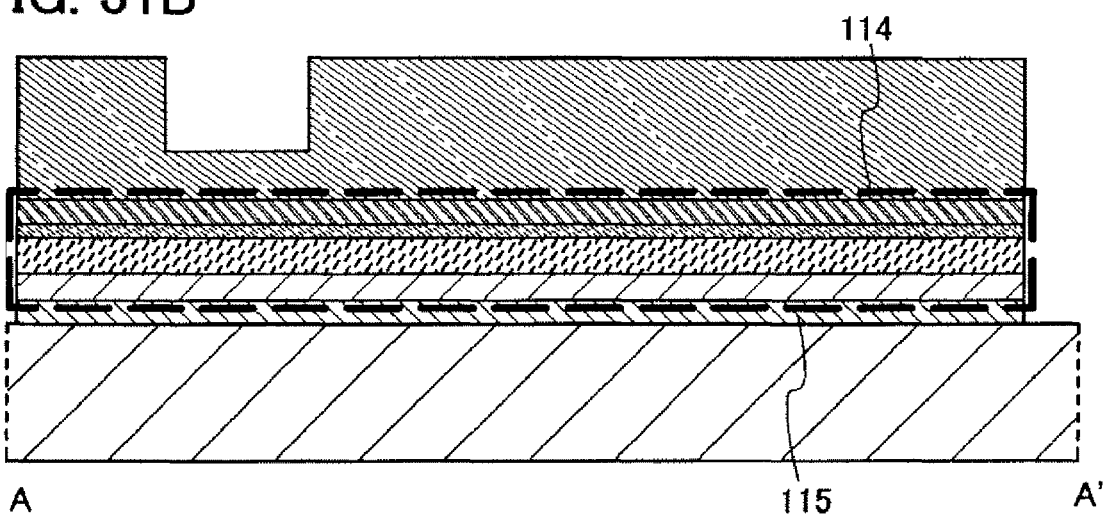
Figure 31C:
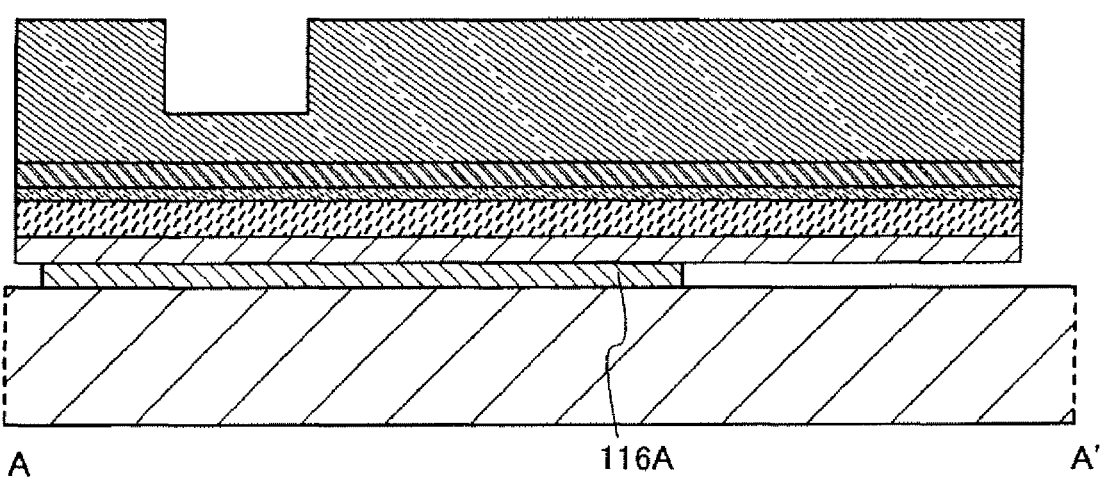
Figure 32A:
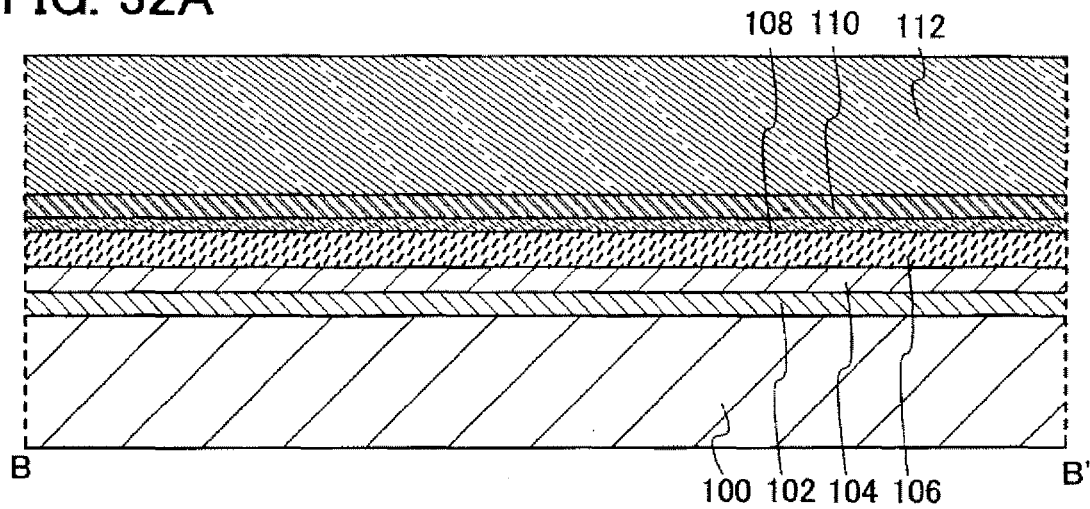
FIGS. 32A to 32C illustrate an example of a manufacturing method of a thin film transistor and a display device according to the present invention.
Figure 32B:
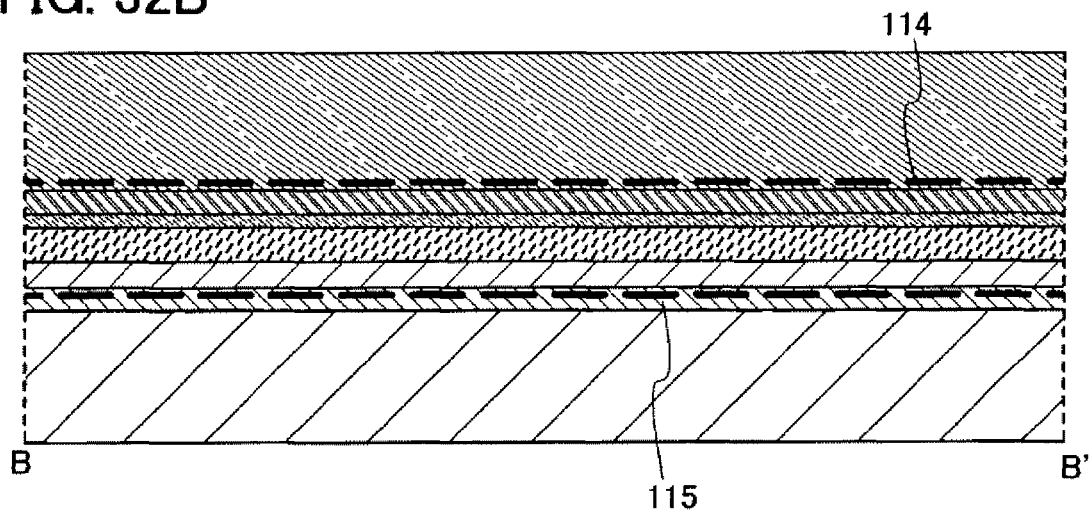
Figure 32C:
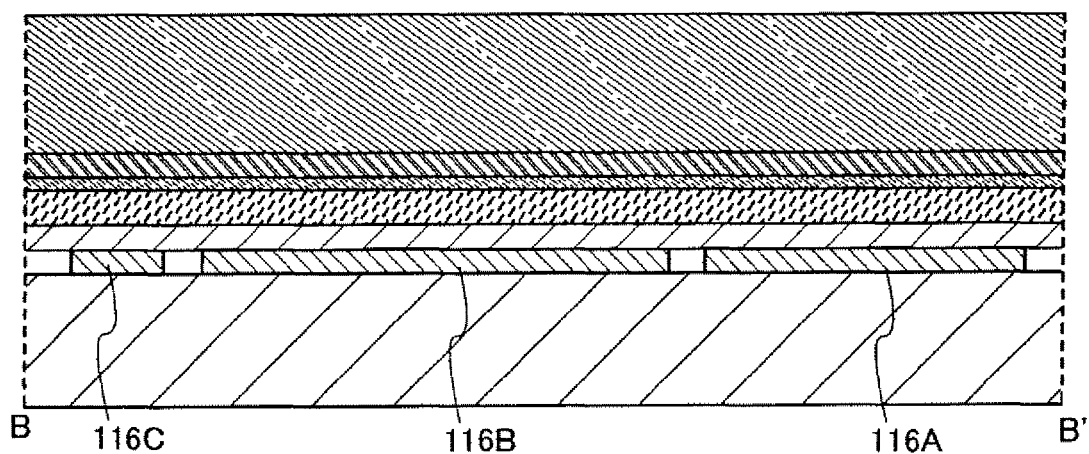
Figure 33A:
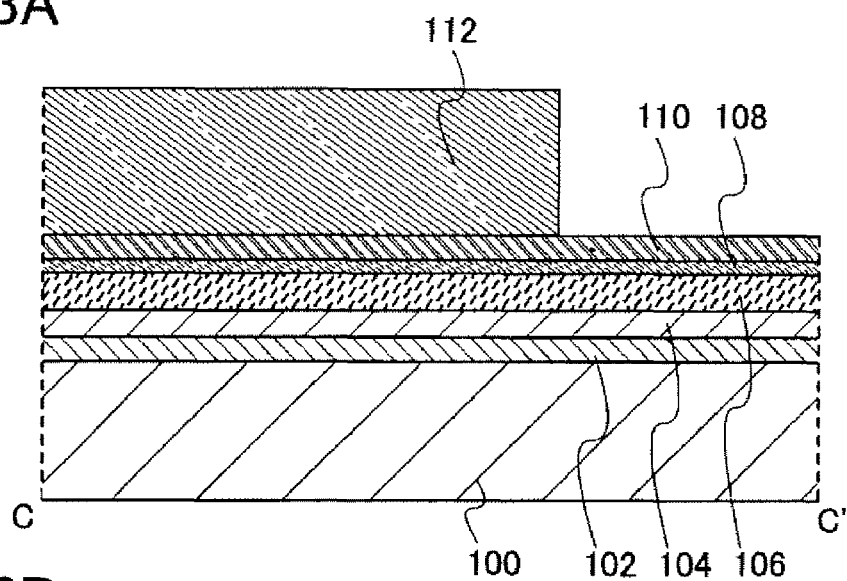
FIGS. 33A to 33C illustrate an example of a manufacturing method of a thin film transistor and a display device according to the present invention.
Figure 33B:
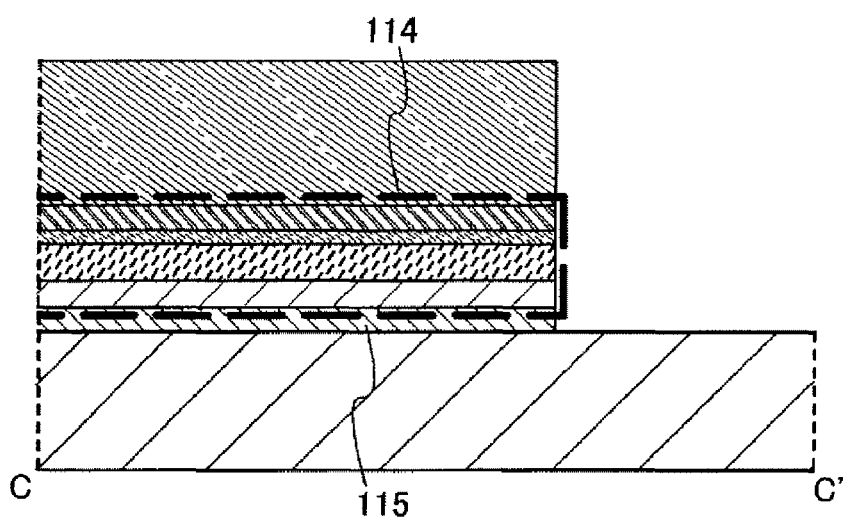
Figure 33C:
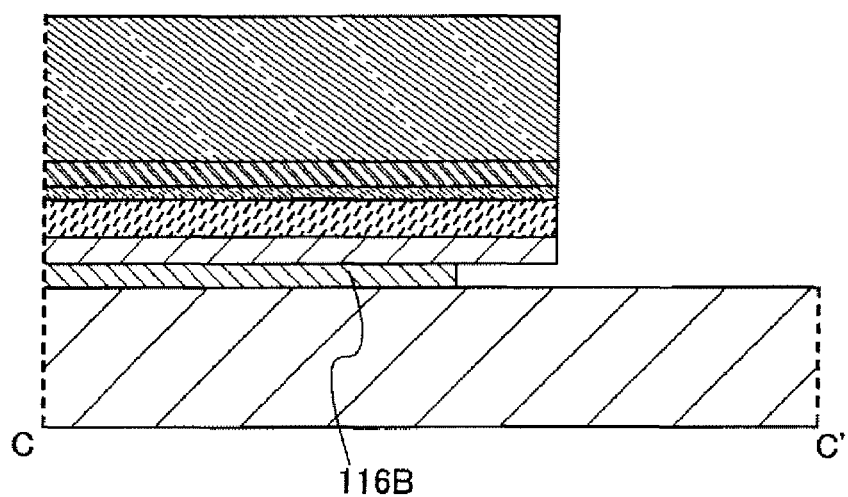
Figure 34A:
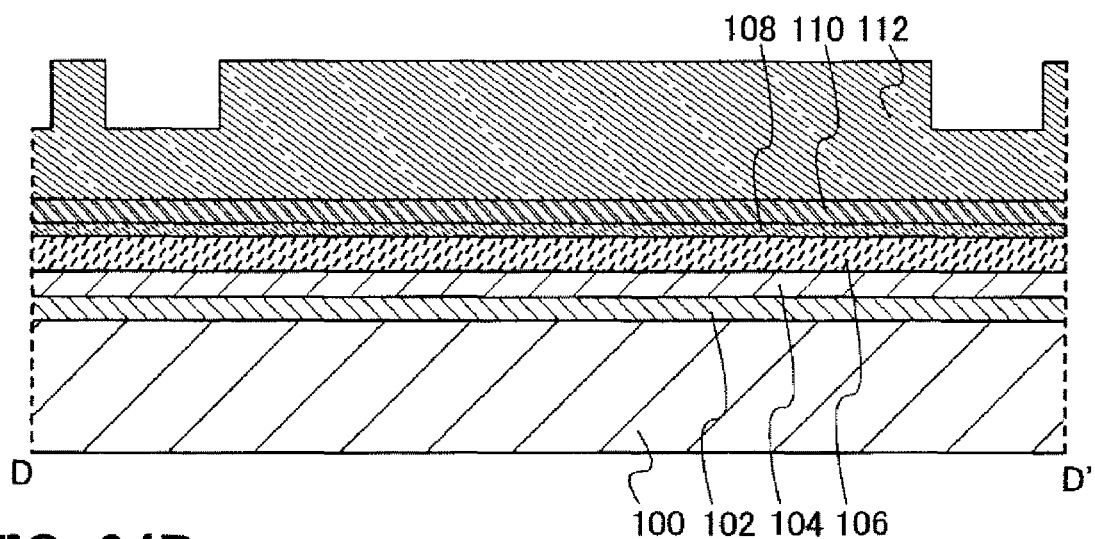
FIGS. 34A to 34C illustrate an example of a manufacturing method of a thin film transistor and a display device according to the present invention.
Figure 34B:
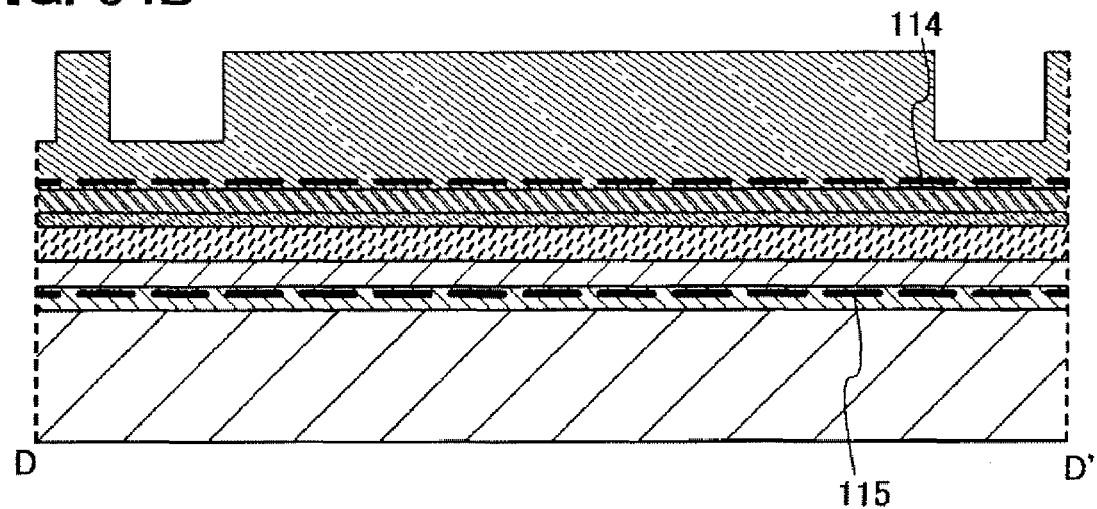
Figure 34C:
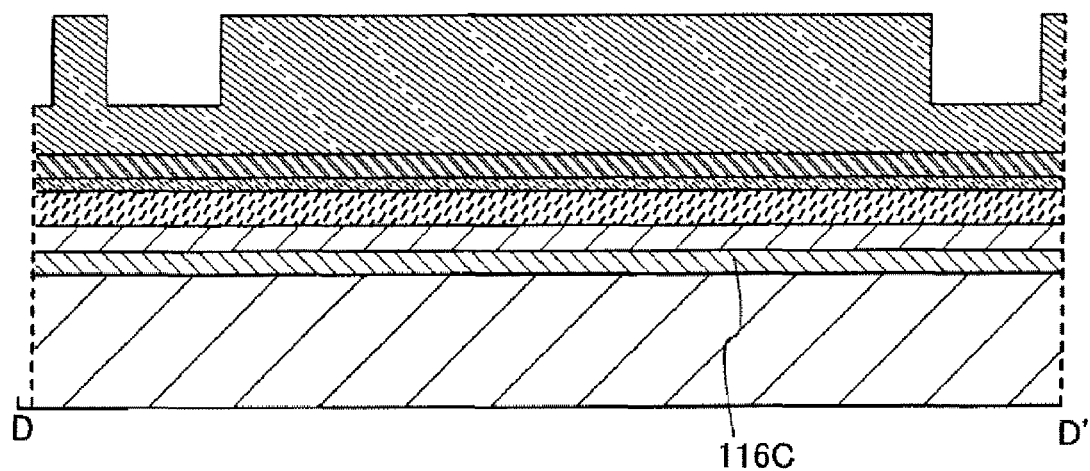
Figure 35A:
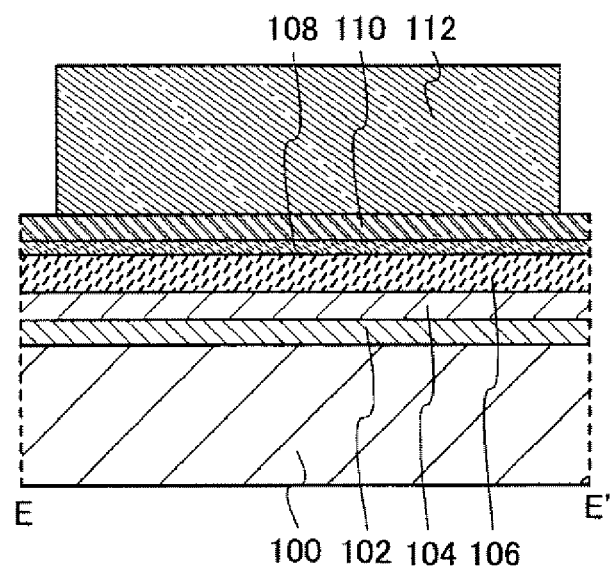
FIGS. 35A to 35C illustrate an example of a manufacturing method of a thin film transistor and a display device according to the present invention.
Figure 35B:
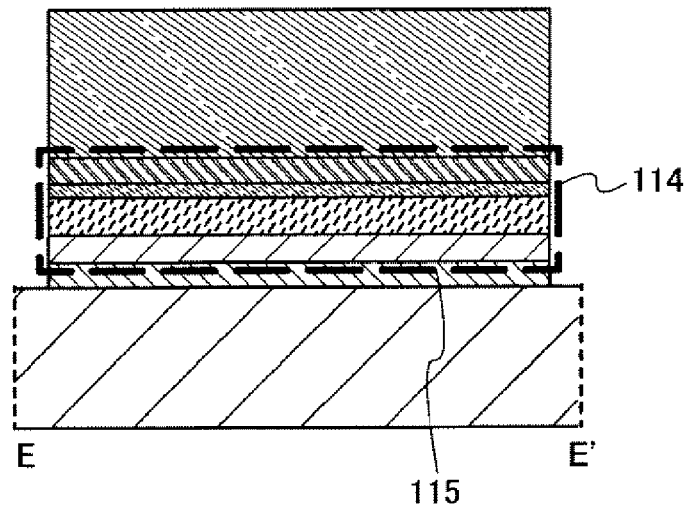
Figure 35C:
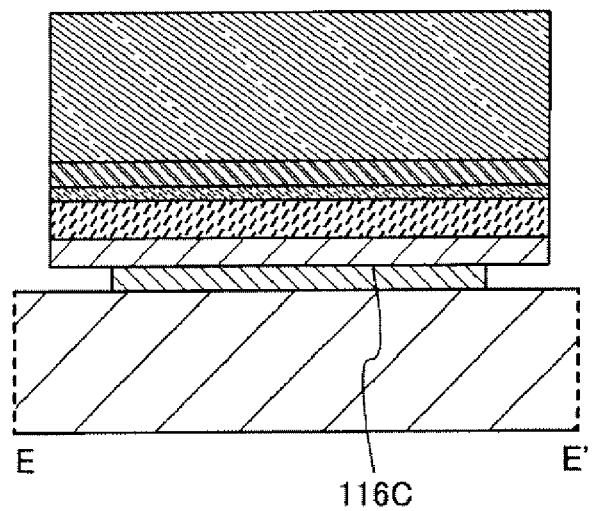
Figure 36:
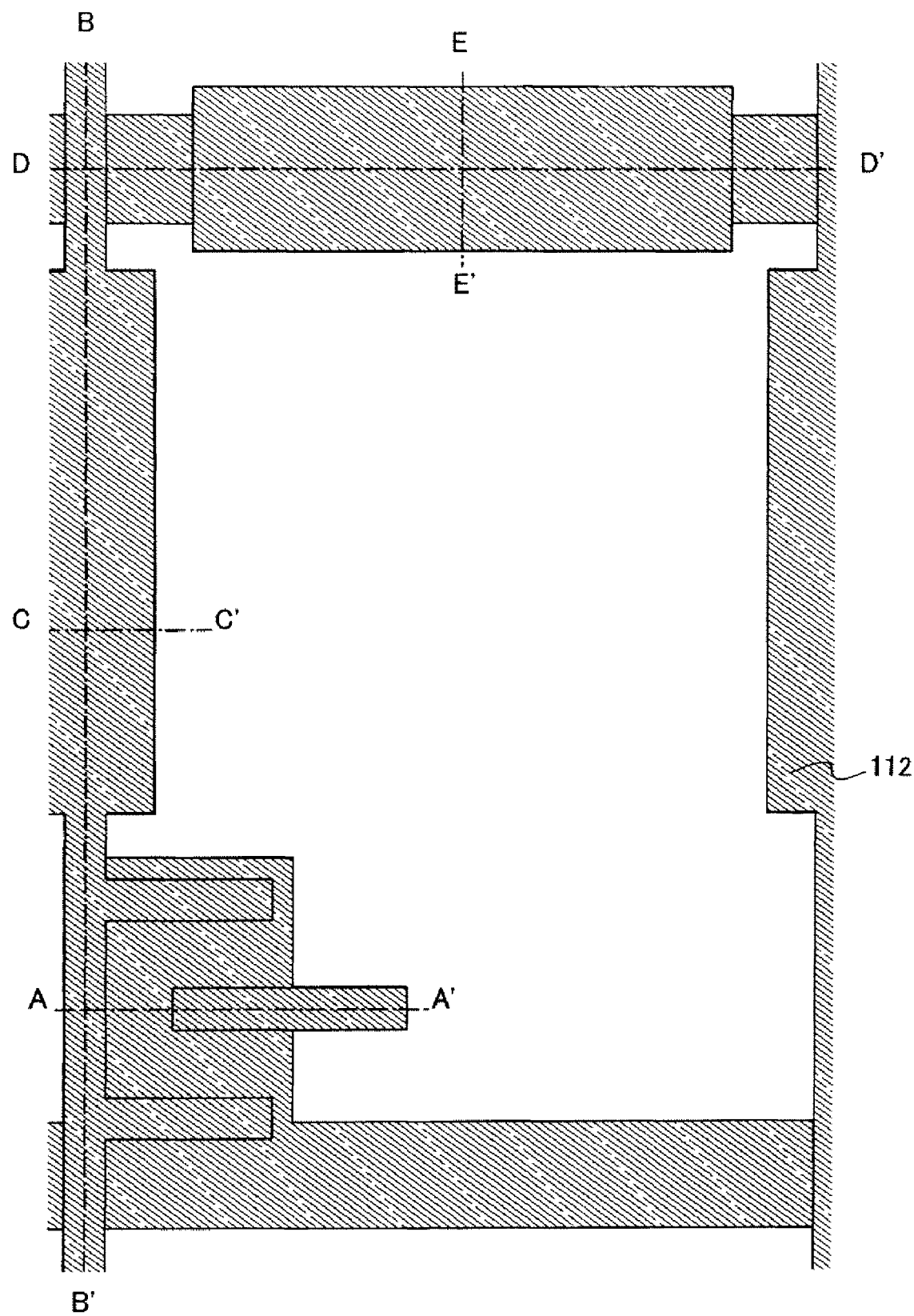
FIG. 36 illustrates an example of a manufacturing method of a thin film transistor and a display device according to the present invention.

FIGS. 31A to 31C correspond to FIGS. 1A to 1C of Embodiment Mode 1. FIGS. 32A to 32C correspond to FIGS. 4A to 4C of Embodiment Mode 1. FIGS. 33A to 33C correspond to FIGS. 7A to 7C of Embodiment Mode 1. FIGS. 34A to 34C correspond to FIGS. 10A to 10C of Embodiment Mode 1. FIGS. 35A to 35C correspond to FIGS. 13A to 13C of Embodiment Mode 1. FIG. 36 corresponds to FIG. 16 of Embodiment Mode 1.

First, similar to Embodiment Mode 1, a first conductive film 102, a first insulating film 104, a semiconductor film 106, an impurity semiconductor film 108, and a second conductive film 110 are formed over a substrate 100. Materials thereof and formation methods thereof are similar to those in Embodiment Mode 1.

Then, a first resist mask 112 is formed over the second conductive film 110 (see FIG. 31A, FIG. 32A, FIG. 33A, FIG.

34A, and FIG. 35A). The features of the first resist mask 112 are similar to those of Embodiment Mode 1.

Next, first etching is performed using the first resist mask 112. That is, the first conductive film 102, the first insulating film 104, the semiconductor film 106, the impurity semiconductor film 108, and the second conductive film 110 are patterned by etching to form a thin film stack 114 and an etched first conductive film 115 (see FIG. 31B, FIG. 32B, FIG. 33B, FIG. 34B, FIG. 35B, and FIG. 36).

As described above, this embodiment mode is different from Embodiment Mode 1 in that the first conductive film 102 is processed by the first etching so that the etched first conductive film 115 is formed.

Next, by second etching, the etched first conductive film 115 is processed into a gate electrode layer 116 (see FIG. 31C, FIG. 32C, FIG. 33C, FIG. 34C, and FIG. 35C).

Here, the conditions and the like of the second etching are similar to those of the second etching of Embodiment Mode 1, except for the following point.

In Embodiment Mode 1, the region that should be removed of the first conductive film 102 needs to be completely removed only by the second etching. Note that the region that should be removed of the first conductive film 102 means a region other than the region where the gate electrode layer 116 is formed.

Here, the distance $d_1$ between the side surface of the thin film stack 114 and the side surface of the gate electrode layer 116 depends on the thickness of the first conductive film 102. The second etching is etching in which side etching is performed and is almost isotropic etching (so-called chemical etching). Therefore, in the method described in Embodiment Mode 1, in the case where the distance $d_1$ is made smaller than the thickness of the first conductive film 102, it is difficult to completely remove the region of the first conductive film 102, which should be removed.

On the other hand, as described above, the first conductive film 115 is formed by processing the first conductive film 102 by the first etching and the gate electrode layer 116 is formed by the second etching; thus, the distance $d_1$ can be made smaller than the thickness of the first conductive film 102. That is, the distance $d_1$ can be controlled independently of the thickness of the first conductive film 102, thereby increasing layout design flexibility.

Note that steps following the second etching are similar to those of Embodiment Mode 1. That is, by combining the method described in Embodiment Mode 1 with the method described in this embodiment mode, a thin film transistor can be manufactured. Specifically, thin film transistors are manufactured using one photomask by forming a gate electrode layer by side etching, and further, forming a source/drain electrode layer using a multi-tone mask.

As described above in this embodiment mode, the first conductive film 102 is processed by the first etching; thus, the distance $d_1$ between the side surface of the thin film stack 114 and the side surface of the gate electrode layer 116 can be designed independently of the thickness of the first conductive film 102, thereby increasing the freedom of layout design.

Note that the manufacturing method of a thin film transistor and a manufacturing method of a liquid crystal display device according to this embodiment mode are similar to those of Embodiment Mode 1 except for the point described above. Therefore, effects similar to the manufacturing method of a thin film transistor and a manufacturing method of a display device of Embodiment Mode 1 can be obtained naturally.

Note that this embodiment mode may be implemented in combination with Embodiment Mode 2.

Embodiment Mode 4

In this embodiment mode, a manufacturing method of thin film transistor and a manufacturing method of a liquid crystal display device according to the present invention, which have a feature in a method for manufacturing color filter layers will be described. Specifically, an embodiment of selectively forming color filters in a manufacturing process of color filter layers, which has been described in Embodiment Mode 1 to Embodiment Mode 3, or the like, by a printing method or an ink-jet method will be described with reference to FIGS. 37A, 37B, and 37C, and FIGS. 38A and 38B.

Figure 6A:
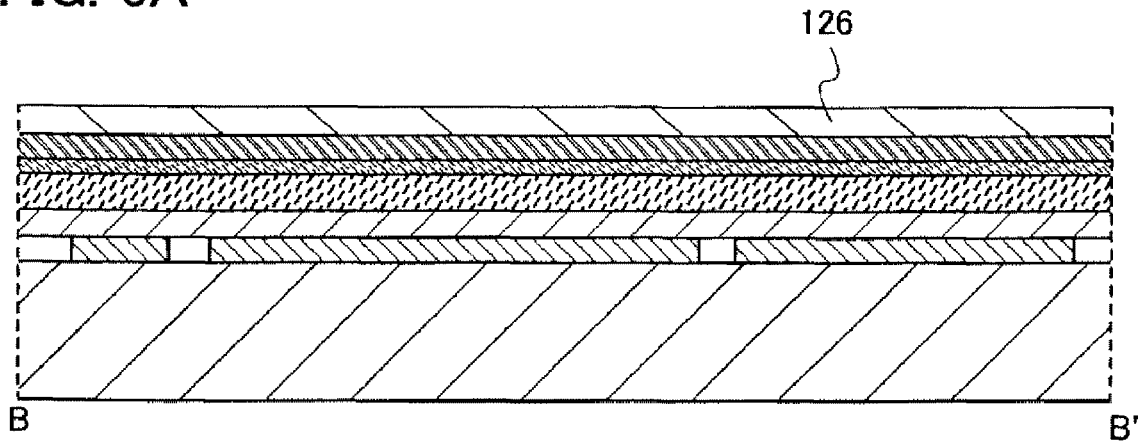
FIGS. 6A to 6C illustrate an example of a manufacturing method of a thin film transistor and a display device according to the present invention.
Figure 6B:
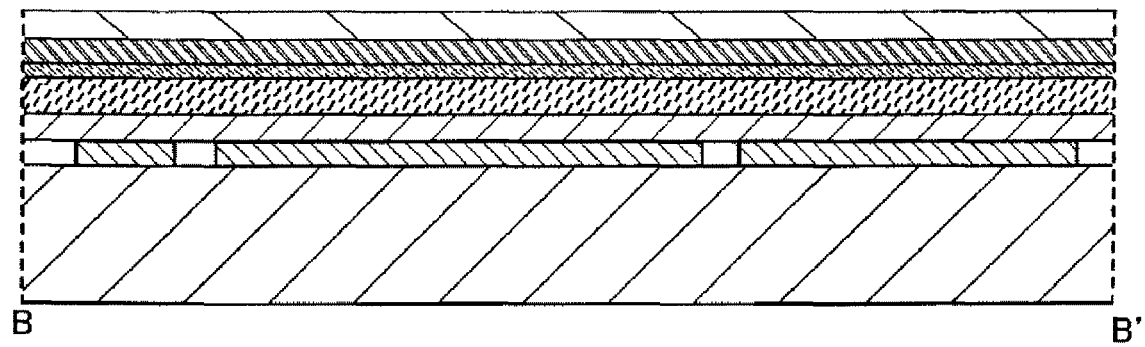
Figure 6C:
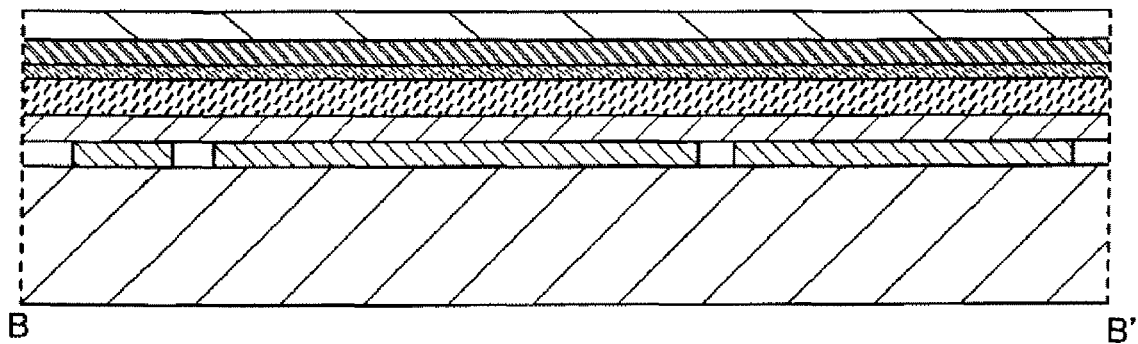
Figure 7A:
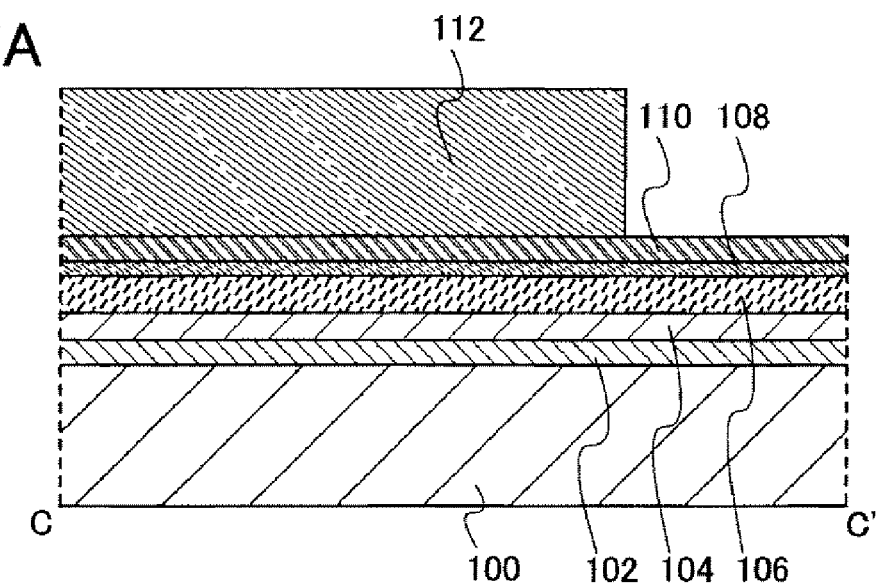
FIGS. 7A to 7C illustrate an example of a manufacturing method of a thin film transistor and a display device according to the present invention.
Figure 7B:
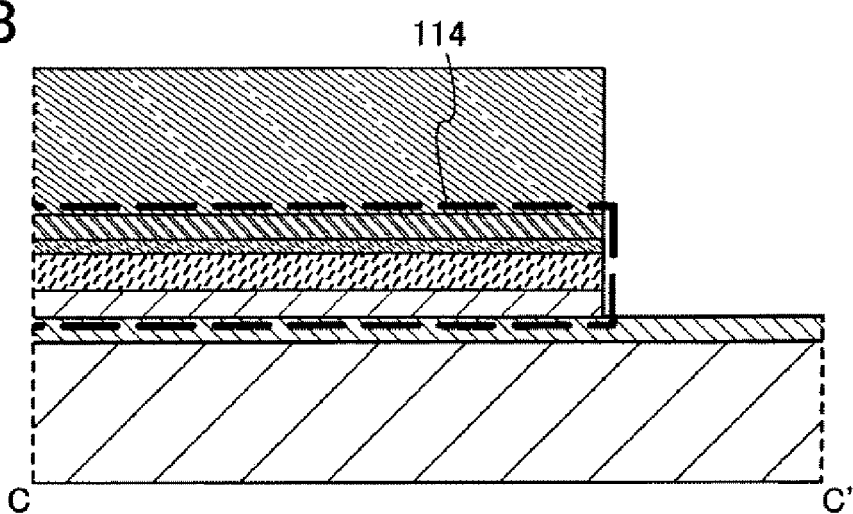
Figure 7C:
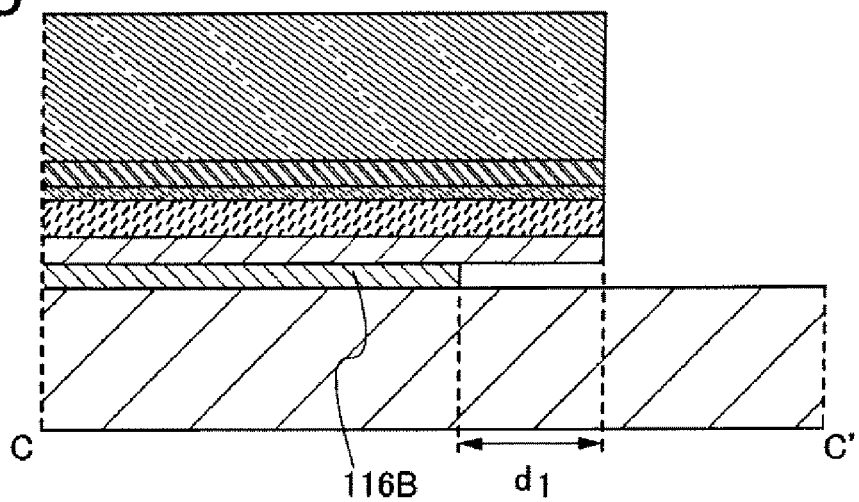
Figure 8A:
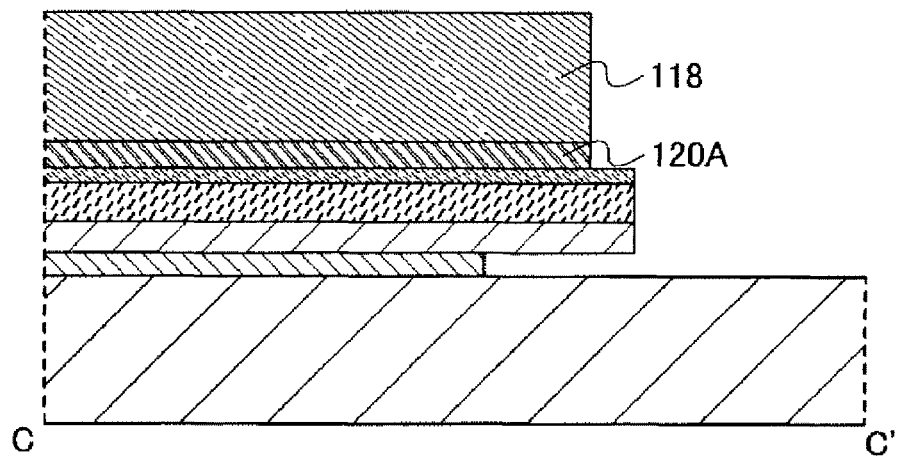
FIGS. 8A to 8C illustrate an example of a manufacturing method of a thin film transistor and a display device according to the present invention.
Figure 8B:
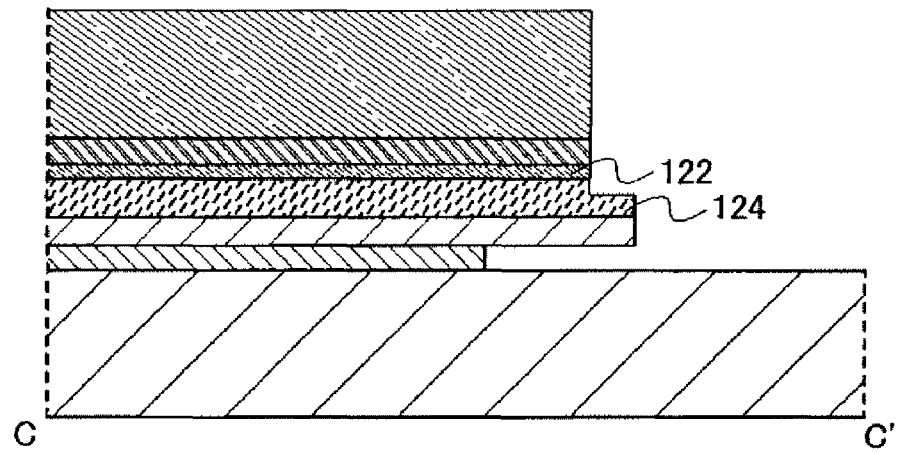
Figure 8C:
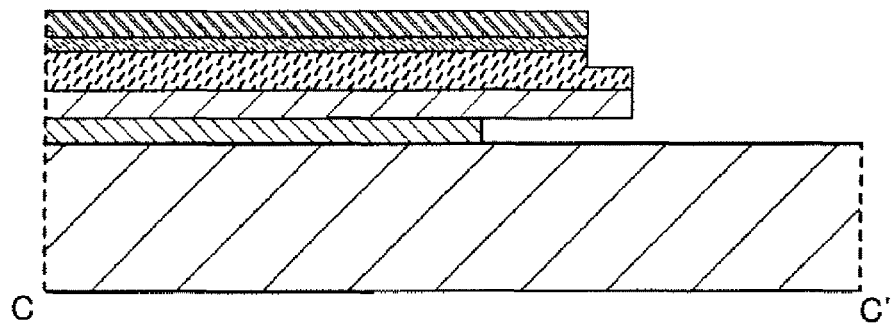
Figure 9A:
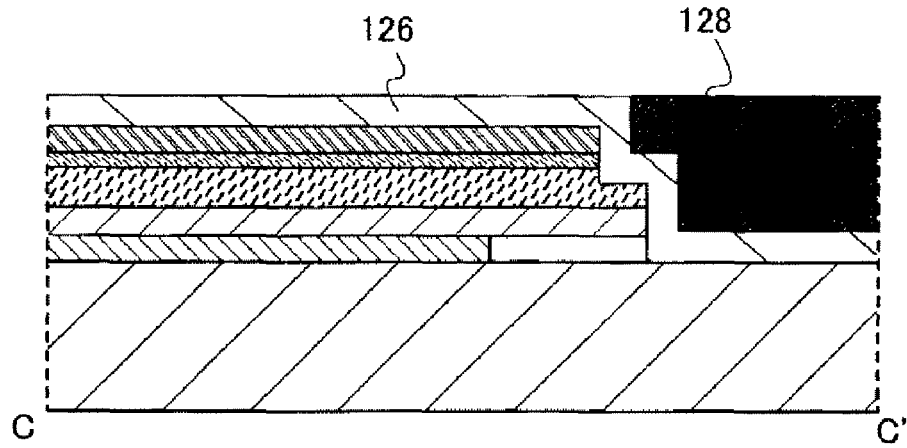
FIGS. 9A to 9C illustrate an example of a manufacturing, method of a thin film transistor and a display device according to the present invention.
Figure 9B:
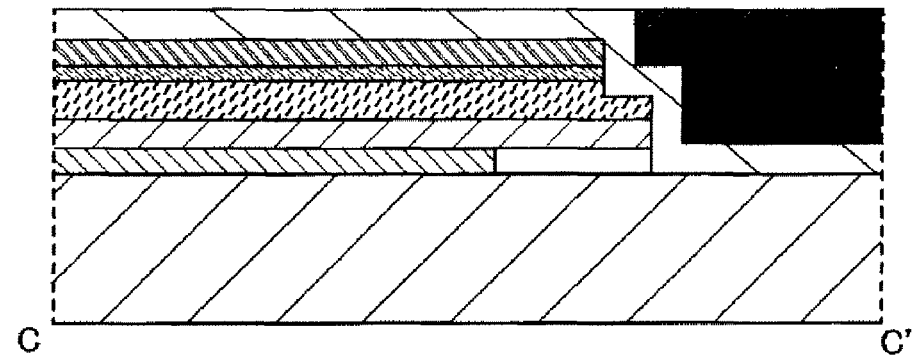
Figure 9C:
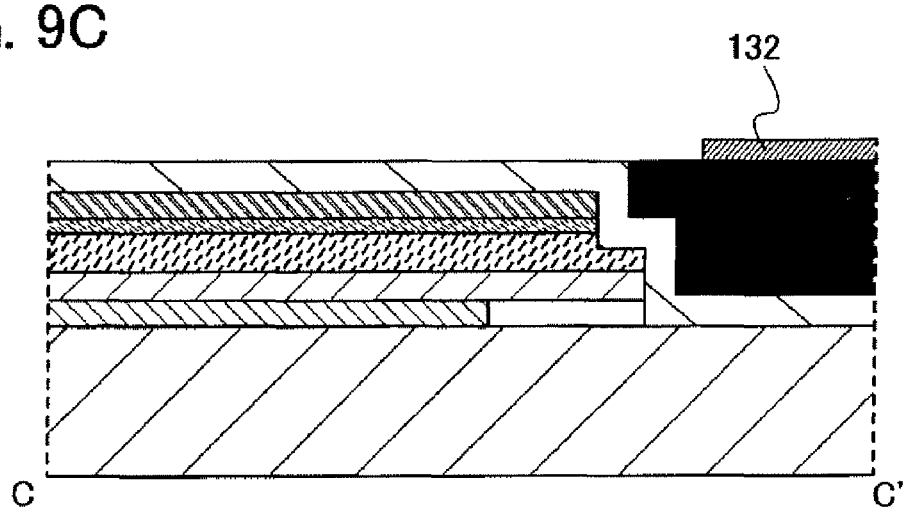
Figure 10A:
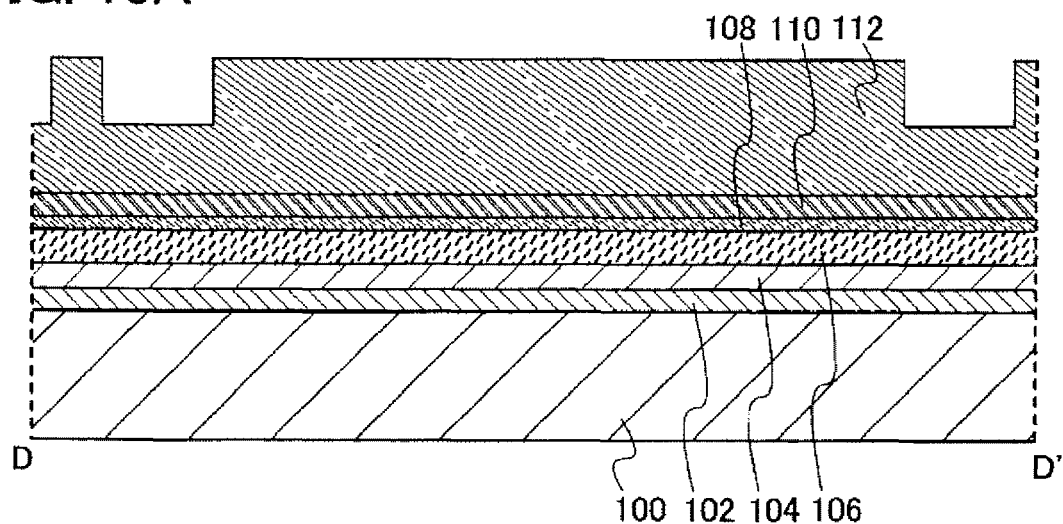
FIGS. 10A to 10C illustrate an example of a manufacturing method of a thin film transistor and a display device according to the present invention.
Figure 10B:
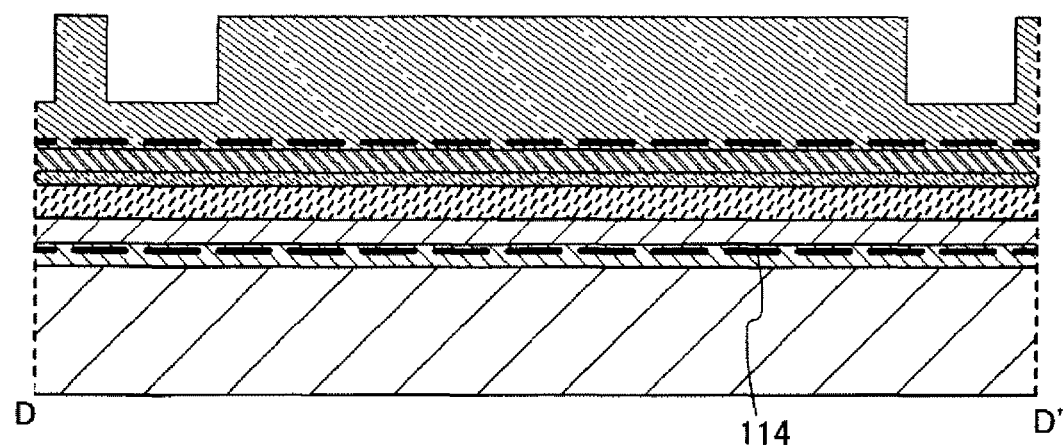
Figure 10C:
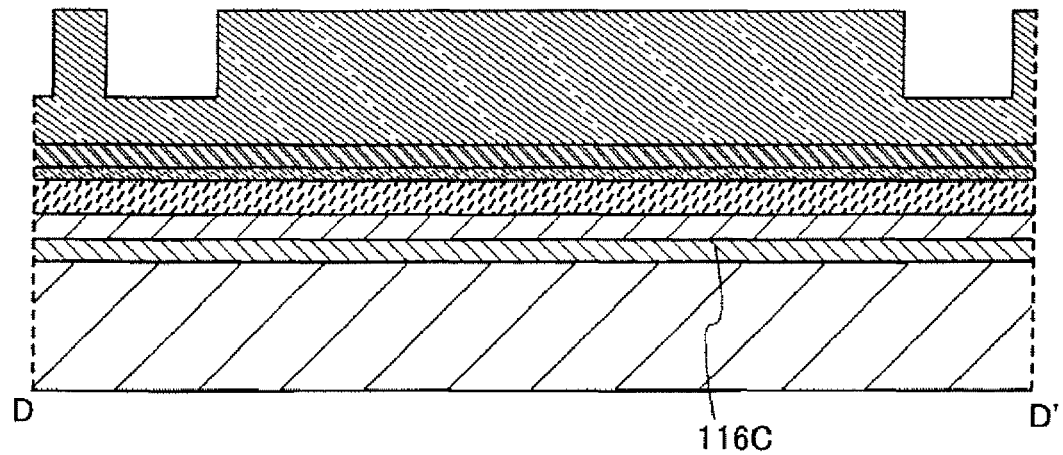
Figure 11A:
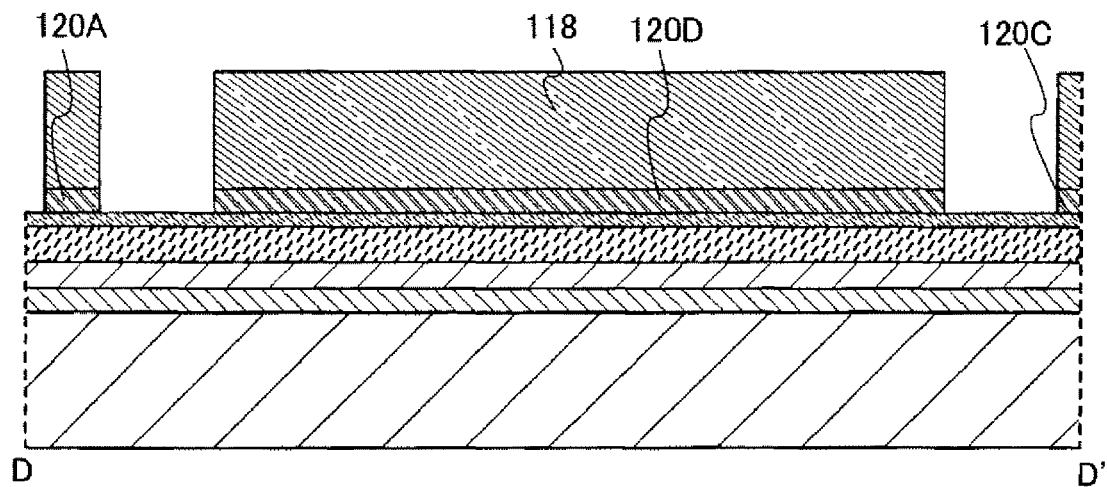
FIGS. 11A to 11C illustrate an example of a manufacturing method of a thin film transistor and a display device according to the present invention.
Figure 11B:
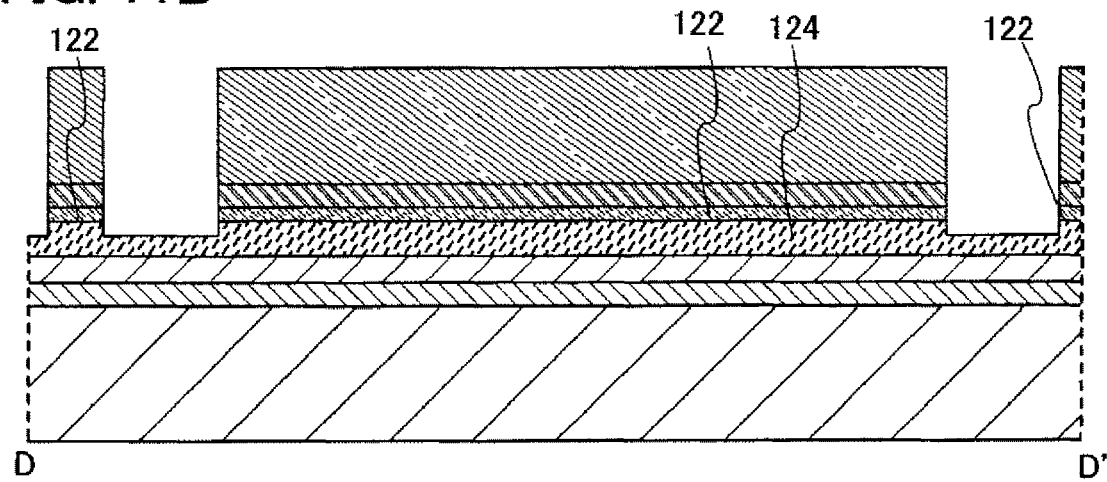
Figure 11C:
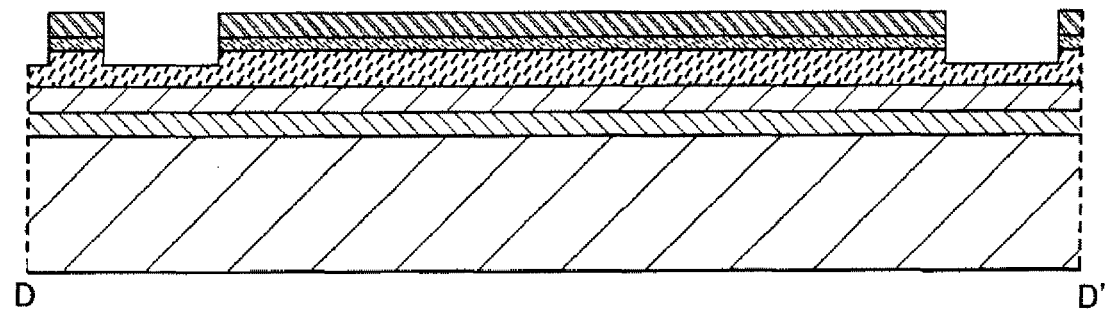
Figure 12A:
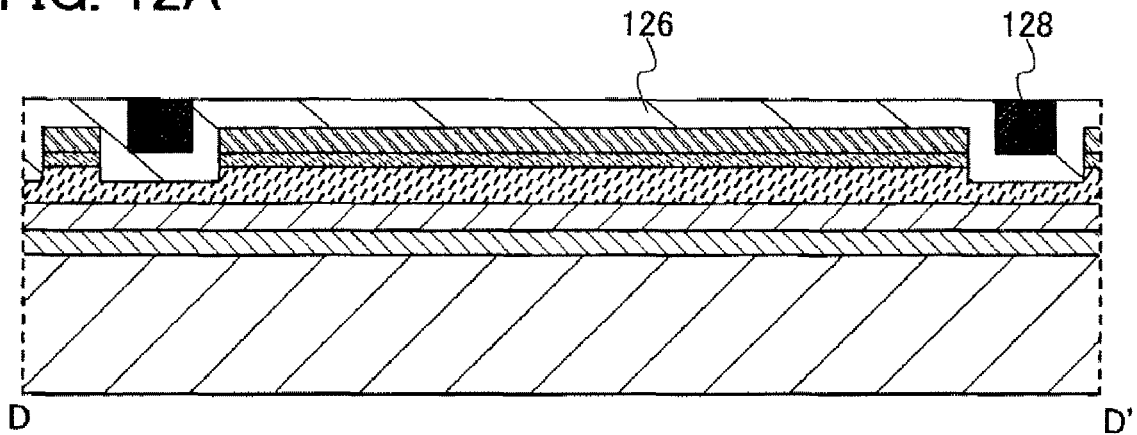
FIGS. 12A to 12C illustrate an example of a manufacturing method of a thin film transistor and a display device according to the present invention.
Figure 12B:
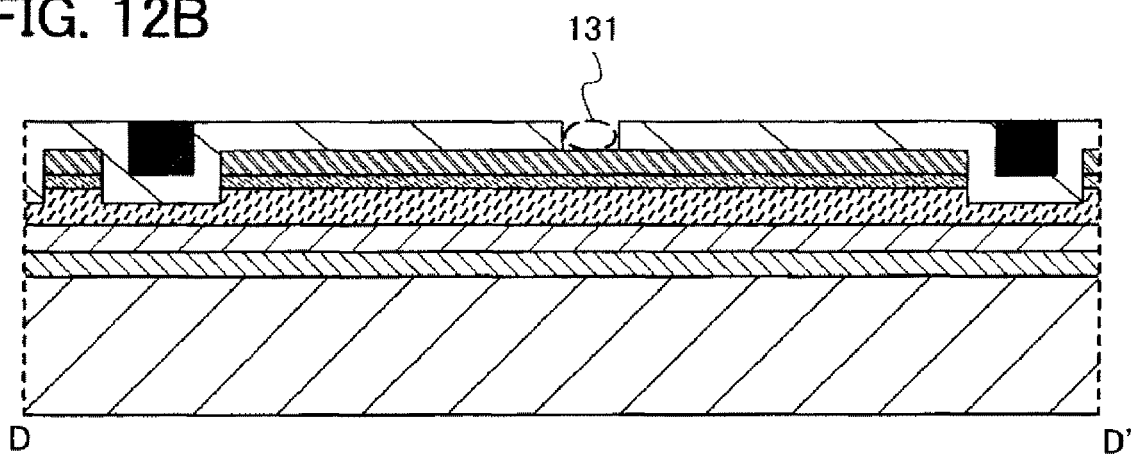
Figure 12C:
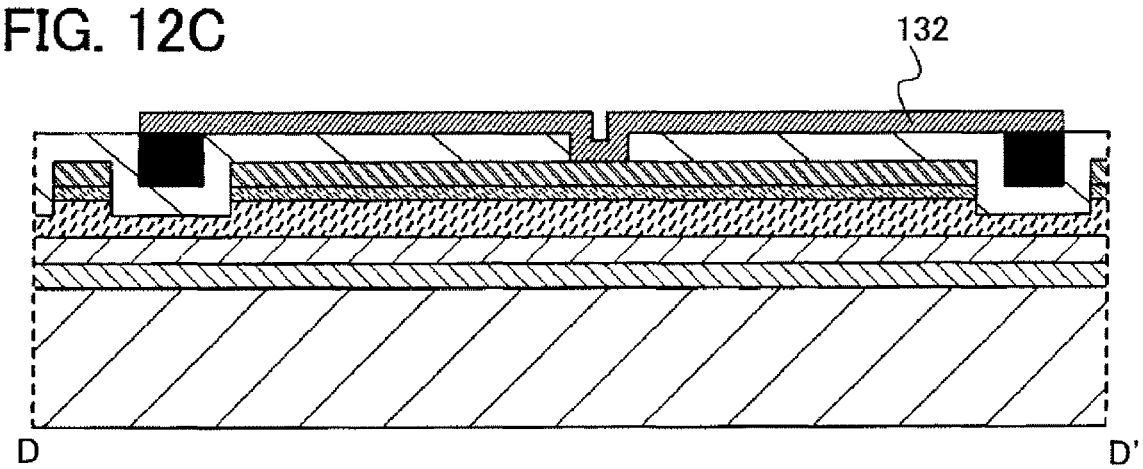
Figure 13A:
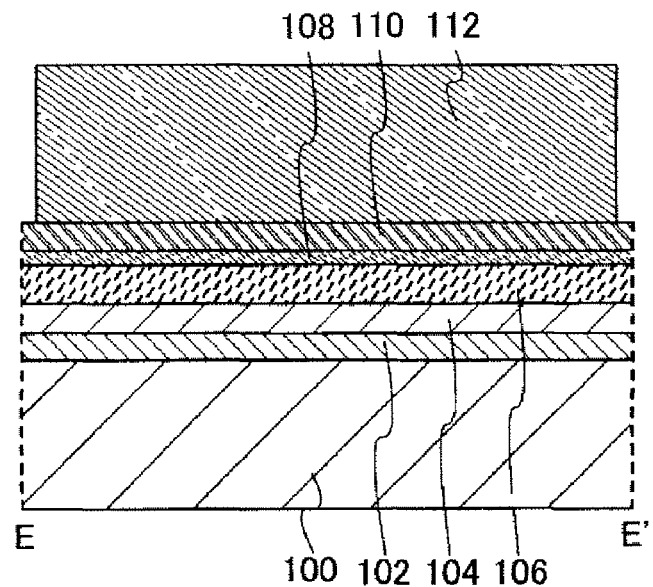
FIGS. 13A to 13C illustrate an example of a manufacturing method of a thin film transistor and a display device according to the present invention.
Figure 13B:
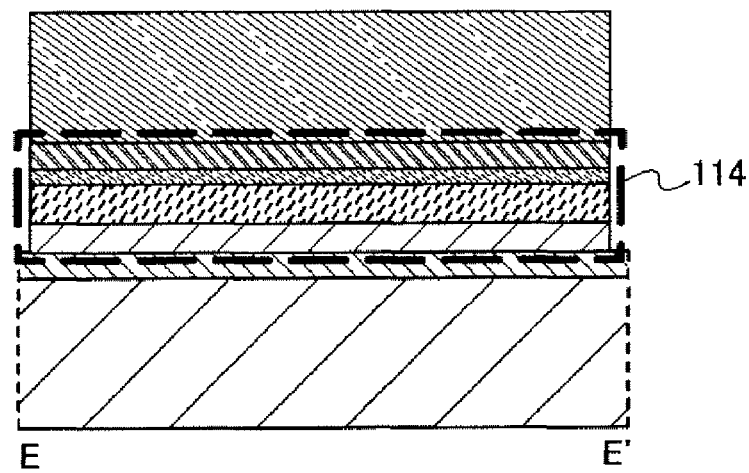
Figure 13C:
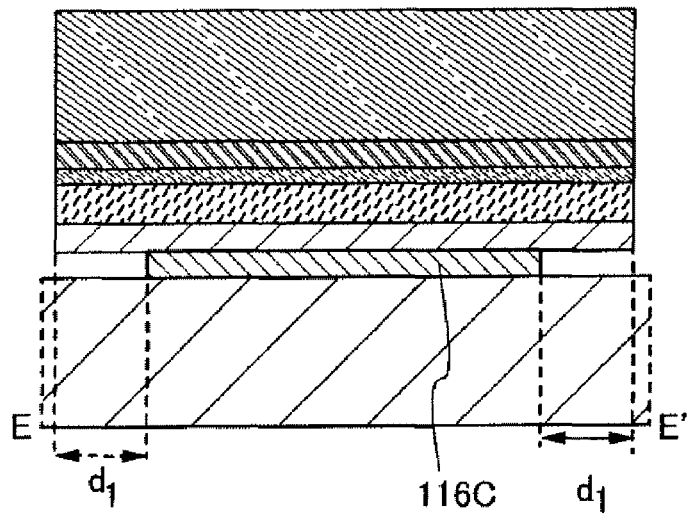
Figure 14A:
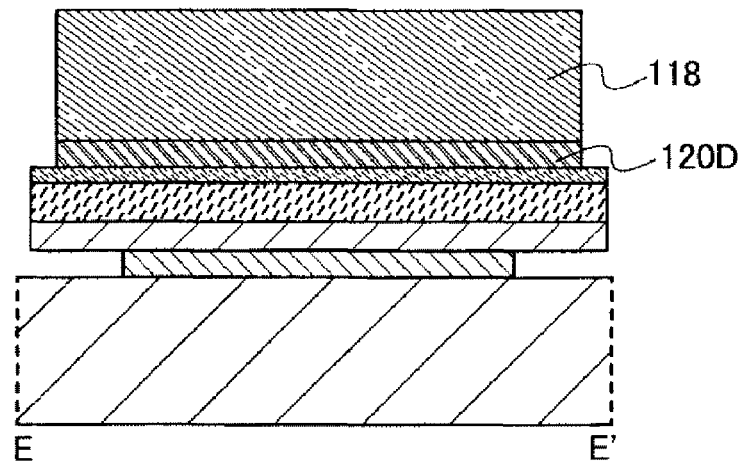
FIGS. 14A to 14C illustrate an example of a manufacturing method of a thin film transistor and a display device according to the present invention.
Figure 14B:
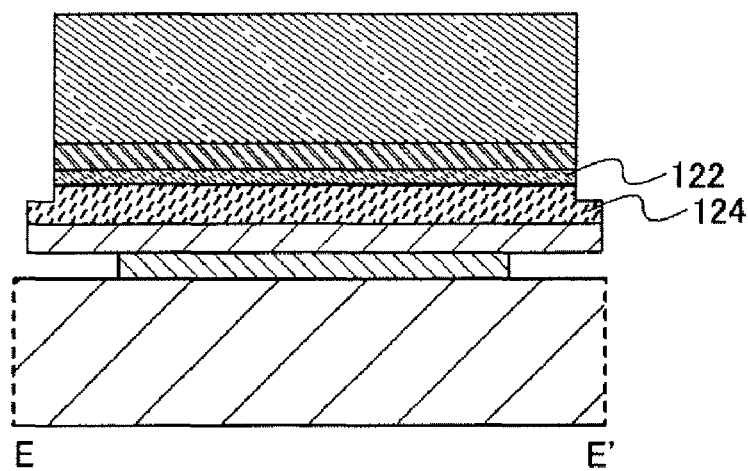
Figure 14C:
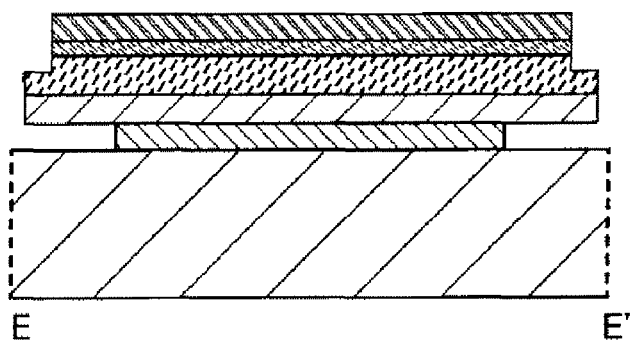
Figure 15A:
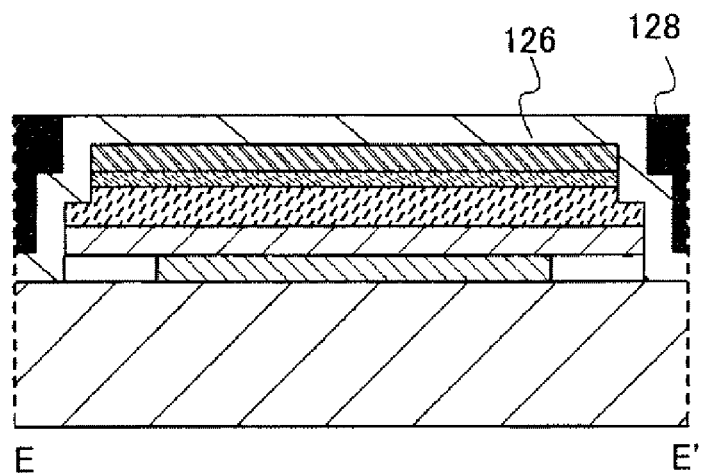
FIGS. 15A to 15C illustrate an example of a manufacturing method of a thin film transistor and a display device according to the present invention.
Figure 15B:
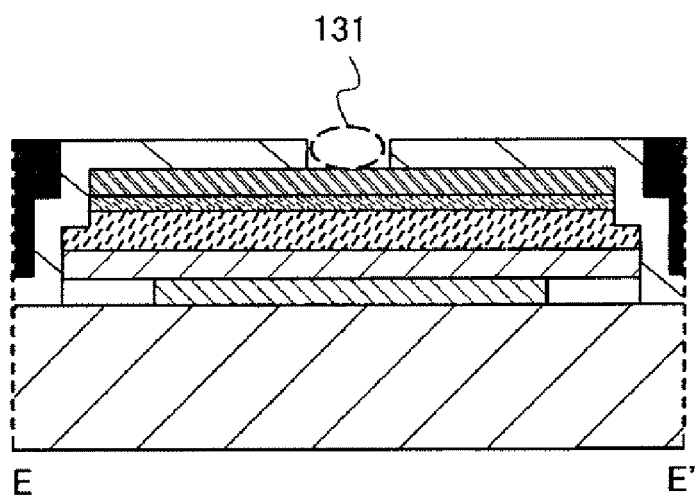
Figure 15C:
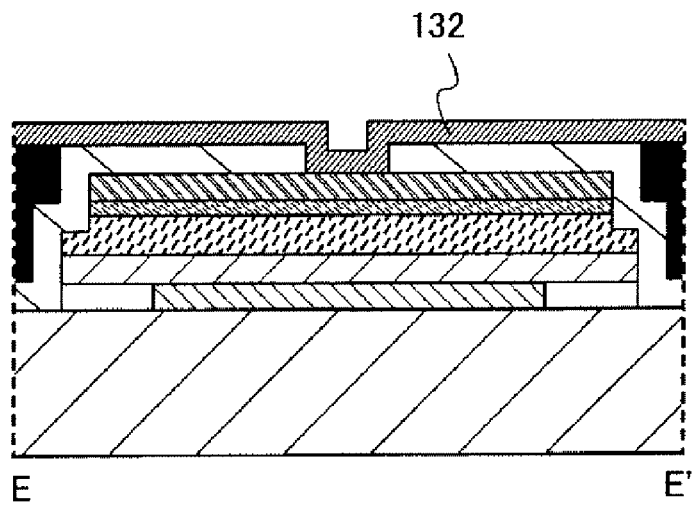
Figure 16:
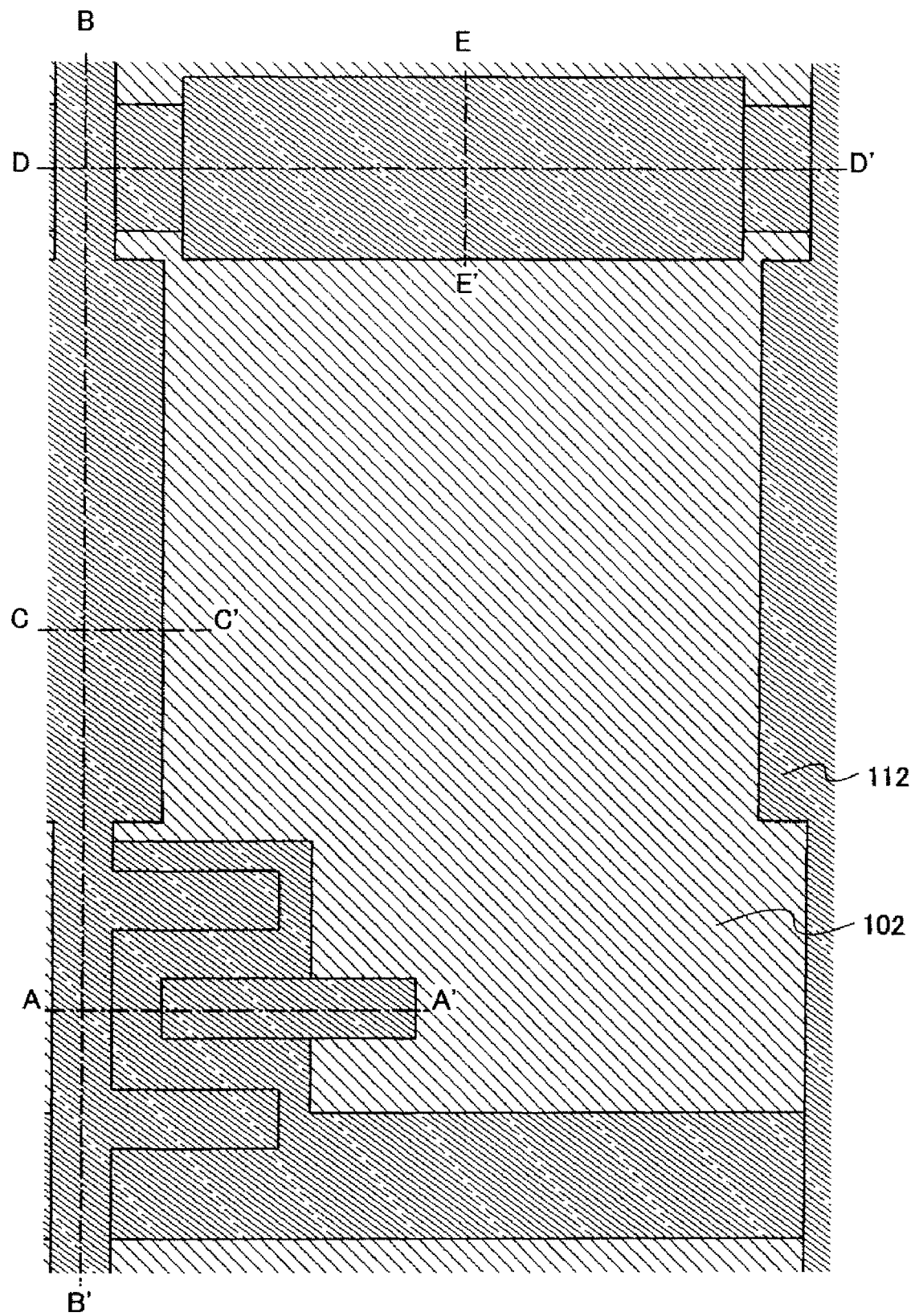
FIG. 16 illustrates an example of a manufacturing method of a thin film transistor and a display device according to the present invention.
Figure 37A:
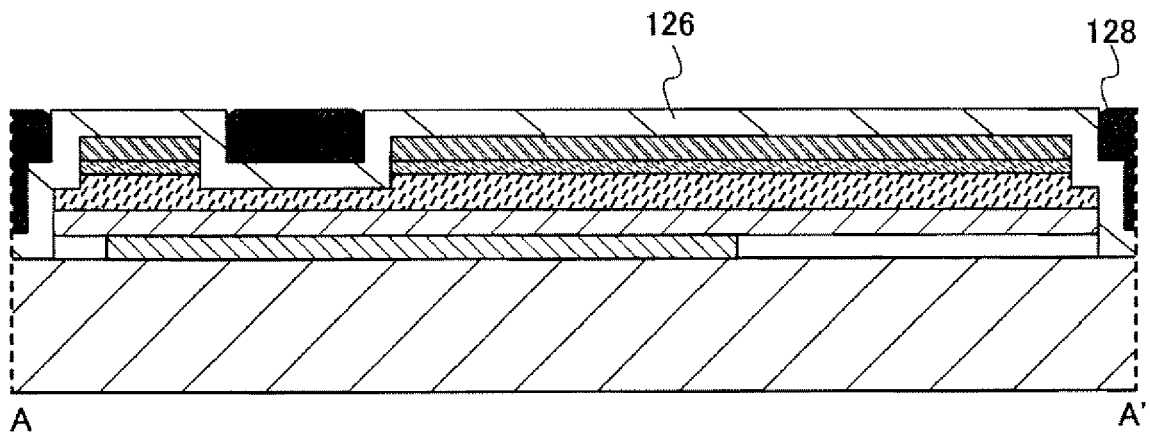
FIGS. 37A to 37C illustrate an example of a manufacturing method of a thin film transistor and a display device according to the present invention.
Figure 37B:
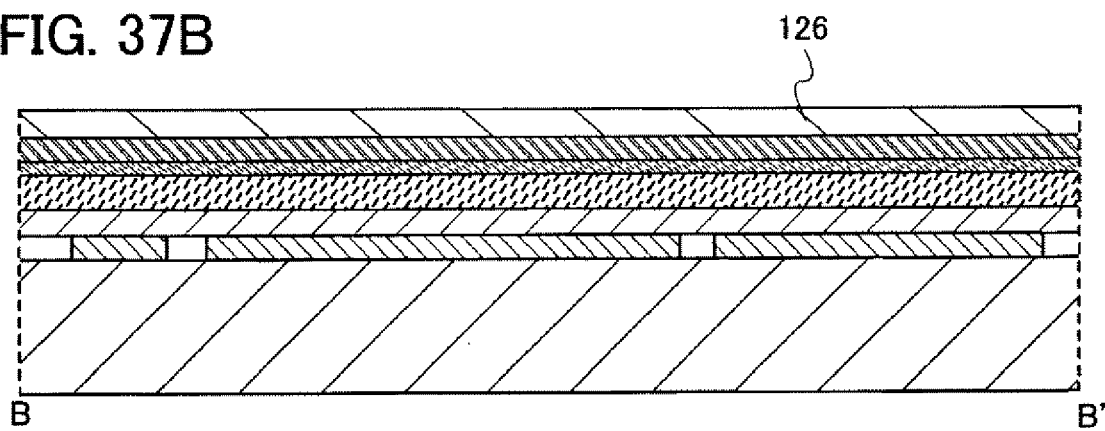
Figure 37C:
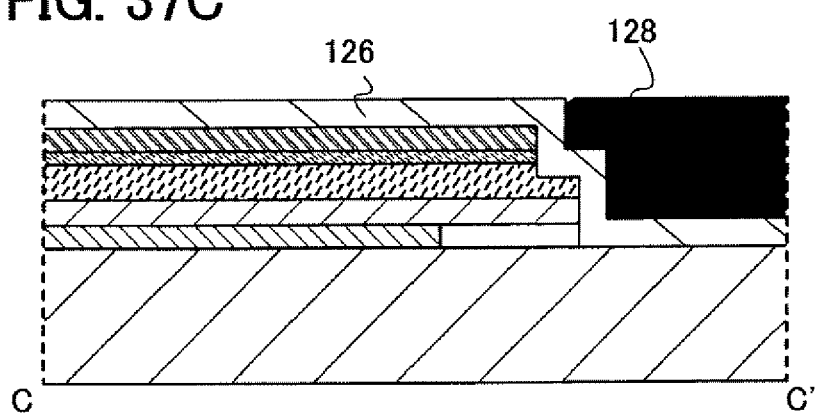
Figure 38A:
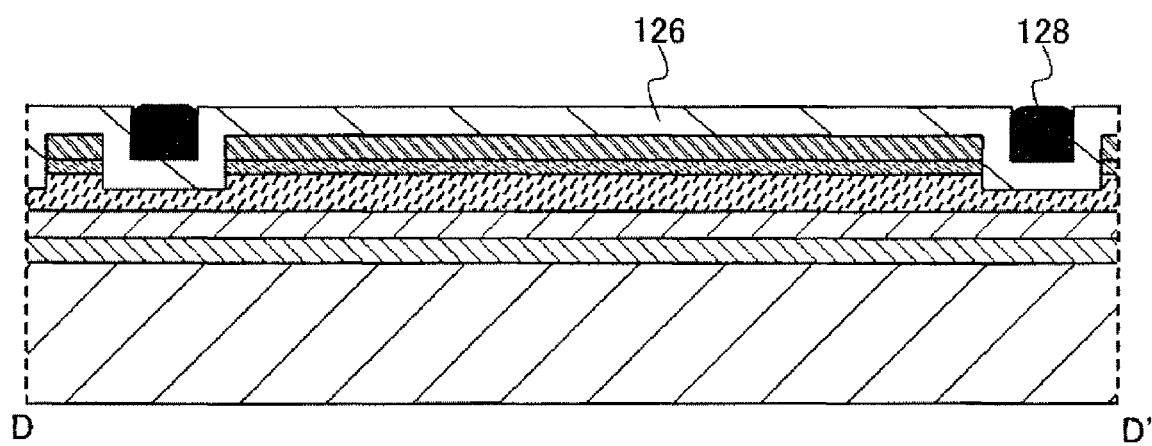
FIGS. 38A and 38B illustrate an example of a manufacturing method of a thin film transistor and a display device according to the present invention.
Figure 38B:
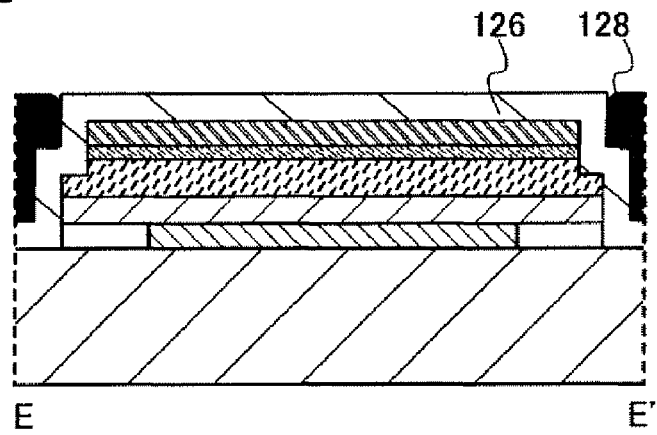

Note that FIG. 37A corresponds to FIG. 3A, FIG. 37B corresponds to FIG. 6A, and FIG. 37C corresponds to FIG. 9A. Further, FIG. 38A corresponds to FIG. 12A and FIG. 38B corresponds to FIG. 15A.

First, as in Embodiment Mode 1, a thin film stack 114 and a gate electrode layer 116 are formed to the desired shape, and the second resist mask 118 is removed (see FIG. 2C, FIG. 5C, FIG. 8C, FIG. 11C, and FIG. 14C).

Then, a second insulating film is formed to cover the thin film transistor which is formed through the above-described steps. Here, the protective film 126 is used as the second insulating film; however, the protective film 126 may have a layered structure having two or more layers without limitation to such a single-layer structure. After that, the color filter layers 128 are formed over the second insulating film (see FIG. 37A, FIG. 37B, FIG. 37C, FIG. 38A, and FIG. 38B).

As already described, in this embodiment mode, the color filter layers 128 are formed using a printing method or an ink-jet method. Here, the thin film stack 114 of the present invention has a layered structure including the first conductive film 102, the first insulating film 104, the semiconductor film 106, the impurity semiconductor film 108, and the second conductive film 110. Accordingly, the thickness of the thin film stack 114 to be a source wiring or a gate wiring is larger as compared with the case of using a conventional manufacturing method. By utilizing this, the color filter layers 128 can be easily formed separately.

For example, in the case where the color filter layers 128 of respective colors of R (red), G (green), and B (blue) are formed to extend in the direction parallel to source wirings, a color filter layer 128 of a color is formed in a region sandwiched between the source wirings (hereinafter, referred to as a region between source wirings), and a color filter layer 128 of another color is formed between an adjacent region between source wirings. A printing method or an ink-jet method are methods in which formation is performed by dropping droplets; however, with the source wirings formed from the thin film stack 114, unnecessary expansion of droplets can be prevented, so that fabrication accuracy of the color filter layers 128 can be improved.

Note that the color filter layers 128 have an effect of reducing surface unevenness caused by the thin film stack 114 or the like. In order to effectively utilize this effect, in this embodiment mode, a structure is employed in which color filter layers 128 are also formed in a region other than a region where the pixel electrode layer 132 is to be later formed. However, if the effect of reducing surface unevenness is not considered important, a structure in which the color filter layer 128 is formed in a region exactly below the region where the pixel electrode layer 132 is formed may be employed.

Further, after formation of the color filter layers and before formation of the pixel electrode layer, an overcoat layer may be formed. The formation of the overcoat layer can further improve planarity of a surface over which the pixel electrode is formed. In addition, part of a material included in the color filter layers can be prevented from entering a liquid crystal material. For the overcoat layer, a thermosetting material which mainly contains acrylic resin or epoxy resin is used.

As described above, the color filter layers 128 are formed separately by utilizing unevenness caused by the thin film stack 114; thus, color separation accuracy of the color filter layers 128 is improved. Further, since unevenness of the surface over which the pixel electrode is formed can be reduced, the color filter layers are formed and planarity can be improved by one step. By improving planarity of the pixel electrode, orientation disorder of liquid crystal is improved, and image display quality is improved. Further, since steps of patterning for forming the color filter layers 128 or the like are not necessary, the number of steps can be further reduced.

Since subsequent steps are similarly performed by the methods described in Embodiment Mode 1 to Embodiment Mode 3, the description is omitted here. This embodiment mode can be combined with Embodiment Mode 1 to Embodiment Mode 3 as appropriate.

Embodiment Mode 5

In this embodiment mode, electronic appliances in each of which a liquid crystal display device manufactured using any of the methods described in Embodiment Modes 1 to 4 is incorporated as a display portion will be described with reference to FIGS. 39A and 39B, FIG. 40, and FIGS. 41A to 41C. As such electronic appliances, for example, cameras such as video cameras or digital cameras; head mounted displays (goggle type displays); projectors; car navigation systems; car stereos; personal computers; and portable information terminals (such as mobile computers, mobile phones, and e-book readers) can be given.

Figure 39A:
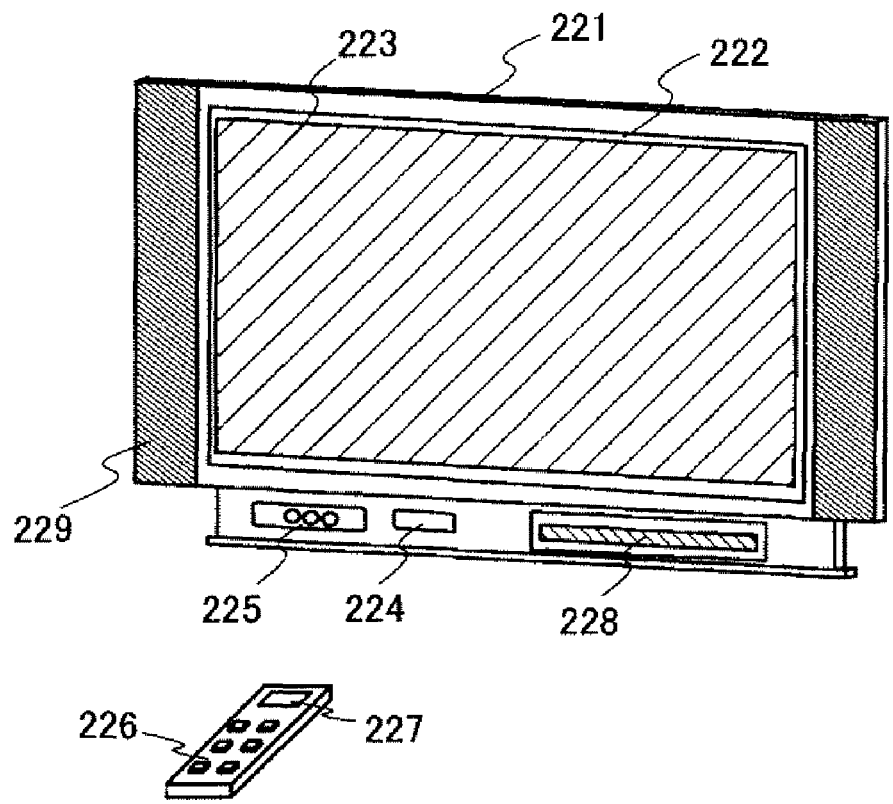
FIGS. 39A and 39B are perspective views of electronic devices each using a display device according to the present invention.

FIG. 39A illustrates a television unit. A television unit illustrated in FIG. 39A can be completed by incorporating a liquid crystal display device manufactured using the present invention into a housing. A main screen 223 is formed using the liquid crystal display device manufactured by any of the manufacturing methods described in Embodiment Modes 1 to 3, and a speaker portion 229, operation switches, and the like are provided as its accessory equipment.

As illustrated in FIG. 39A, a liquid crystal display device 222 manufactured by any of the manufacturing methods described in Embodiment Modes 1 to 3 is incorporated into a housing 221, and general TV broadcast can be received by a receiver 225. When the television unit is connected to a communication network by wired or wireless connections via a modem 224, one-way (from a sender to a receiver) or two-way (between a sender and a receiver or between receivers) data communication can be performed.

The television unit can be operated using switches incorporated into the housing or by a remote controller 226 which is separate from the housing. A display portion 227 which displays output data may also be provided for the remote controller 226.

Further, the television unit may include a subscreen 228 provided for displaying channels, volume, and the like, in addition to the main screen 223.

Figure 40:
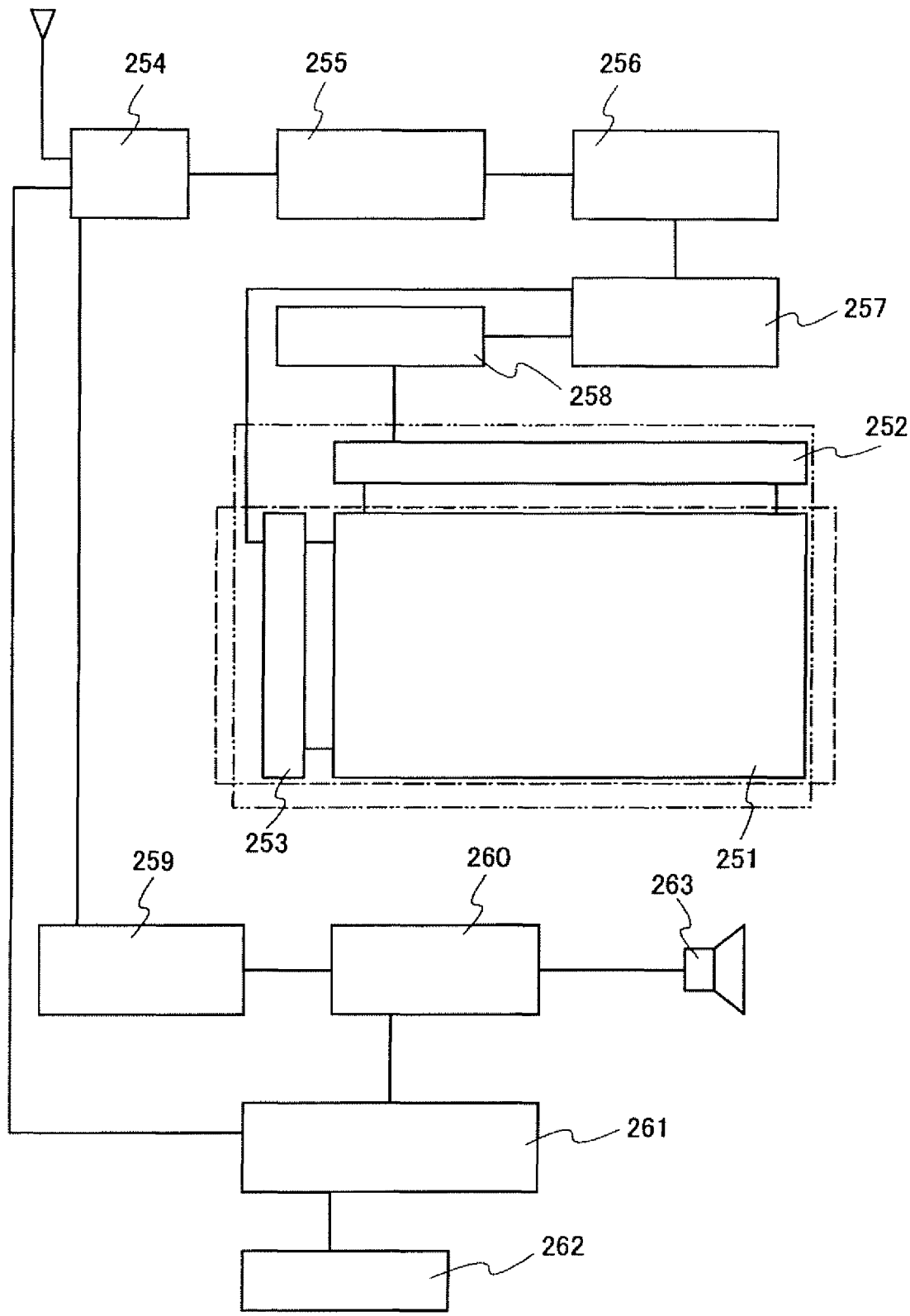
FIG. 40 illustrates an electronic device using a display device according to the present invention.

FIG. 40 is a block diagram of a main structure of a television unit. A pixel portion 251 is formed in a display region. A signal line driver circuit 252 and a scan line driver circuit 253 may be implemented by a COG method.

As structures of external circuits, a video signal amplifier circuit 255 for amplifying a video signal among signals received by a tuner 254, a video signal processing circuit 256 for converting signals output from the video signal amplifier circuit 255 into chrominance signals corresponding to colors of red, green, and blue, a control circuit 257 for converting the video signal into a signal which meets input specifications of a driver circuit, and the like are provided on the input side of the video signal. The control circuit 257 outputs signals to each of the scan line side and the signal line side. In the case of digital drive, a signal dividing circuit 258 may be provided on the signal line side to supply an input digital signal divided into m (m is an integer) pieces.

Among the signals received by the tuner 254, audio signals are transmitted to an audio signal amplifier circuit 259, and an output thereof is supplied to a speaker 263 through an audio signal processing circuit 260. A control circuit 261 receives control data on receiving station (receiving frequency) and volume from an input unit 262 and transmits signals to the tuner 254 and the audio signal processing circuit 260.

When a liquid crystal display device or display device manufactured by any of the manufacturing methods which are described in Embodiment Modes 1 to 3, is applied to the main screen 223 and the subscreen 228, productivity of television units can be increased.

Note that the above structure is not limited to the television unit and can also be applied to a large-size display medium such as an information display board at a station, an airport, and the like, or an advertisement display board on the street, as well as a monitor of a personal computer. In accordance with the present invention, productivity for these display mediums can be improved.

Figure 39B:
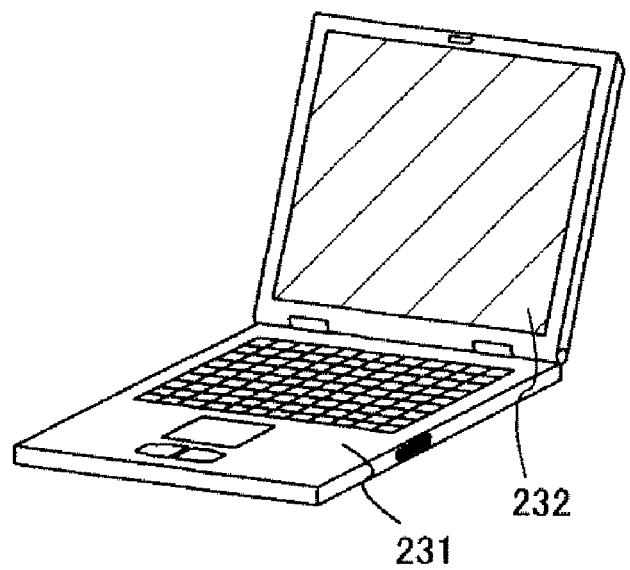

A mobile computer illustrated in FIG. 39B includes a main body 231, a display portion 232, and the like. When the liquid crystal display device manufactured by any of the methods which are described in Embodiment Modes 1 to 3, is applied to the display portion 232, productivity for computers can be increased.

FIGS. 41A to 41C illustrate a structural example of a portable electronic device 300 having functions as a telephone and an information terminal. Here, FIG. 41A is a front view, FIG. 41B is a back view, and FIG. 41C is a developed view. The portable electronic device 300 has functions as both a telephone and an information terminal and is an electronic device so-called a smartphone which is capable of various data processing besides voice call.

The portable electronic device 300 includes housings 301 and 302. The housing 301 is provided with a display portion 311, a speaker 312, a microphone 313, operation keys 314, a pointing device 315, a lens 316 for camera, an external connection terminal 317, and the like. The housing 302 is provided with a keyboard 321, an external memory slot 322, a lens 323 for camera, a light 324, an earphone port 325, and the like. In addition, an antenna is incorporated in the housing 301. In addition to the above-described structure, a wireless IC chip, a small size memory device, or the like can be built therein.

The display portion 311 includes a semiconductor device according to the present invention. An image displayed (and direction in which the image is displayed) in the display portion 311 variously changes depending on the usage mode of the portable electronic device 300. Moreover, since the display portion 311 and the lens 316 for camera are provided on the same plane, voice call with images (so-called videophone) is possible. Note that the speaker 312 and the microphone 313 can be used not only for voice call but also for recording, reproducing, or the like. In the case where a still image and a moving image are shot by using the lens 323 for camera (and the light 324), the display portion 311 is used as a finder. The operation keys 314 are used for operation of incoming and outgoing calls, information input for electronic mail or the like, scrolling of a screen, cursor motion, and the like.

The housings 301 and 302 superimposed on each other (FIG. 41A) slide and can be developed as illustrated in FIG. 41C, so that the portable electronic device 300 can be used as an information terminal. In that case, smooth operation with the keyboard 321 and the pointing device 315 can be performed. The external connection terminal 317 can be connected to various cables such as an AC adapter or a USB cable, so that the portable electronic device 300 can be charged or can perform data communication with a computer or the like. Moreover, by inserting a recording medium into the external memory slot 322, the portable electronic device 300 can deal with storing and moving a large capacity of data. In addition to the above-described functions, a function of wireless communication by using electromagnetic waves such as infrared rays, a function of receiving television, and the like may be included. By using the invention disclosed in this specification, a portable electronic device having high reliability and high performance can be provided at low cost.

Since various electronic devices described in this embodiment mode can be manufactured by any of the manufacturing methods of a liquid crystal display device and a display device described in Embodiment Modes 1 to 3, productivity of these electronic devices can be increased.

Accordingly, using the present invention, manufacturing cost of these electronic devices can be significantly reduced.

This application is based on Japanese Patent Application serial no. 2008-046601 filed with Japan Patent Office on Feb. 27, 2008, the entire contents of which are hereby incorporated by reference.

EXPLANATION OF REFERENCE

100: substrate, 102: conductive film, 104: insulating film, 106: semiconductor film, 108: impurity semiconductor film, 110: conductive film, 112: resist mask, 114: thin film laminate, 115: conductive film, 116: gate electrode layer, 116A: gate electrode layer, 116B: gate electrode layer, 116C: gate electrode layer, 116D: gate electrode layer, 118: resist mask, 120: source/drain electrode layer, 120A: source/drain electrode layer, 120B: source/drain electrode layer, 120C: source/drain electrode layer, 120D: source/drain electrode layer, 122: source/drain region, 126: protective film, 128: color filter layers, 130: opening portion, 131: opening portion, 132: pixel electrode layer, 140: gray-tone mask, 141: substrate, 142: light-blocking portion, 143: slit portion, 145: half-tone mask, 146: substrate, 147: semi-light-transmitting portion, 148: light-blocking portion, 151: horny portion, 160A: opening portion, 160B: opening portion, 161: opening portion, 170: resist mask, 171: resist mask, 221: housing, 222: liquid crystal display device, 223: main screen, 224: modem, 225: receiver, 226: remote controller, 227: display portion, 228: subscreen, 229: speaker portion, 231: main body, 232: display portion, 251: pixel portion, 252: signal line driver circuit, 253: scan line driver circuit, 254: tuner, 255: video signal amplifier circuit, 256: video signal processing circuit, 257: control circuit, 258: signal dividing circuit, 259: audio signal amplifier circuit 260: audio signal processing circuit, 261: control circuit, 262: input unit, 263: speaker, 300: portable electronic device, 301: housing, 302: housing, 311: display portion, 312: speaker, 313: microphone, 314: operation keys, 315: pointing device, 316: lens for camera, 317: external connection terminal, 321: keyboard, 322: external memory slot, 323: lens for camera, 324: light, and 325: earphone port.

The invention claimed is:

1. A liquid crystal display device comprising:
a gate electrode on an insulating surface;
a first insulating film over the gate electrode;
a semiconductor layer over the first insulating film;
an impurity semiconductor layer over the semiconductor layer;
a conductive film over the impurity semiconductor layer;
a second insulating film over the conductive film;
a color filter over the second insulating film; and
a pixel electrode layer over the color filter,
wherein a cavity is formed adjacent to the gate electrode.

2. A liquid crystal display device according to claim 1, wherein the semiconductor layer has a first recessed portion which is a channel region.

3. A liquid crystal display device according to claim 1, wherein the semiconductor layer has a second recessed portion which overlaps with the cavity.

4. A liquid crystal display device according to claim 1, wherein the cavity is formed between the first insulating film and the insulating surface.

5. A liquid crystal display device according to claim 1, wherein the liquid crystal display device is incorporated in one selected from the group consisting of a digital camera, an electric camera, a video movie, a mobile computer, a television unit and a video camera.

6. A liquid crystal display device comprising:
a gate electrode on an insulating surface;
a first insulating film over the gate electrode;
a semiconductor layer over the first insulating film;
an impurity semiconductor layer over the semiconductor layer;
a conductive film over the impurity semiconductor layer;
a second insulating film over the conductive film;
a color filter over the second insulating film; and
a pixel electrode layer over the color filter,
wherein a cavity is formed adjacent to the gate electrode,
wherein the first insulating film extends beyond edges of the conductive film, and
wherein the edges of the conductive film overlap the cavity.

7. A liquid crystal display device according to claim 6, wherein the semiconductor layer has a first recessed portion which is a channel region.

8. A liquid crystal display device according to claim 6, wherein the semiconductor layer has a second recessed portion which overlaps with the cavity.

9. A liquid crystal display device according to claim 6, wherein the cavity is formed between the first insulating film and the insulating surface.

10. A liquid crystal display device comprising:
a gate electrode on an insulating surface;
a first insulating film over the gate electrode;
a semiconductor layer over the first insulating film;
an impurity semiconductor layer over the semiconductor layer;
a conductive film over the impurity semiconductor layer;
a second insulating film over the conductive film;
a color filter over the second insulating film; and
a pixel electrode layer over the color filter,
wherein a cavity is formed adjacent to the gate electrode,
wherein a part of the second insulating film is on and in contact with the pixel electrode layer.

11. A liquid crystal display device according to claim 10, wherein the cavity is formed between the first insulating film and the insulating surface.

12. A liquid crystal display device according to claim 10, wherein the first insulating film extends beyond edges of the conductive film, and wherein the edges of the conductive film overlap the cavity.

13. A liquid crystal display device according to claim 10, wherein the pixel electrode layer is on and in contact with an upper surface of the color filter.

* * * * *